United States Patent
Tomimatsu et al.

(10) Patent No.: US 10,629,411 B2
(45) Date of Patent: Apr. 21, 2020

(54) CHARGED PARTICLE BEAM APPARATUS

(71) Applicant: HITACHI HIGH-TECH SCIENCE CORPORATION, Tokyo (JP)

(72) Inventors: Satoshi Tomimatsu, Tokyo (JP); Tatsuya Asahata, Tokyo (JP); Makoto Sato, Tokyo (JP); Masato Suzuki, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/192,723

(22) Filed: Nov. 15, 2018

(65) Prior Publication Data

US 2019/0157037 A1 May 23, 2019

(30) Foreign Application Priority Data

Nov. 17, 2017 (JP) .................................. 2017-222228

(51) Int. Cl.
*H01J 37/20* (2006.01)
*H01J 37/28* (2006.01)
*G01N 23/225* (2018.01)
*G02B 27/09* (2006.01)
*H01J 37/305* (2006.01)

(52) U.S. Cl.
CPC ............ *H01J 37/28* (2013.01); *G01N 23/225* (2013.01); *G02B 27/0955* (2013.01); *H01J 37/20* (2013.01); *H01J 37/3056* (2013.01); *H01J 2237/208* (2013.01); *H01J 2237/20285* (2013.01); *H01J 2237/31749* (2013.01)

(58) Field of Classification Search
CPC .. H01J 37/20; H01J 2237/31745; H01J 37/28; H01J 2237/31749; H01J 2237/2817; H01J 2237/2007; H01J 2237/221; H01J 37/222; H01J 2237/208; H01J 37/265; H01J 37/3023; H01J 37/30; G01N 1/28; G01N 2001/282; G01N 23/2251; G01N 23/2202
See application file for complete search history.

(56) References Cited

U.S. PATENT DOCUMENTS

| | | | |
|---|---|---|---|
| 2008/0087822 A1* | 4/2008 | Principe | G01N 1/32 250/307 |
| 2010/0008563 A1* | 1/2010 | Fujii | H01J 37/28 382/149 |

(Continued)

FOREIGN PATENT DOCUMENTS

| | | |
|---|---|---|
| JP | 2008-153239 | 7/2008 |
| JP | 2009-110745 | 5/2009 |

*Primary Examiner* — Wyatt A Stoffa
(74) *Attorney, Agent, or Firm* — Holland & Hart LLP

(57) ABSTRACT

(Task) To repeatedly perform an operation of extracting a sample piece formed by processing a sample with an ion beam and of transferring the extracted sample piece to a sample piece holder.
(Problem Solving Means) A charged particle beam apparatus includes a computer that sets a shaping processing region including a bottom portion of sample piece in a thickness direction of the sample piece corresponding to a depth direction at the time of processing a sample after a needle holds the sample piece, and controls a focused ion beam irradiation optical system to irradiate the shaping processing region with a focused ion beam to thereby shape the sample piece.

20 Claims, 24 Drawing Sheets

(56) References Cited

U.S. PATENT DOCUMENTS

| | | | |
|---|---|---|---|
| 2011/0052044 A1* | 3/2011 | Takahashi | G01N 23/2255 |
| | | | 382/154 |
| 2013/0105302 A1* | 5/2013 | Nanri | G01N 1/32 |
| | | | 204/192.33 |
| 2016/0379798 A1* | 12/2016 | Shishido | H01J 37/244 |
| | | | 250/307 |
| 2017/0138725 A1* | 5/2017 | Kawada | G01B 15/00 |
| 2017/0278668 A1* | 9/2017 | Man | H01J 37/3178 |

* cited by examiner

CHARGED PARTICLE BEAM APPARATUS

CROSS REFERENCE TO RELATED APPLICATION(S)

This application claims the benefit of Japanese Patent Application No. 2017-222228, filed Nov. 17, 2017, which is hereby incorporated by reference in its entirety into this application.

BACKGROUND OF THE INVENTION

Technical Field

The present invention relates to a charged particle beam apparatus capable of performing automatic sampling.

Description of the Related Art

Conventionally, there is a known apparatus for extracting a sample piece produced by irradiating a sample with a charged particle beam composed of electrons or ions and for processing the sample piece into a shape suitable for various processes such as observation, analysis, measurement, and the like in a scanning electron microscope (SEM), a transmission electron microscope (TEM), and the like (for example, refer to Patent Literature 1).

Conventionally, an apparatus is known which axially rotates a needle to change the orientation of a sample piece with respect to a sample piece holder when extracting the sample piece prepared by irradiating a sample with a focused ion beam with the needle and then transferring the extracted sample piece to the sample piece holder (for example, refer to Patent Literature 2). In this apparatus, since the sample piece is fixed to the sample piece holder after the orientation of the sample piece is changed by axially rotating the needle, the processing efficiency of the sample piece is increased when processing the sample piece into a shape suitable for various processes such as observation, analysis, and measurement with an SEM, a TEM, or the like.

DOCUMENT OF RELATED ART

Patent Literature (Patent Literature 1) Japanese Patent Application Publication No. 2008-153239

(Patent Literature 2) Japanese Patent Application Publication No. 2009-110745

SUMMARY

In the present specification, the term "sampling" refers to a process of extracting a sample piece prepared by irradiating a sample with a charged particle beam and then processing the sample piece into a shape suitable for various processes such as observation, analysis, measurement, and the like. More specifically, the term "sampling" refers to transferring the sample piece processed by a charged particle beam to a sample piece holder.

Conventionally, an automatic sampling technique is not sufficiently established to a reasonable level.

When preparing a sample piece by irradiating a sample with a focused ion beam and when processing the sample piece fixed to a sample piece holder by irradiating the sample piece with a focused ion beam, directions in which the focused ion beam is incident on the sample or the sample piece are limited. Because of this, repetition of automatic continuous sampling is inhibited and the sample piece cannot be processed into a desired shape in some cases.

For example, when preparing a sample piece by irradiating a sample with a focused ion beam, it is difficult to shape a portion of the sample, such as the bottom surface, which is difficult for the focused ion beam reach, into a desired shape. For this reason, there is a problem that it is difficult to properly fix an unshaped portion (for example, the bottom surface) of a sample piece to a sample piece holder when placing the sample piece on the sample piece holder with a needle.

Further, for example, when performing finish processing on a sample piece by emitting a focused ion beam to the sample piece after the sample piece is fixed to a sample holder, in a case where the bottom surface of the sample piece is not properly shaped, it is difficult to uniformly process the sample piece due to the irregular bottom surface of the sample piece.

This hinders repeated automatic sampling originally intended.

The present invention has been made in view of the technical problems occurring in related arts, and an objective of the present invention is to provide a charged particle beam apparatus for automatically performing a process extracting a sample piece prepared by processing a sample with an ion beam and then placing the sample piece on a sample piece holder.

In order to solve the above-mentioned problems and to achieve the objective, the present invention adopts the following aspects.

(1) A charged particle beam apparatus according to an aspect of the present invention is a charged particle beam apparatus for automatically preparing a sample piece from a sample, the charged particle beam apparatus including: a charged particle beam irradiation optical system configured to emit a charged particle beam; a stage configured to move a sample mounted thereon; a sample piece transferring means configured to retain and transport the sample piece separated and extracted from the sample; a holder fixing base configured to retain the sample piece holder to which the sample piece is transferred; and a computer configured to demarcate a shaping processing region including an end portion of the sample piece in a thickness direction of the sample piece corresponding to a depth direction at the time of processing the sample, in an image obtained by irradiating the sample piece with the charged particle beam after the sample piece transferring means retains the sample piece, and configured to control the sample piece transferring means and the charged particle beam irradiation optical system in such a manner that the charged particle beam is emitted to the shaping processing region to shape the sample piece.

(2) In the charged particle beam apparatus described in (1), the computer may control the charged particle beam irradiation optical system in such a manner that a scanning direction of the charged particle beam is rotated by a rotation angle according to positioning of the sample piece retained by the sample piece transferring means.

(3) In the charged particle beam apparatus described in (2), the computer may recognize an edge of the end portion of the sample piece in the image obtained by rotating the scanning direction of the charged particle beam by the rotation angle, and set the shaping processing region based on the edge.

(4) In the charged particle beam apparatus described in (2) or (3), the sample piece transferring means may include a needle for retaining and transporting the sample piece separated and extracted from the sample and a needle driving mechanism for driving the needle, and the computer may control the needle driving mechanism to control positioning of the sample piece with respect to the sample piece holder by axially rotating the needle that retains the sample piece.

(5) In the charged particle beam apparatus described in any one of (1) to (4), the computer may control the charged particle beam irradiation optical system to irradiate the shaping processing region with the charged particle beam, thereby shaping the sample piece, and then to irradiate an observation surface of the sample piece with the charged particle beam, thereby processing the observation surface of the sample piece.

(6) In the charged particle beam apparatus described in any one of (1) to (5), the computer may recognize a pattern exposed on a surface of the sample piece retained by the sample piece transferring means, and set the shaping processing region not to interfere with the pattern.

According to the charged particle beam apparatus of the present invention, since a region including the end portion of the sample piece is shaped before the sample piece is transferred to the sample piece holder, the sample piece can be processed into a desired shape and thus the sample piece can be properly fixed to the sample piece holder. Therefore, the sampling operation of extracting the sample piece prepared by processing the sample with the ion beam and then transferring the extracted sample piece to the sample piece holder can be automatically and continuously performed.

DESCRIPTION OF THE PREFERRED EMBODIMENTS

Hereinafter, a charged particle beam apparatus capable of automatically preparing a sample piece according to an embodiment of the present invention will be described with reference to the accompanying drawings.

Figure 1:
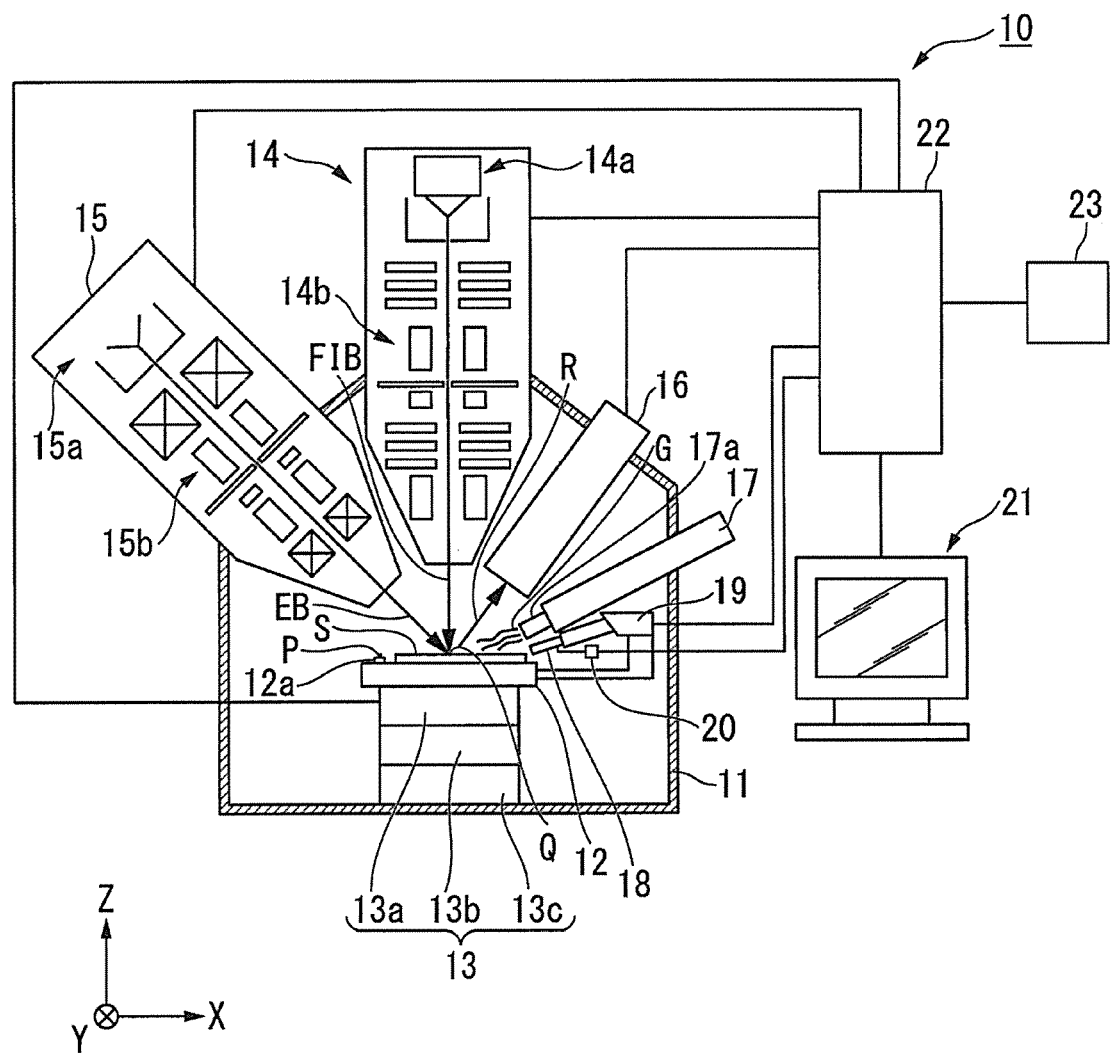
FIG. 1 is a diagram illustrating the construction of a charged particle beam apparatus according to an embodiment of the present invention.

FIG. 1 is a diagram illustrating the construction of a charged particle beam apparatus 10 according to an embodiment of the present invention. Referring to FIG. 1, the charged particle beam apparatus 10 according to an embodiment of the present invention includes a sample chamber 11 configured in such a manner that the inside thereof can be maintained in a vacuum state, a stage 12 disposed inside the sample chamber 11 and configured to fix a sample S and a sample piece holder P, and a stage driving mechanism 13 configured to drive the stage 12. The charged particle beam apparatus 10 includes a focused ion beam irradiation optical system 14 for irradiating, with a focused ion beam FIB, an irradiation target disposed within a predetermined irradiation region (i.e., scanning range) inside the sample chamber 11. The charged particle beam apparatus 10 includes an electron beam irradiation optical system 15 for irradiating, with an electron beam EB, an irradiation target disposed within a predetermined irradiation region inside the sample chamber 11. The charged particle beam apparatus 10 includes a detector 16 for detecting secondary charged particles (secondary electrons and secondary ions) R generated from the irradiation target irradiated with a focused ion beam or an electron beam. The charged particle beam apparatus 10 includes a gas supply unit 17 for supplying gas G to the surface of the irradiation target. Specifically, the gas supply unit 17 is, for example, a nozzle 17a having an outer diameter of about 200 μm. The charged particle beam apparatus 10 includes a needle 18 for extracting a minute sample piece Q from a sample S fixedly mounted on the stage 12 and transporting the extracted sample piece Q to a sample piece holder P, a needle driving mechanism 19 for driving the needle 18 to transport the sample piece Q, and an absorption current detector 20 for detecting an inflow current (also referred to as an absorption current) induced by a charged particle beam and flowing into the needle 18, and for transmitting an inflow current signal to a computer for imaging.

The needle 18 and the needle driving mechanism 19 are collectively referred to as a sample piece transferring means. The charged particle beam apparatus 10 includes a display device 21 on which image data obtained on the basis of secondary charged particles R detected by the detector 16 is displayed, a computer 22, and an input device 23.

The objects (i.e., irradiation targets) to be irradiated by the focused ion beam irradiation optical system 14 and the electron beam irradiation optical system 15 include the sample S fixedly mounted on the stage 12, the sample piece Q, and the needle 18, and the sample piece holder P which are disposed within an irradiation region.

The charged particle beam apparatus 10 according to the embodiment of the present invention can form an image of an object that is irradiated with an ion beam, perform various kinds of sputtering-involved processing operations (excavation, trimming, and the like), and form a deposition film by scanning a focused ion beam over the surface of an irradiation target (namely, by irradiating the surface of an irradiation target with a focused ion beam). The charged particle beam apparatus 10 can perform processing on a sample S to obtain a sample piece Q (for example, a lamella, a needle-shaped specimen, etc.) for transmission observation in a transmission electron microscope (TEM) or a sample piece for analysis in an electron beam. The charged particle beam apparatus 10 can perform a process of slicing (i.e., thinning) the sample piece Q transported to the sample piece holder P to a desired thickness (for example, 5 to 100 nm) suitable for transmission observation in a transmission electron microscope. The charged particle beam apparatus 10 can perform observation of the surface of an irradiation target including the sample piece Q, the needle 18, and the like by irradiating the surface of the irradiation target in a manner of scanning a focused ion beam or an electron beam over the surface of the irradiation target.

The absorption current detector 20 includes a preamplifier to amplify the current flowing to the needle, and transmits the resulting amplified signal to the computer 22. An absorption current image of a needle shape can be formed on the basis of a needle inflow current detected by the absorption current detector 20 and on a signal synchronized with the scanning of a charged particle beam and displayed on the display device 21. With this image, it is possible to identify the position of the tip of a needle and the shape of a needle.

Figure 2:
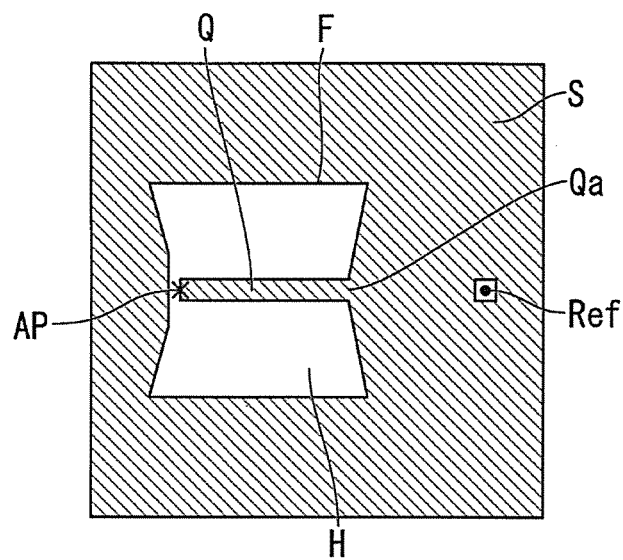
FIG. 2 is a plan view illustrating a sample piece formed in a sample by a charged particle beam apparatus according to an embodiment of the present invention.

FIG. 2 is a plan view illustrating a sample piece Q that is formed by irradiating the surface (namely, hatched region) of a sample S with a focused ion beam and which is not yet extracted from the sample S, in the charged particle beam apparatus 10 according to the embodiment of the present invention. Reference symbol F denotes a processing frame (namely, a scanning range of a focused ion beam), in which an inner portion (white portion) is a processing region H which is excavated by focused ion beam irradiation sputtering. Reference symbol Ref denotes a reference mark (reference point) indicating a position where the sample piece Q is to be formed (namely, a portion that is left without being excavated). For example, FIG. 2 illustrates a state in which a minute hole having a diameter of 30 nm is formed by irradiation of a focused ion beam in a square deposition film (to be described later) having a size of 1 μm×1 μm. The image formed by irradiation of a focused ion beam or an electron beam has such a good contrast that the hole can be clearly recognized. The deposition film is used as a reference position to coarsely locate the position of the sample piece Q, and the minute hole is used as a reference position for precise positioning. Within the sample S, the periphery of the sample piece Q is etched away except for a support portion Qa via which the sample piece Q is connected with the sample S. Thus, the sample piece Q is supported by the support portion Qa in a cantilever manner. The sample piece Q is a minute specimen, for example, being about 10 µm, 15 µm, or 20 µm in length and about 500 nm, 1 µm, 2 µm, or 3 µm in width (thickness).

The sample chamber 11 is configured in a manner that the inside thereof can be purged to a desired vacuum level by an evacuation device (not shown) and the vacuum state can be maintained.

The stage 12 functions to retain the sample S. The stage 12 is equipped with a holder fixing base 12a for retaining a sample piece holder P. The holder fixing base 12a is configured to mount a plurality of sample piece holders P.

Figure 3:
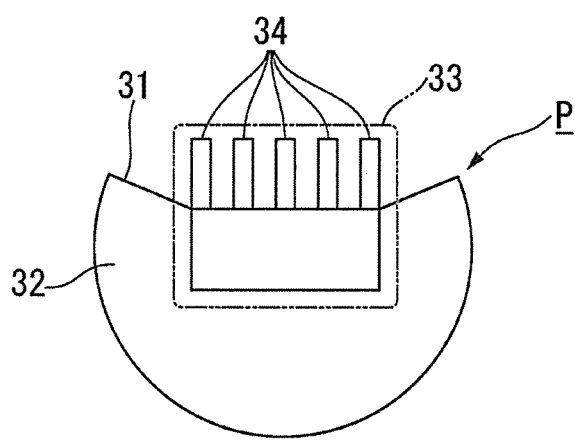
FIG. 3 is a plan view illustrating a sample piece holder of a charged particle beam apparatus according to an embodiment of the present invention.
Figure 4:
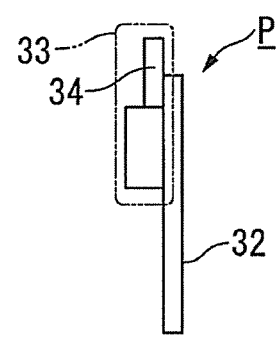
FIG. 4 is a side view illustrating a sample piece holder of a charged particle beam apparatus according to an embodiment of the present invention.

FIG. 3 is a plan view of the sample piece holder P, and FIG. 4 is a side view thereof. The sample piece holder P includes a substantially semicircular plate-shaped base portion 32 with a notch portion 31, and a sample base 33 fixed in the notch portion 31. The base portion 32 is made of a metallic circular plate having a diameter of 3 mm and a thickness of 50 µm. The sample base 33 is made from, for example, a silicon wafer through a semiconductor manufacturing process, and is attached to the notch portion 31 by a conductive adhesive. The sample base 33 has a plurality of (for example, five, ten, fifteen, or twenty) comb-shaped columnar portions (hereinafter, also referred to as pillars) 34 spaced from each other and protruding from the base portion 32.

With the design in which the columnar portions 34 differ in the width, it is possible to associate sample pieces Q transferred to the respective columnar portions 34 with images of the respective columnar portions 34, and respective sample piece holders P. The associated information is stored in the computer 22. Therefore, even in a case of preparing a plurality of sample pieces Q from one sample S, accurate and precise recognition is possible. Therefore, in the subsequent TEM analysis process, it is possible to associate the sample pieces Q with corresponding extraction positions within the sample S without mistakes. Each columnar portion 34 has a tip that is, for example, 10 µm or less or 5 µm or less in thickness, and retains the sample piece Q mounted on the tip thereof.

The base portion 32 is not limited to a circular plate having a diameter of 3 mm and a thickness of 50 m. For example, the base portion 32 may have a rectangular plate shape having a length of 5 mm, a height of 2 mm, and a thickness of 50 µm. In other words, the base portion 32 can be any shape that can be mounted on the stage 12 to be introduced into a transmission electron microscope (TEM) in the subsequent process and which enables the entirety of the sample piece Q mounted on the sample base 33 can be positioned within a movable range of the stage 12. With this base portion 32 having such a shape, all of the sample pieces Q mounted on the sample base 33 can be observed with a transmission electron microscope (TEM).

The stage driving mechanism 13 is disposed inside the sample chamber 11 and connected with the stage 12. The stage driving mechanism 13 displaces the stage 12 with respect to a predetermined axis in accordance with a control signal transmitted from the computer 22. The stage driving mechanism 13 includes a moving mechanism 13a for moving the stage 12 at least along an X axis and a Y axis that are parallel to a horizontal plane and are perpendicular to each other and along a Z axis (namely, in the vertical direction) perpendicular to each of the X axis and the Y axis. The stage driving mechanism 13 includes a tilting mechanism 13b for tilting the stage 12 about the X axis or the Y axis and a rotating mechanism 13c for rotating the stage 12 around the Z axis.

The focused ion beam irradiation optical system 14 includes a beam output portion (not illustrated) disposed inside the sample chamber 11 and positioned to face the stage 12 at a position vertically above the stage 12 disposed within an irradiation region. The focused ion beam irradiation optical system 14 is fixed to the sample chamber 11 in a manner that the optical axis thereof is in parallel with the vertical direction. Thereby, a focused ion beam can be emitted downward in the vertical direction to an irradiation target including the sample S mounted on the stage 12, the sample piece Q, and the needle 18 disposed within the irradiation region. The charged particle beam apparatus 10 may include a different ion beam irradiation optical system in place of the focused ion beam irradiation optical system 14 described above. The ion beam irradiation optical system is not limited to the above-mentioned optical system that forms a focused ion beam. The ion beam irradiation optical system may be, for example, a projection-type ion beam irradiation optical system that has a stencil mask having a regular opening inside thereof and which forms a shaped beam having the same shape as the opening formed in the stencil mask. According to this projection-type ion beam irradiation optical system, the shaped beam having a shape corresponding to the processing region around the sample piece Q can be accurately formed, resulting in reduction in a processing time.

The focused ion beam irradiation optical system 14 includes an ion source 14a for generating ions and an ion optical system 14b for focusing and deflecting the ions emitted from the ion source 14a. The ion source 14a and the ion optical system 14b are controlled in accordance with a control signal output from the computer 22, and the irradiation position and the irradiation condition of the focused ion beam are controlled by the computer 22. The ion source 14a is, for example, a liquid metal ion source using liquid gallium or the like, a plasma-type ion source, a gas field ionization-type ion source, or the like. The ion optical system 14b includes, for example, a first electrostatic lens such as a condenser lens, an electrostatic deflector, and a second electrostatic lens such as an objective lens. When a plasma-type ion source is used as the ion source 14a, high-speed processing can be realized due to a large current beam, and the plasma-type ion source is suitable for extraction of a large sample S.

The electron beam irradiation optical system 15 includes a beam output portion (not illustrated) disposed inside the sample chamber 11 and positioned to face the stage 12 in an oblique direction which is tilted by a predetermined angle (for example, 60°) from the direction perpendicular to the surface of the stage 12 disposed within an irradiation region. The electron beam irradiation optical system 15 is fixed to the sample chamber 11 in a manner that the optical axis thereof is in parallel with the oblique direction. Thereby, an electron beam can be emitted downward from above in the oblique direction to the irradiation target including the sample S mounted on the stage 12, the sample piece Q, and the needle 18 disposed within the irradiation region.

The electron beam irradiation optical system 15 includes an electron source 15a for generating electrons and an electron optical system 15b for focusing and deflecting the electrons emitted from the electron source 15a. The electron source 15a and the electron optical system 15b are controlled in accordance with a control signal output from the computer 22, and the irradiation position and the irradiation condition of the electron beam are controlled by the computer 22. The electron optical system 15b includes, for example, an electronic lens, a deflector, and the like.

The arrangement of the electron beam irradiation optical system 15 and the focused ion beam irradiation optical system 14 can be changed so that the electron beam irradiation optical system 15 is positioned in the vertical direction and the focused ion beam irradiation optical system 14 is positioned in the oblique direction tilted by the predetermined angle from the vertical system.

The detector 16 detects the intensity of secondary charged particles (namely, the amount of secondary electrons and secondary ions) R scattering from an irradiation target when the irradiation target such as the sample S, the needle 18, and the like is irradiated with a focused ion beam or an electron beam, and outputs information of the detected amount of the secondary charged particles R. The detector 16 is disposed inside the sample chamber 11 and specifically positioned at a position at which the amount of the secondary charged particles R can be detected. For example, the detector 16 is positioned at a position obliquely above the irradiation target such as the sample S disposed within the irradiation region. At the position, the detector 16 is fixed to the sample chamber 11.

The gas supply unit 17 is fixed to the sample chamber 11 and has a gas injection part (also referred to as a nozzle) that is disposed inside the sample chamber 11 and is positioned to face the stage 12. The gas supply unit 17 can supply an etching gas or a deposition gas to the sample S: the etching gas for selectively accelerating the focused ion beam etching of the sample S, depending on the material of the sample S; and the deposition gas for forming deposition film by a deposit such as a metal, an insulator, and the like on the sample S. For example, by supplying an etching gas such as xenon fluoride to a silicon sample S or an etching gas such as water to an organic sample S while irradiating the silicon sample S or the organic sample S with a focused ion beam, it is possible to accelerate the material-selective etching. Alternatively, for example, by supplying a deposition gas containing platinum, carbon, or tungsten to a sample S while irradiating the sample S with a focused ion beam, a solid component decomposed from the deposition gas is deposited on the surface of the sample S. Specific examples of the deposition gas are as follows: gases containing carbon include phenanthrene, naphthalene, and pyrene; gases containing platinum include trimethyl.ethylcyclopentadienyl.platinum; and gases containing tungsten include carbonyl. Depending on the supplied gas, etching or deposition can be performed in conjunction with irradiation of an electron beam. The optimum deposition gas to be used in the charged particle beam apparatus 10 according to the embodiment of the present invention is a carbon-contained gas, for example, phenanthrene, naphthalene, pyrene, and the like from the viewpoint of a deposition rate and reliable attachment of a formed deposition film to the sample piece Q and to the needle 18. Preferably, any one among them is used.

The needle driving mechanism 19 is accommodated in the sample chamber 11 and is connected to the needle 18. The needle driving mechanism 19 displaces the needle 18 in accordance with a control signal output from the computer 22. The needle driving mechanism 19 moves as a unit with the stage 12. For example, when the stage 12 is tilted around the tilt axis (namely, the X axis or the Y axis) by the tilting mechanism 13b, the needle driving mechanism 19 is also tilted along with the stage 12. The needle driving mechanism 19 includes a moving mechanism (not illustrated) for moving the needle 18 in parallel with each of the three-dimensional coordinate axes and a rotating mechanism (not illustrated) for rotating the needle 18 on the axis of the needle 18. The three-dimensional coordinate axes are independent of an orthogonal three-axis coordinate system of the sample stage 12. The three-dimensional coordinate axes are elements of an orthogonal three-axis coordinate system including two-dimensional coordinate axes parallel to the surface of the stage 12. When the surface of the stage 12 is tilted or rotated, this coordinate system is also tilted or rotated.

The computer 22 controls at least the stage driving mechanism 13, the focused ion beam irradiation optical system 14, the electron beam irradiation optical system 15, the gas supply unit 17, and the needle driving mechanism 19.

The computer 22 is disposed outside the sample chamber 11 and is connected with the display device 21 and the input device 23 such as a mouse and a keyboard for outputting a signal in accordance with the input operation of an operator.

The computer 22 integrally controls the operation of the charged particle beam apparatus 10 in accordance with a signal output from the input device 23 or a signal generated by a predetermined automatic operation control process or the like.

The computer 22 converts the amount of the secondary charged particles R detected by the detector 16 into a luminance signal associated with the irradiation position while scanning the irradiation position of the charged particle beam, and generates image data representing the shape of the irradiation target on the basis of a two-dimensional position distribution of the detection amounts of the secondary charged particles R. In an absorption current image mode, the computer 22 detects the absorption current flowing through the needle 18 while scanning the positions irradiated with the charged particle beam, thereby generating absorption current image data representing the shape of the needle 18 on the basis of a two-dimensional position distribution of the absorption current (namely, absorption current image). The computer 22 displays, on the display device 21, the generated image data and a screen for execution of operations such as enlarging, reducing, moving, and rotating each image data as well as the generated image data. The computer 22 displays, on the display device 21, a screen for various settings, for example, mode selection for automatic sequence control, or processing settings.

The charged particle beam apparatus 10 according to the embodiment of the present invention has the above-described configuration. Next, the operation of the charged particle beam apparatus 10 will be described.

An operation of automatically transporting the sample piece Q formed by the automatic sampling operation performed by the computer 22, namely, prepared by processing the sample S with a charged particle beam (focused ion beam), to the sample piece holder P is divided into an initial setting process, a sample piece pickup process, and a sample piece mounting process which will be sequentially described below.

<Initial Setting Process>

Figure 5:
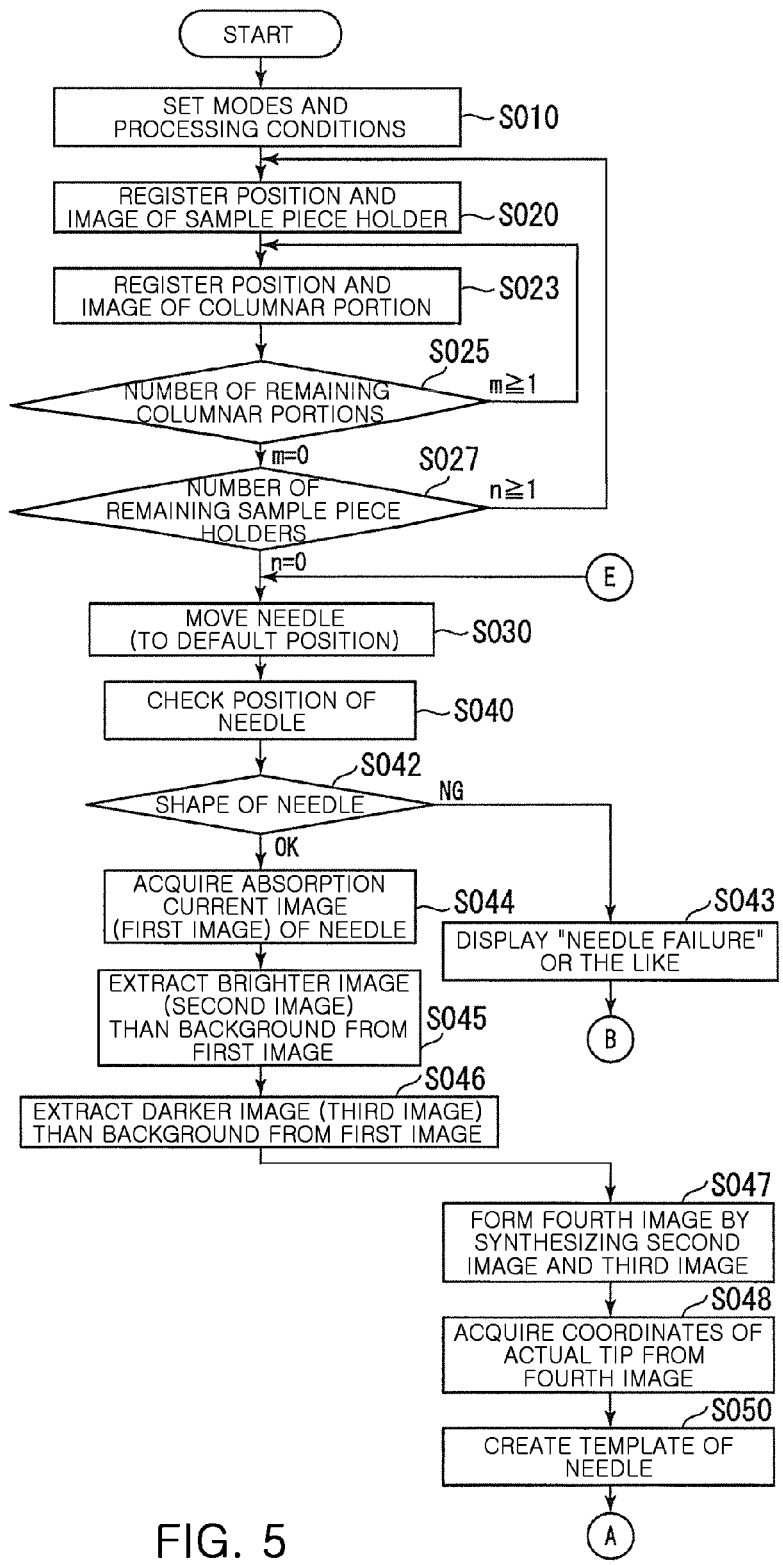
FIG. 5 is a flowchart of an initial setting process, which is a part of a flowchart showing an operation sequence of a charged particle beam apparatus according to an embodiment of the present invention.

FIG. 5 is a flowchart illustrating the flow of the initial setting process during the automatic sampling operation of the charged particle beam apparatus 10 according to the embodiment of the present invention. At the start of the automatic sequence, the computer 22 checks the mode selection such as the presence or absence of a posture control mode which will be described later, observation conditions for template matching, processing conditions settings (namely, settings such as processing positions, dimensions, the number of sample pieces), and the shape of a needle tip in accordance with the input operation of an operator (Step S010).

Next, the computer 22 creates a template of the columnar portion 34 (Steps S020 through S027). When creating this template, the computer 22 performs a position registration process of registering the position of the sample piece holder P that is installed on the holder fixing base 12a of the stage 12 in accordance with the input operation of an operator (Step S020). The computer 22 creates a template of the columnar portion 34 at the beginning of the sampling process. The computer 22 prepares the template for each columnar portion 34. The computer 22 acquires the stage coordinates of each columnar portion 34, creates the templates of the respective columnar portions 34, stores the stage coordinates and the templates in a paired manner, and later uses the stored information at the time of determining the shape of each columnar portion 34 through template matching (namely, overlapping the template with an actual image of the columnar portion). The computer 22 preliminarily stores, for example, the image of the columnar portion 34, edge information extracted from the image, or the like, as the template of the columnar portion 34 used for the template matching. The computer 22 performs the template matching after the movement of the stage 12 in the subsequent process and determines the shape of the columnar portion 34 on the basis of the score of the template matching, thereby recognizing the accurate position of the columnar portion 34. In addition, as the observation conditions for the template matching, it is preferable to use the same conditions (for example, contrast, magnification, and the like) as those set for template creation in terms of accuracy of the template matching.

When a plurality of sample piece holders P are provided within the holder fixing base 12a and a plurality of columnar portions 34 are provided within each sample piece holder P, each sample piece holder P is assigned a unique recognition code, each columnar portion 34 of the sample holder P is assigned a unique recognition code in advance, and the coordinates, the unique recognition code, and the template of each columnar portion 34 are stored in association with each other in the computer 22.

In addition, preferably, the computer 22 also stores the in-sample coordinates of a position from which each sample piece Q is extracted and image information of the surface of the sample around the corresponding sample piece, as well as the recognition code, the coordinates, and template information of each columnar portion 34, as one set.

For example, in the case of an indefinite sample such as a rock, a mineral, or a biological sample, the computer 22 stores a set of information including a low-magnification and wide optical field image, a position coordinate of the extracted portion, an image, and the like as the recognition information. The recognition information will also be associated with the sliced sample S, and will be stored in association with a TEM image and the extracted position of the sample piece Q within the sample S.

Since the position registration of the sample piece holder P is performed prior to the movement of the sample piece Q to be described later, the computer 22 can confirm in advance that a sample base 33 having a proper form actually exists.

In the position registration process, the computer 22 first moves the stage 12 by using the stage driving mechanism 13 as a coarse adjustment operation and performs a positioning operation of aligning an irradiation region with a mounting position of a sample base 33 within the sample piece holder P. Next, as a fine adjustment operation, the computer 22 extracts the positions of the respective columnar portions 34 by using the templates preliminarily generated from design shape (CAD information) of the sample base 33, from image data generated by irradiating an irradiation target with a charged particle beam (namely, image data generated by using a focused ion beam and image data generated by using an electron beam). Then, the computer 22 registers (stores) the position coordinates and the image of each extracted columnar portion 34 as the mounting position of the sample piece Q (Step S023). At this time, each columnar portion 34 is checked for presence or absence of deformations, fractures, chips, or the like by comparing the image of each columnar portion 34 with the previously prepared design chart or the CAD drawing or with the image of the standard columnar portion 34. When the inspected columnar portion 34 is determined to be defective, the computer 22 stores the fact that the inspected columnar portion 34 is defective, the position coordinates of the inspected columnar portion 34, and the image of the inspected columnar portion 34.

Next, it is determined whether or not the registration on-going sample piece holder P has any columnar portion 34 to be registered (Step S025). When the result of the determination is "YES", that is, when the number m of remaining columnar portions 34 to be registered is 1 or more, the process returns to Step S023, and then Steps S023 and S025 are repeated until the number m of the remaining columnar portions 34 becomes zero. On the other hand, when the result of the determination is "NO", that is, when the number m of the remaining columnar portion 34 to be registered is zero, the process proceeds to Step S027.

When the multiple sample piece holders P are provided on the holder fixing base 12a, the position coordinates of each sample piece holder P and the image data of each sample piece holder P are stored in association with a code number of the corresponding sample piece holder P. In addition, code numbers corresponding to position coordinates, and image data of the respective columnar portions 34 of each sample piece holder P are also stored (registered). The computer 22 performs this position registration process sequentially by a predetermined number of times corresponding to the number of the sample pieces Q to be subjected to automatic sampling.

Then, the computer 22 determines whether or not there is a sample piece holder P to be registered (Step S027). When the result of the determination is "YES", namely, when the number n of remaining sample piece holders P to be registered is 1 or greater, the process returns to Step S020 and then Steps S020 to S027 are performed until the number n of the remaining sample piece holders P becomes zero. On the other hand, when the result of the determination is "NO", that is, when the remaining number m of the columnar portion 34 to be registered is zero, the process proceeds to Step S030.

In this way, when multiple sample pieces Q are automatically prepared from one sample S, the positions of the multiple sample piece holders P on the holder fixing base 12a are registered, and the positions and the images of the respective columnar portions 34 of each sample holder P are registered. Therefore, it is possible to bring a specific sample piece holder P on which several tens of sample pieces Q can be mounted and a specific columnar portion 34 on which one sample piece Q can be mounted into the field of view of a charged particle beam.

When the sample piece holder P itself or the columnar portion 34 is determined to be deformed or broken to the extent that the sample piece Q cannot be mounted thereon during the position registration process (Step S020, S023), the message "non-available" indicating a position at which the sample piece Q is not to be mounted is registered along with the position coordinates, the image data, and the code number of the sample piece holder P or the columnar portion 34. Thus, the computer 22 can skip the sample piece holder P or the columnar portion 34 corresponding to the message "non-available" in a process of transferring the sample piece Q to be described later, and bring the next normal sample piece holder P or the next normal columnar portion 34 to appear within an observation field of view.

Next, the computer 22 creates a template of the needle 18 (Steps S030 through S050). The template is used for image matching when causing the needle to accurately approach the sample piece in a process to be described later.

In this template creation step, first, the computer 22 causes the stage driving mechanism 13 to move the stage 12. Subsequently, the computer 22 causes the needle driving mechanism 19 to move the needle 18 to a default position (initial setting position) (Step S030). The default position is a point (coincidence point) which can be irradiated with both beams (namely, a focused ion beam and an electron beam) and on which the both beams are focused. In addition, the default position is a predetermined point at which neither the sample S nor a complicated structure which can be mistakenly recognized as the needle 18 was present within a background region of the needle 18 at the time of the immediately previous stage movement. This coincidence point is a position at which the same object can be observed from different angles, i.e., by irradiation of a focused ion beam and by irradiation of an electron beam.

Next, the computer 22 recognizes the position of the needle 18 using an absorption image mode in which an image is formed by irradiation of an electron beam (Step S040).

The computer 22 detects an absorption current flowing into the needle 18 and generates absorption current image data while irradiating the needle 18 with an electron beam in a manner of scanning the electron beam over the needle 18. At this time, since there is no background object which is likely to be mistaken for the needle 18 in the absorption current image, the needle 18 can be recognized without being influenced by the background image. The computer 22 acquires absorption current image data by irradiation of an electron beam irradiation. When the needle approaches a sample piece to create a template of the needle, it is not rare that objects that can be mistaken for the needle, for example, processed shapes of the sample pieces, patterns on the sample, and the like are present around the needle. Therefore, in the case of using a secondary electron image to create the template, there is a concern that an object other than the needle can be mistaken for the needle. For this reason, the absorption current image which is not influenced by the background of the needle is used to create the template of the needle. Since the secondary electron image is susceptible to the background and has a high possibility of misidentification, it is not suitable as a template image. As described above, since it is difficult to recognize the carbon deposition film attached to the tip of the needle within the absorption current image, it is impossible to locate the actual needle tip within the absorption current image. However, the absorption current image is suitable in terms of pattern matching with the template.

Here, the computer 22 determines the shape of the needle 18 (Step S042). When the shape of the tip of the needle 18 is determined to be in an abnormal state in which the sample piece Q cannot be mounted on the tip of the needle 18 due to any reason, for example, deformation, fracture, or the like (NG in Step S042), the process proceeds to the NO side of Step S280 in FIG. 38 from Step S043. That is, Step S050 and all the subsequent steps are not performed, and the automatic sampling is interrupted. That is, when the shape of the tip of the needle is defective, further work cannot be performed, and the needle replacement is performed by an apparatus operator. Regarding the determination of Step S042, for example, the needle is determined to be defective when the tip of the needle is positioned a distance of 100 μm or more from a predetermined position within a 200 μm observation field of view. When the needle is determined to be defective in Step S042, the message "needle failure" or the like is displayed on the display device 21 (Step S043) to warn the operator to check the apparatus for errors. The defective needle 18 is replaced with a new needle 18. Alternatively, when the defect is not significant, the tip of the defective needle 18 is subject to shaping by a focused ion beam.

When the needle 18 is determined to have a normal shape in Step S042, the next step S044 is performed.

Here, the state of the needle tip will be described.

Figure 6A:
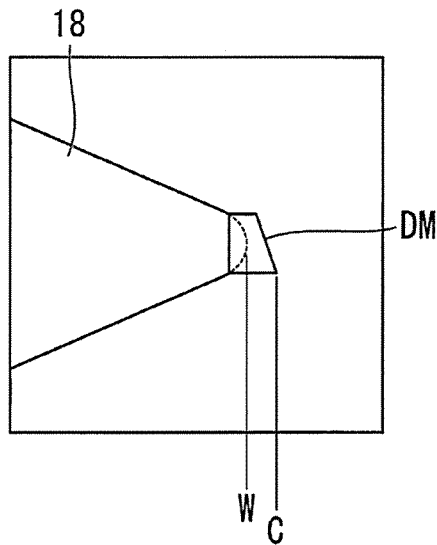
FIGS. 6A and 6B is a schematic diagram used to describe an actual tip of a needle after the needle is repeatedly used within a charged particle beam apparatus according to an embodiment of the present invention, in which (A) is a schematic diagram illustrating an actual needle tip and (B) is a schematic diagram illustrating a first image obtained on the basis of an absorption current signal.

FIG. 6A is a schematic diagram illustrating a needle tip in an enlarged manner and illustrates a state in which the residue of a carbon deposition film DM is attached to the tip of the needle (tungsten needle) 18. The needle 18 can be repeatedly used for multiple sampling operations by carefully positioning the needle 18 in such a manner that the needle is not cut or deformed by being exposed to a focused ion beam. Therefore, during the use of the needle 18, the residue of the carbon deposition film DM which is used to retain the sample piece Q is attached to the tip of the needle 18. Over the repeated samplings, the residue of the carbon deposition film DM gradually grows with time and eventually protrudes from the real tip of the tungsten needle. At this time, the coordinates of the actual tip of the needle 18 do not indicate the position of the real tip W of the tungsten needle 18 but indicate the position of the tip C of the residue of the carbon deposition film DM. When the needle 18 approaches the sample piece Q to create a template of the needle, it is not rare that objects that can be mistaken for the needle 18, for example, processed shapes of the sample piece Q, patterns on the sample, and the like are present around the needle. Therefore, in the case of using a secondary electron image to create the template, there is a concern that an object other than the needle can be mistaken for the needle. For this reason, the absorption current image which is not influenced by the background of the needle is used to create the template of the needle. Since the secondary electron image is susceptible to the background and has a high possibility of misidentification, it is not suitable as a template image. As described above, since the carbon deposition film DM attached to the tip of the needle is not shown in the absorption current image, the actual needle tip cannot be located within the absorption current image. However, the absorption current image is suitable in terms of pattern matching with the template.

Figure 6B:
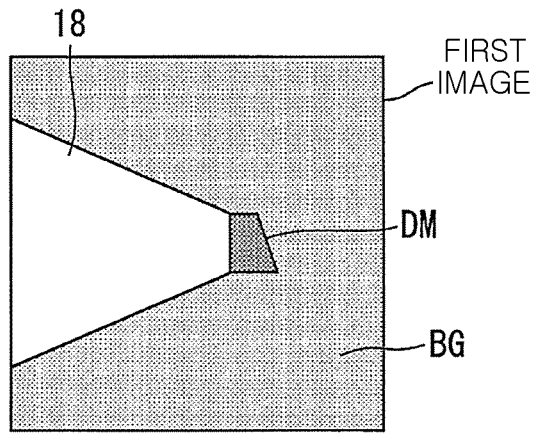

FIG. 6B is a schematic diagram of the absorption current image of a tip portion of the needle to which the carbon deposition film DM is attached. Even though there is a complicated pattern in the background, the needle 18 can be clearly recognized without being influenced by any shape within the background of the needle 18. Since an electron beam signal emitted to the background is not reflected on the image, the background appears in a gray tone with a uniform noise level. On the other hand, the carbon deposition film DM appears to be slightly darker than the gray tone of the background, and thus the tip of the carbon deposition film DM cannot be clearly identified from the absorption current image. Since the actual needle tip including the carbon deposition film DM attached to the real needle tip cannot be recognized from the absorption current image, when the needle 18 is moved only depending on the absorption current image, there is a high likelihood that the tip of the needle collides with the sample piece Q.

Therefore, the actual tip coordinates of the needle 18 are obtained from the tip coordinates C of the carbon deposition film DM in the following manner. Here, the image of FIG. 6B will be referred to as a first image.

A process of acquiring the absorption current image (first image) of the needle 18 corresponds to Step S044.

Next, the first image of FIG. 6B undergoes image processing to extract a region brighter than the background (Step S045).

Figure 7A:
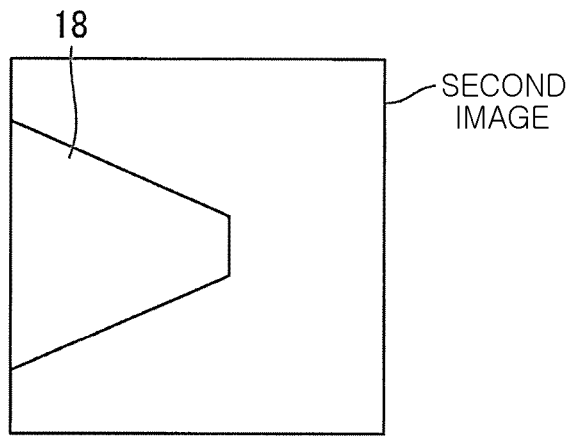
FIGS. 7A and 7B is a schematic diagram illustrating a secondary electron image obtained by emitting an electron beam to a needle tip in a charged particle beam apparatus according to an embodiment of the present invention, in which (A) is a schematic diagram illustrating a second image obtained by extracting a brighter region than the background from the secondary electron image, and (B) is a schematic diagram illustrating a third image obtained by extracting a darker region than the background from the secondary electron image.

FIG. 7A is a schematic diagram of an image obtained by extracting the brighter region than the background of the first image, from the first image, by performing the image processing on the first image of FIG. 6B. When a brightness difference between the background and the needle 18 is small in the first image, the image contrast of the first image is enhanced to increase the brightness difference between the background and the needle. In this way, an image in which a region brighter than the background (a part of the needle 18) is emphasized is obtained, and this image is referred to as a second image herein. The second image is stored in the computer.

Next, in the first image of FIG. 6B, a darker region than the background brightness is extracted (Step S046).

Figure 7B:
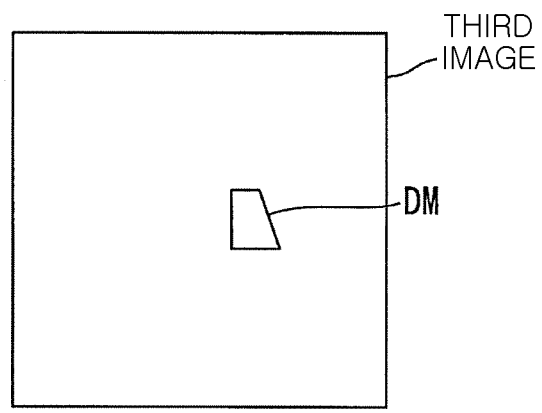

FIG. 7B is a schematic diagram of an image obtained by extracting the darker region than the background of the first image, from the first image, by performing the image processing on the first image of FIG. 6B. Only the carbon deposition film DM attached to the needle tip is extracted and displayed. When the difference in brightness between the background and the carbon deposition film DM is small, the image contrast of the first image can be enhanced to increase the brightness difference between the background and the carbon deposition film DM on the image data. In this way, an image in which a darker region than the background is shown is obtained. Here, this image is referred to as a third image, and the third image is stored in the computer 22.

Next, the second image and the third image stored in the computer 22 are synthesized (Step S047).

Figure 8:
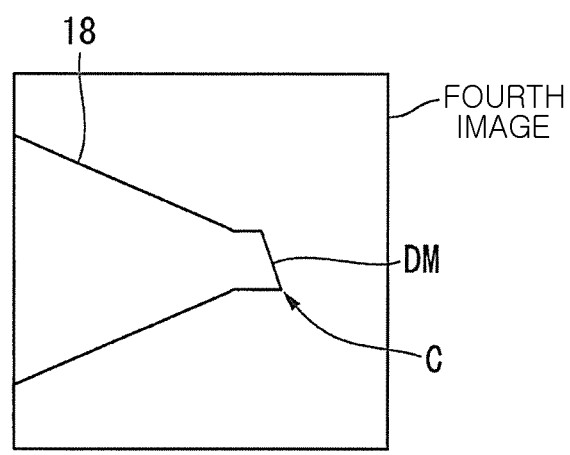
FIG. 8 is a schematic diagram for use in description of a fourth image obtained by synthesizing the second image and the third image illustrated in FIG. 7.

FIG. 8 is a schematic diagram of a display image after the synthesis. However, in order to make the image easier to see, only the contour of the needle 18 and the contour of the carbon deposition film DM are drawn in the second image and the third image, respectively. That is, except for the lines representing the circumferences of the needle 18 and the carbon deposition film DM, the other portions including the background are transparent. Alternatively, only the background may be transparent, and the needle 18 and the carbon deposition film DM may be painted in the same color or in the same tone. As described above, the second image and the third image are generated from the first image. Therefore, unless only either one of the second image and the third image undergoes deformation such as enlargement, reduction, rotation, tilting, or the like, the synthesized image of the second image and the third image reflects the shape of the first image. Here, the synthesized image is called a fourth image, and the fourth image is stored in the computer. Since the fourth image undergoes image processing such as contrast adjustment and contour emphasis on the basis of the first image, the needle shape in the first image and the needle shape in the fourth image are identical. In the case of the fourth image, the contour is clearer, and specifically, the tip of the carbon deposition film DM is clearly shown as compared with the first image.

Next, from the fourth image, the coordinates of the tip of the carbon deposition film DM, that is, the coordinates of the actual tip of the needle 18 on which the carbon deposition film DM is deposited, are obtained (Step S048).

The fourth image is read out of the computer 22 and displayed, and the coordinates of the actual tip of the needle 18 are obtained. The most protruding point C in the axial direction of the needle 18 is the actual tip of the needle and is automatically determined by an image recognition technique, and then the coordinates of the actual tip are stored in the computer 22.

Next, in order to further increase the accuracy of template matching, the absorption current image of the needle tip within the same observation field of view as that in Step S044 is set as a reference image, a template image is obtained by extracting only a portion including the needle tip from the data of the reference image on the basis of the coordinates of the needle tip obtained in Step S048. The template image and the reference coordinates of the needle tip (namely, needle tip coordinates) obtained in Step S048 are associated with each other and stored in the computer 22 (Step S050).

Next, the computer 22 performs the following process as a needle approaching process of bringing the needle 18 closer to the sample piece Q.

In addition, in Step S050, the same field view as that in Step S044 is set. However, the present invention is not limited to this. When the beam scanning standard is managed, it is not necessary to set the same field of view. In the description of Step S050, the template includes the needle tip. However, it is also possible to use a region that does not include the tip as a template when the template is associated with the reference coordinates.

Since the computer 22 uses the image data actually acquired before the needle 18 is moved as the reference image data, the pattern matching can be performed with high accuracy, regardless of the variation of the shape among the individual needles 18. In addition, since the computer 22 acquires image data without a complicated structure being present in the background, accurate coordinates of the actual needle tip can be obtained. In addition, it is possible to obtain a template in which the shape of the needle 18 can be clearly recognized while eliminating the influence of the background.

In addition, the computer 22 uses image acquisition conditions such as magnification, luminance, contrast, and the like that are stored in advance in order to increase the recognition accuracy of an object when acquiring the image data.

Alternatively, the steps (S020 to S027) of creating the template of the columnar portion 34 and the steps (S030 to S050) of creating the template of the needle 18 may be reversed. However, in the case where the steps (S030 to S050) of creating the template of the needle 18 precede, the flow E returning from Step S280 described later accordingly changes.

<Sample Piece Pickup Process>

Figure 9:
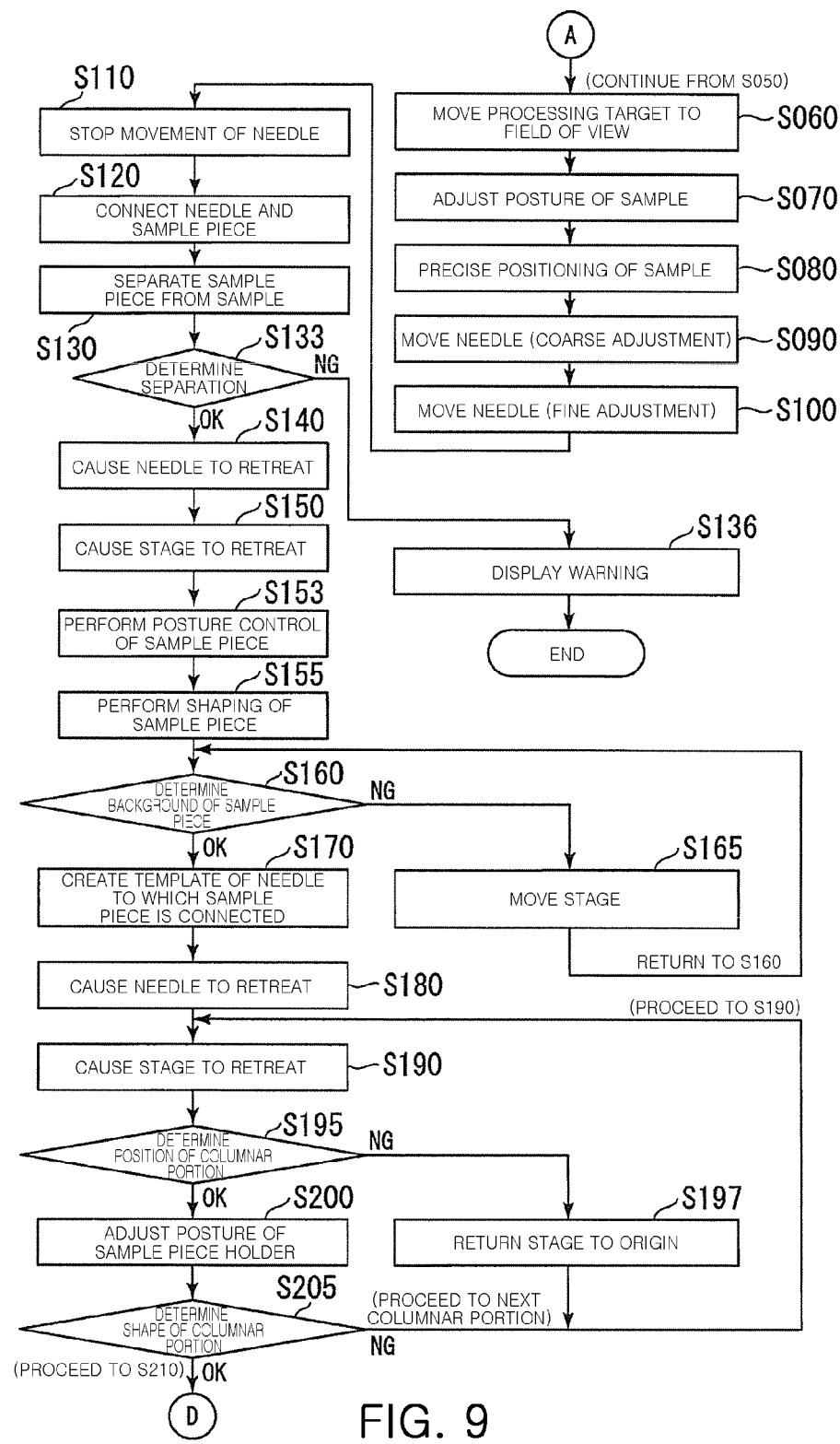
FIG. 9 is a flowchart of a sample piece pickup process, which is a part of a flowchart illustrating an operation sequence of a charged particle beam apparatus according to an embodiment of the present invention.

FIG. 9 is a flowchart illustrating the flow of the sample piece pickup process of picking up the sample piece Q from the sample S, during the automatic sampling operation of the charged particle beam apparatus 10 according to the embodiment of the present invention. Here, the pickup refers to separation and extraction of the sample piece Q from the sample S by using a focused ion beam or by using the needle.

First, the computer 22 causes the stage driving mechanism 13 to move the stage 12 so that the sample piece Q as a target is brought into the field of view of a charged particle beam. The stage driving mechanism 13 can be operated with reference to the position coordinates of a reference mark Ref of the target sample piece Q.

Next, the computer 22 recognizes the reference mark Ref, which is formed in the sample S in advance, from the image data of the charged particle beam. The computer 22 recognizes the position of the sample piece Q from the relative positional relationship between the already known reference mark Ref and the sample piece Q, and moves the stage such that the position of the sample piece Q falls within an observation field of view (Step S060).

Next, the computer 22 causes the stage driving mechanism 13 to move the stage 12, namely, to rotate the stage 12 around the Z axis by an angle corresponding to a posture control mode so that the posture of the sample piece Q reaches a predetermined posture (for example, the posture in which the sample piece Q can be easily extracted by the needle 18) (Step S070).

Next, the computer 22 recognizes the reference mark Ref from the image data of the charged particle beam, calculates the position of the sample piece Q from the relative positional relationship between the already known reference mark Ref and the sample piece Q, and performs positioning of the sample piece Q (Step S080). Next, the computer 22 performs the following process as a needle approaching process of bringing the needle 18 closer to the sample piece Q.

The computer 22 executes a needle movement operation (coarse adjustment) for causing the needle driving mechanism 19 to move the needle 18 (Step S090). The computer 22 recognizes the reference mark Ref (refer to FIG. 2 described above) from the image data obtained by irradiating the sample S with a focused ion beam and the image data obtained by irradiating the sample S with an electron beam. The computer 22 sets a movement target position AP of the needle 18 with reference to the recognized reference mark Ref.

Here, the movement target position AP is set to a position that is close to the sample piece Q. The movement target position AP is, for example, a position close to the side surface of the sample piece Q at the opposite side of the support portion Qa. The computer 22 positionally associates the movement target position AP with a processing frame F at the time of forming the sample piece Q. The computer 22 stores information of the relative positional relationship between the processing frame F and the reference mark Ref when the sample piece Q is formed on the sample S by irradiation of a focused ion beam irradiation. The computer 22 moves the tip of the needle 18 toward the movement target position AP (refer to FIG. 2) in a three-dimensional space, by using the recognized reference mark Ref and the relative positional relationship between the reference mark Ref and the processing frame F. When three-dimensionally moving the needle 18, for example, the computer 22 first moves the needle 18 in the X and Y directions, and then in the Z direction.

When moving the needle 18, the computer 22 can accurately determine the three-dimensional positional relationship between the needle 18 and the sample piece Q by using the reference mark Ref formed in the sample S at the time of execution of the automatic processing for forming the sample piece Q and by performing observation from different directions with a focused ion beam and an electron beam, thereby appropriately moving the needle 18.

In the above-described process, the computer 22 moves the tip of the needle 18 toward the movement target position AP in the three-dimensional space by using the reference mark Ref and the relative positional relationship among the mark Ref, the processing frame F, and the movement target position AP. However, the present invention is not limited thereto. The computer 22 may use the relative positional relationship between the reference mark Ref and the movement target position AP without using the processing frame F to move the tip of the needle 18 toward the movement target position AP within the three-dimensional space.

The computer 22 executes a needle movement operation (fine adjustment) of causing the needle driving mechanism 19 to move the needle 18 (Step S100). The computer 22 repeats the pattern matching with the template created in Step S050 and also uses the needle tip coordinates obtained in Step S047 as the tip position of the needle 18 within an SEM image. Thus, the computer 22 three-dimensionally moves the needle 18 to a connection processing position from the movement target position AP while irradiating an irradiation region including the movement target position AP with a charged particle beam.

Next, the computer 22 performs a needle stopping process of stopping the movement of the needle 18 (Step S110).

Figure 10:
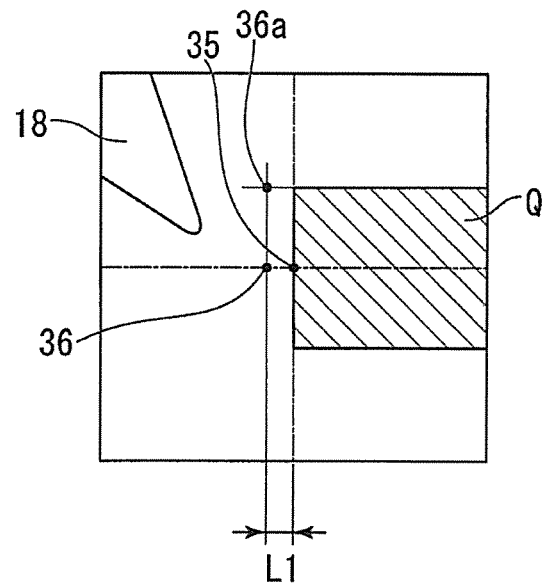
FIG. 10 is a schematic diagram illustrating a needle stop position at which a needle stops moving so that the needle and a sample piece can be connected, in a charged particle beam apparatus according to an embodiment of the present invention.

FIG. 10 is a view for describing the positional relation between the needle and the sample piece when connecting the needle to the sample piece, and is an enlarged view of an end portion of the sample piece Q. In FIG. 10, the end (cross section) of the sample piece Q to which the needle 18 is to be connected is positioned at the center 35 of the SIM image, and a position spaced by a predetermined distance L1 from the center 35 of the SIM image (namely, the midpoint in the widthwise direction of the sample piece Q) is referred to as a connection processing position 36. Alternatively, the connection processing position may be positioned on the extension from the cross section of the sample piece Q (for example, a position denoted by 36a in FIG. 10). In this case, since the deposition film is easily attached to the processing target position, this position is preferable as the connection processing position. The computer 22 sets the upper limit of the predetermined distance L1 to 1 μm and preferably the predetermined distance L1 is within a range of from 100 nm to 400 nm. When the predetermined distance L1 is less than 100 nm, there is a high risk that the needle 18 is accidentally cut when the needle is separated from the sample piece Q because it is difficult to cut only the deposition film connected between the needle 18 and the sample piece Q in a subsequent process. When the needle 18 is cut, the needle 18 is shortened and the tip of the needle is deformed to be thick. When this is repeated, the needle 18 has to be replaced with a new one. Therefore, this is against the objective of the invention of automatic continuous samplings. Conversely, when the predetermined distance L1 exceeds 400 nm, the connection between the needle 18 and the sample piece Q via the deposition film becomes insufficient, resulting in a high risk of extraction failure of the sample piece Q, thereby hindering the repetition of the sampling.

Although the processing position in the depth direction is not shown in FIG. 10, it is determined in advance to be a position in a depth of half the width of the sample piece Q, for example. However, the position in the depth direction is not limited to this. The three-dimensional coordinates of the connection processing position 36 are stored in the computer 22.

The computer 22 designates a preset connection processing position 36. The computer 22 operates the needle driving mechanism 19 on the basis of the three-dimensional coordinates of the tip of the needle 18 and the connection processing position 36 in the same SIM or SEM image, thereby moving the needle 18 to the predetermined connection processing position 36. The computer 22 stops the operation of the needle driving mechanism 19 when the tip of the needle 18 is positioned on the connection processing position 36.

Figure 11:
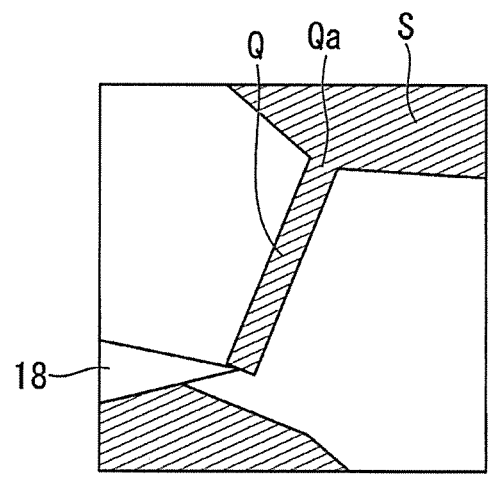
FIG. 11 is a diagram illustrating a needle tip and a sample piece in an image obtained by using a focused ion beam of a charged particle beam apparatus according to an embodiment of the present invention.
Figure 12:
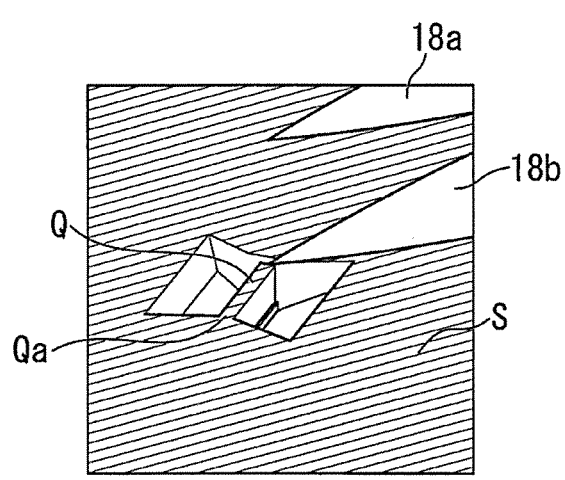
FIG. 12 is a diagram illustrating a needle tip and a sample piece in an image obtained by using an electron beam of a charged particle beam apparatus according to an embodiment of the present invention.

FIGS. 11 and 12 illustrate a state in which the needle 18 approaches the sample piece Q. FIG. 11 is a diagram illustrating an image obtained by using a focused ion beam of the charged particle beam apparatus 10 according to the embodiment of the present invention and FIG. 12 is a diagram illustrating an image obtained by using an electron beam of the charged particle beam apparatus 10 according to the embodiment of the present invention. FIG. 12 illustrates a state before and after the fine adjustment of the needle is performed. Reference symbol 18a in FIG. 12 denote the needle 18 positioned at the movement target position and reference symbol 18b denotes the needle 18 moved to the connection processing position 36 through the fine adjustment of the needle 18. That is, reference symbols 18a and 18b denote the same needle 18 positioned at different locations. FIGS. 11 and 12 differ in observation directions of a focused ion beam and an electron beam and in magnification, but are the same in the observation target and the needle 18.

With this needle moving method, it is possible to precisely, accurately, and rapidly move the needle 18 to the connection processing position near the sample piece Q and stop the movement of the needle 18 at the connection processing position.

Next, the computer 22 performs a process of connecting the needle 18 to the sample piece Q (Step S120). The computer 22 causes the gas supply unit 17 to supply a carbon-based gas as a deposition gas to the surfaces of the tip of the needle 18 and the sample piece Q for a predetermined deposition time, and causes the focused ion beam irradiation optical system to emit a focused ion beam to a processing frame R1 set to include the connection processing position 36. Thereby, the computer 22 connects the sample piece Q and the needle 18 with the deposition film.

Figure 13:
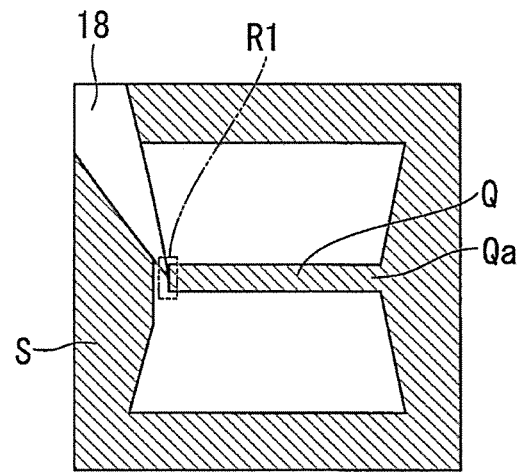
FIG. 13 is a diagram illustrating a processing frame including a connection processing position at which a needle and a sample piece are connected, within an image obtained by using a focused ion beam of a charged particle beam apparatus according to an embodiment of the present invention.
Figure 14:
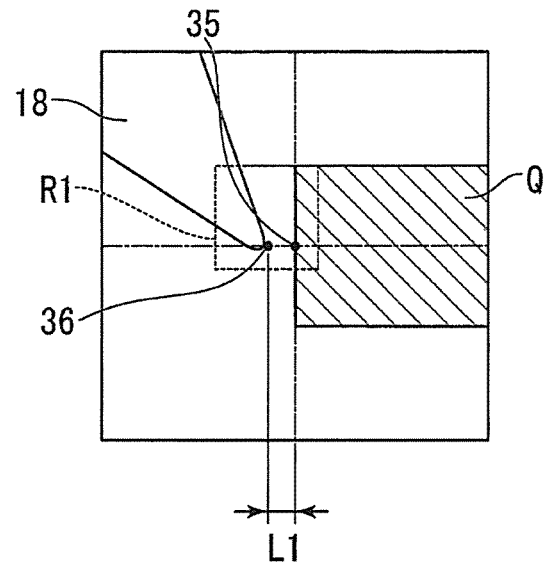
FIG. 14 is a schematic diagram illustrating a deposition film forming region and a positional relationship between a needle and a sample piece when a process of connecting the needle to the sample piece is performed in a charged particle beam apparatus according to an embodiment of the present invention.

In this Step S120, the computer 22 connects the needle 18 to the sample piece Q via the deposition film while retaining the needle 18 at a position spaced apart from the sample piece Q, namely, while avoiding a direction contact between the needle 18 and the sample piece Q. Therefore, it is possible to eliminate a concern that the needle 18 is partially cut when the needle 18 is separated from the sample piece Q by a focused ion beam in the subsequent process. Further, there is an advantage that it is possible to prevent a problem such as damage to the sample piece Q caused by the direct contact of the needle 18 with the sample piece Q. In addition, even though the needle 18 vibrates, it is possible to suppress transmission of the vibration to the sample piece Q. It is also possible to suppress excessive deformation from occurring between the needle 18 and the sample piece Q even when the displacement of the sample piece Q occurs due to the creep phenomenon of the sample S. FIG. 13 illustrates this state. That is, in the image data obtained by using a focused ion beam of the charged particle beam apparatus 10 according to the embodiment of the present invention, FIG. 13 illustrates the processing frame R1 (a region in which a deposition film is to be formed, which is shortly referred to hereinafter as a deposition film forming region) including the connection processing position at which the needle 18 and the sample piece Q are to be connected to each other, and FIG. 14 is an enlarged explanatory view of FIG. 13. In FIG. 14, the needle 18, the sample piece Q, and the deposition film forming region (for example, the processing frame R1) are illustrated in an easy-to-see manner. The needle 18 approaches and stops at a position (namely, the connection processing position) having a predetermined distance L1 from the sample piece Q. The needle 18, the sample piece Q, and the deposition film forming region (for example, the processing frame R1) are set so as to span the needle 18 and the sample piece Q. The deposition film is also formed in the gap corresponding to the predetermined distance L1 between the needle 18 and the sample piece Q, so that both of the needle and the sample piece Q are connected with the deposition film.

When connecting the needle 18 with the sample piece Q, and when subsequently transferring the sample piece Q connected with the needle 18 to the sample piece holder P, the computer 22 causes the needle 18 to have a posture corresponding to an approach mode previously selected in Step S010. The computer 22 causes the needle 18 and the sample piece Q to take a relative posture, in accordance with each of a plurality of (for example, three) different approach modes to be described later.

Further, the computer 22 may determine the connection state between the needle and the sample piece via the deposition film by detecting the change in the absorption current of the needle 18. The computer 22 may determine that the sample piece Q and the needle 18 are connected by the deposition film when the absorption current of the needle 18 reaches a predetermined current value and stop the formation of the deposition film regardless of whether or not a predetermined deposition time has elapsed.

Next, the computer 22 performs a process of cutting the support portion Qa between the sample piece Q and the sample S (Step S130). The computer 22 designates the cutting processing position T1 within the support portion Qa which is set in advance by using the reference mark Ref formed in the sample S.

Figure 15:
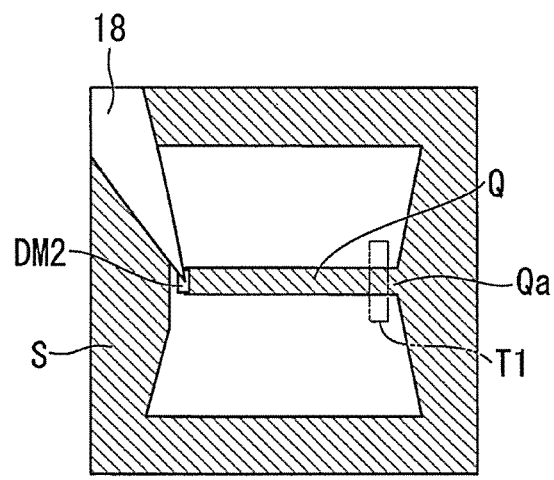
FIG. 15 is a diagram illustrating a sample and a cutting processing position T1 on a sample piece support portion within an image obtained by using a focused ion beam of a charged particle beam apparatus according to an embodiment of the present invention.

The computer 22 separates the sample piece Q from the sample S by irradiating the cutting processing position T1 with a focused ion beam for a predetermined cutting processing time. FIG. 15 illustrates this state. FIG. 15 is a diagram illustrating the sample S and the cutting processing position T1 on the support portion Qa of the sample piece Q, in the image data obtained by using a focused ion beam of the charged particle beam apparatus 10 according to the embodiment of the present invention.

The computer 22 determines whether or not the sample piece Q is separated from the sample S by detecting electrical conduction between the sample S and the needle 18 (Step S133).

The computer 22 determines that the sample piece Q has been separated from the sample S (OK) when the electrical conduction between the sample S and the needle 18 is not detected, and then executes the remaining processes (namely, S140 and the subsequent processes). On the other hand, after the process of cutting the support portion Qa between the sample piece Q and the sample S specifically at the cutting processing position T1 is completed, when the electrical conduction between the needle 18 and the sample S is detected, the computer 22 determines that the sample piece Q is not completely separated from the sample S (NG). When it is determined that the sample piece Q is not separated from the sample S (NG), the computer 22 informs the operator of such a state by displaying information to the effect that the separation of the sample piece Q and the sample S is not completed on the display device 21 or making a warning sound (Step S136). Then, the subsequent processing is not performed. In this case, the computer 22 performs control to cut a deposition film (a deposition film DM2 described later) that connects the sample piece Q and the needle 18 by irradiating the depositing film with a focused ion beam, to separate the sample piece Q and the needle 18 from each other, and to return the needle 18 to the default position (Step S060). The needle 18 returned to the default position performs sampling of the next sample piece Q.

Figure 16:
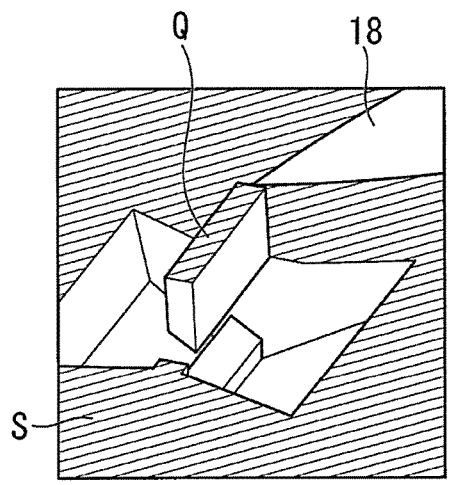
FIG. 16 is a diagram illustrating a state in which a needle connected with a sample piece is in retreat, within an image obtained by using an electron beam of a charged particle beam apparatus according to an embodiment of the present invention.

Next, the computer 22 performs a needle retreating process (Step S140). The computer 22 causes the needle driving mechanism 19 to raise the needle 18 vertically upward (that is, a positive Z direction) by a predetermined distance (for example, 5 µm or the like). FIG. 16 illustrates this state. That is, FIG. 16 is a diagram illustrating a state where the needle 18 with the sample piece Q connected thereto is moved away from the stage, in the image data obtained by using an electron beam of the charged particle beam apparatus 10 according to the embodiment of the present invention.

Figure 17:
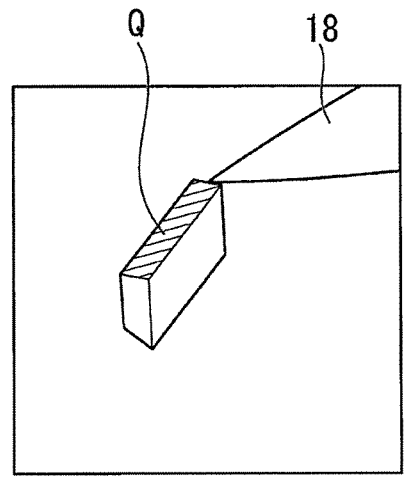
FIG. 17 is a diagram illustrating a state in which a stage is in retreat from a needle connected with a sample piece, within an image obtained by using an electron beam of a charged particle beam apparatus according to an embodiment of the present invention.

Next, the computer 22 performs a stage retreating process (Step S150). The computer 22 causes the stage driving mechanism 13 to move the stage 12 by a predetermined distance as illustrated in FIG. 17. For example, the stage 12 is lowered in the vertical direction (namely, a negative Z direction) by 1 mm, 3 mm, or 5 mm. The computer 22 causes the nozzle 17a of the gas supply unit 17 to move away from the stage 12 after the stage 12 is lowered by a predetermined distance. For example, the nozzle 17a of the gas supply unit 17 is raised to a standby position which is vertically above the previous position. FIG. 17 illustrates this state. That is, FIG. 17 is a diagram illustrating a state in which the stage 12 is moved away from the needle 18 to which the sample piece Q is connected, in the image data obtained by using an electron beam of the charged particle beam apparatus 10 according to the embodiment of the present invention.

Next, the computer 22 performs a posture control process on the sample piece Q (Step S153). The computer 22 can cause the needle driving mechanism 19 to rotate the needle 18 on its own axis, thereby controlling the posture of the sample piece Q. The computer 22 rotates the sample piece Q connected to the needle 18 around the axis of the needle 18 and changes the posture of the sample piece Q vertically or horizontally relative to the sample piece holder P. For example, the computer 22 sets the posture of the sample piece Q such that the surface of the sample piece Q, namely, the surface of the sample S, is perpendicular or parallel to the end face of the columnar portion 34. Thereby, the computer 22 can secure the posture of the sample piece Q suitable for later shaping and finishing and reduce the influence of the curtain effect which occurs during the finish processing of the sample piece Q. The curtain effect refers to the form of a stripe pattern extending in a direction in which a focused ion beam is scanned. When the finished sample piece Q is observed with an electron microscope, the curtain effect will result in an erroneous analysis. Therefore, by ensuring the proper posture of the sample piece Q, the reliability of observation can be improved. The computer 22 performs eccentricity correction when axially rotating the needle 18, thereby correcting the rotation so that the sample piece Q is not out of the actual field of view.

In the posture control mode, first, the computer 22 causes the needle driving mechanism 19 to drive the needle 18, thereby axially rotating the needle 18 by a rotation angle corresponding to an approach mode so that the posture of the sample piece Q reaches a predetermined posture corresponding to the approach mode. Here, the posture control mode corresponding to the approach mode refers to a mode in which the posture of the sample piece Q is controlled to reach a predetermined posture corresponding to the approach mode with respect to the sample holder P. In this posture control mode, in the sample piece pickup process, the computer 22 controls the posture of the sample piece Q in a manner that the needle 18 approaches the sample piece Q at a predetermined angle and then the needle 18 to which the sample piece Q is connected is axially rotated. The approach mode is a mode in which the sample piece Q controlled to have a predetermined posture through the execution of the posture control mode approaches the sample piece holder P. The computer 22 performs eccentricity correction when the needle 18 is axially rotated. FIGS. 18 to 23 illustrate this state and are diagrams illustrating the states of the needle 18 to which the sample piece Q is connected, in each of a plurality of (for example, three) different approach modes.

Figure 18:
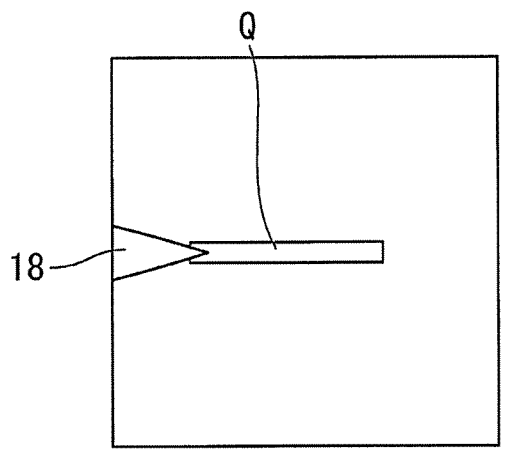
FIG. 18 is a diagram illustrating a state of a needle connected with a sample piece in a 0° rotation angle approach mode, within image data obtained by using a focused ion beam of a charged particle beam apparatus according to an embodiment of the present invention.
Figure 19:
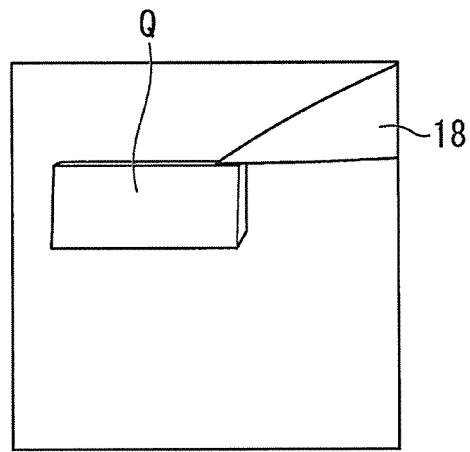
FIG. 19 is a diagram illustrating a state of a needle connected with a sample piece in the 0° rotation angle approach mode, within an image obtained by using an electron beam of a charged particle beam apparatus according to an embodiment of the present invention.

FIGS. 18 and 19 are diagrams illustrating the states of the needle 18 in 0° rotation angle approach mode. FIG. 18 is a diagram illustrating a state of the needle 18 to which the sample piece Q is connected within the image data obtained by using charged particle beams of the charged particle beam apparatus 10 of the embodiment of the present invention. FIG. 19 is a diagram illustrating a state of the needle 18 to which the sample piece Q is connected within the image data obtained by using an electron beams In the 0° rotation angle approach mode of the needle 18, the computer 22 sets a suitable needle posture for transferring the sample piece Q to the sample piece holder P in a state in which the needle 18 is not rotated.

Figure 20:
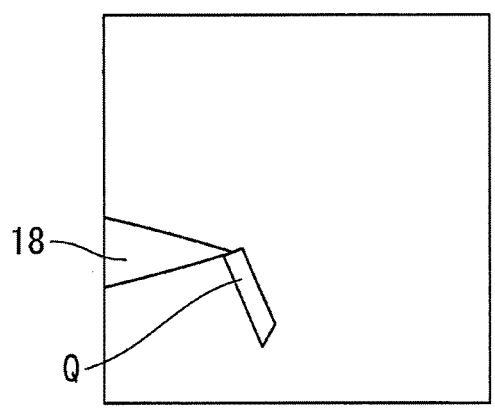
FIG. 20 is a diagram illustrating a state of a needle connected with a sample piece in a 90° rotation angle approach mode, within an image obtained by using a focused ion beam of a charged particle beam apparatus according to an embodiment of the present invention.
Figure 21:
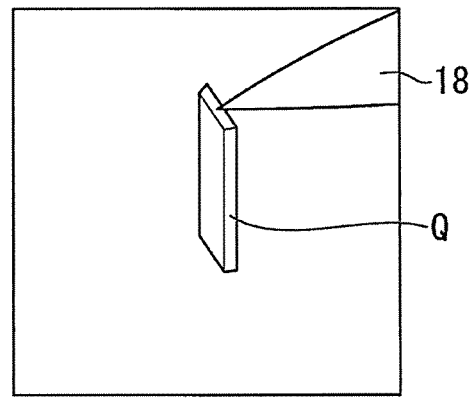
FIG. 21 is a diagram illustrating a state of a needle connected with a sample piece in the 90° rotation angle approach mode, within an image obtained by using an electron beam of a charged particle beam apparatus according to an embodiment of the present invention.

FIGS. 20 and 21 are diagrams illustrating the states of the needle 18 in 90° rotation angle approach mode within the image data. FIG. 20 is a diagram illustrating a state in which the needle 18 with the sample piece Q connected thereto is rotated by an angle of 90° in the image data obtained by using a focused ion beam and FIG. 20 is a diagram illustrating a state in which the needle 18 with the sample piece Q connected thereto is rotated by an angle of 90° in the image data obtained by using an electron beam. In the 90° rotation angle approach mode of the needle 18, the computer 22 sets a suitable needle posture for transferring the sample piece Q to the sample piece holder P in a state in which the needle is rotated by an angle of 90°.

Figure 22:
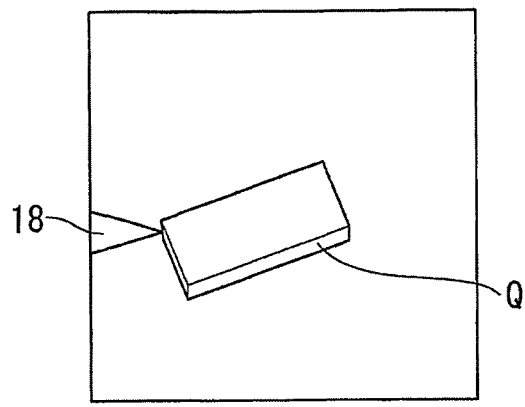
FIG. 22 is a diagram illustrating a state of a needle connected with a sample piece in a 180° rotation angle approach mode, within an image obtained by using a focused ion beam of a charged particle beam apparatus according to an embodiment of the present invention.
Figure 23:
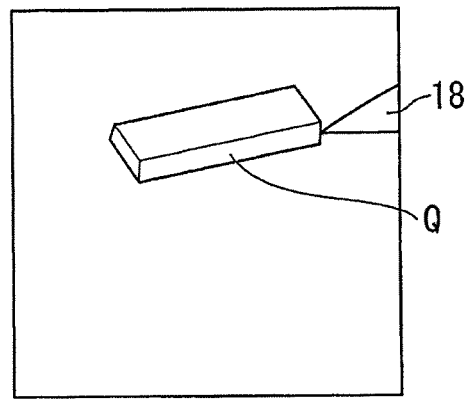
FIG. 23 is a diagram illustrating a state of a needle connected with a sample piece in the 180° rotation angle approach mode, within an image obtained by using an electron beam of a charged particle beam apparatus according to an embodiment of the present invention.

FIGS. 22 and 23 are diagrams illustrating the states of the needle 18 in 180° rotation angle approach mode within the image data. FIG. 22 is a diagram illustrating a state in which the needle 18 with the sample piece Q connected thereto is rotated by an angle of 180° in the image data obtained by using a focused ion beam and FIG. 23 is a diagram illustrating a state in which the needle 18 with the sample piece Q connected thereto is rotated by an angle of 180 in the image data obtained by using an electron beam. In the 180° rotation angle approach mode of the needle 18, the computer 22 sets a suitable needle posture for transferring of the sample piece Q to the sample piece holder P in a state in which the needle 18 is rotated by an angle of 180°.

Regarding the relative posture for connection of the needle 18 and the sample piece Q, in the previously described sample piece pickup process, when the needle 18 approaches the sample piece Q at a predetermined angle and is then connected with the sample piece Q, a suitable connection posture is set for each of the posture control modes.

Next, the computer 22 performs shaping processing on the sample piece Q (Step S155). In this shaping processing, first, the computer 22 performs a scan rotation operation of rotating the scanning direction of the focused ion beam as necessary. The computer 22 rotates the scanning direction by a rotation angle at which the predetermined direction of the sample piece Q and the scanning direction of the focused ion beam become parallel, thereby rotating a scanning region with respect to the center of an observation field of view of a focused ion beam. The computer 22 makes a predetermined direction of the sample piece Q parallel to the scanning direction of the focused ion beam to prepare for extraction of the edges of the sample piece Q in the predetermined direction in a subsequent process, thereby improving the accuracy of edge extraction from the sample piece Q in the image data.

Figure 24:
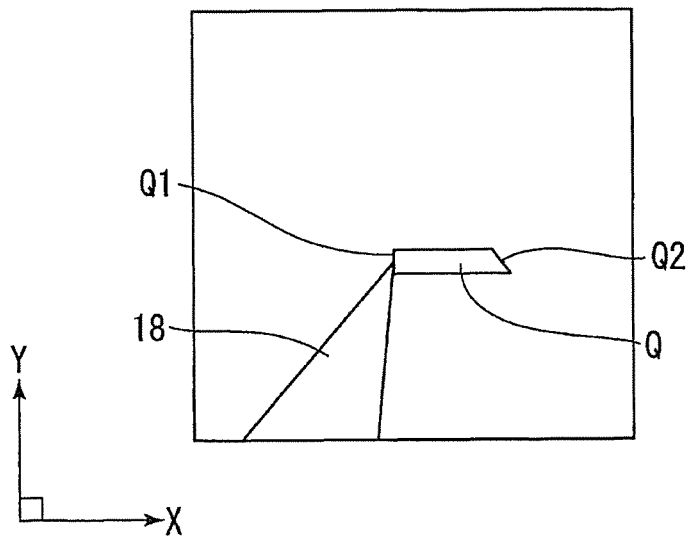
FIG. 24 is a diagram illustrating a state of a needle connected with a sample piece, in image data obtained by scan rotation in which a scanning direction of a focused ion beam is rotated by −68°, in the 90° rotation angle approach mode of the needle of a charged particle beam apparatus according to an embodiment of the present invention.

In the present embodiment, for example, the bottom portion Q2 of the sample piece Q, which is opposite to the surface to which the needle 18 is connected, in the thickness direction of the sample piece Q, is attached to the columnar portion of the sample piece holder P in a subsequent process, the computer 22 extracts the edges of the bottom portion Q2 of the sample piece Q. The thickness direction of the sample piece Q corresponds to the depth direction of the original sample S at the time of processing the original sample S. In this case, by performing the scan rotation, the computer 22 rotates the scanning direction of the focused ion beam such that the thickness direction (namely, the depth direction at the time of processing the original sample S) of the sample piece Q in the image data obtained by using the focused ion beam becomes parallel to the scanning direction of the focused ion beam. Thereby, the computer 22 improves the accuracy of edge extraction (to be described later) from the bottom portion Q2 of the sample piece Q and the accuracy of setting the shaping processing frame on the bottom portion Q2 of the sample piece Q. For example, FIG. 24 is a diagram illustrating the state of the needle 18 with the sample piece Q connected thereto, in the image data obtained through the scan rotation in which the scanning direction of the focused ion beam is rotated by −68° in the 90° rotation angle approach mode of the needle 18. In FIG. 24, the thickness direction of the sample piece Q (that is, the depth direction at the time of processing the original sample S) is parallel to the X-axis direction of the image data, and edges can be easily extracted from the bottom portion Q2 of the sample piece Q in this state.

Figure 25:
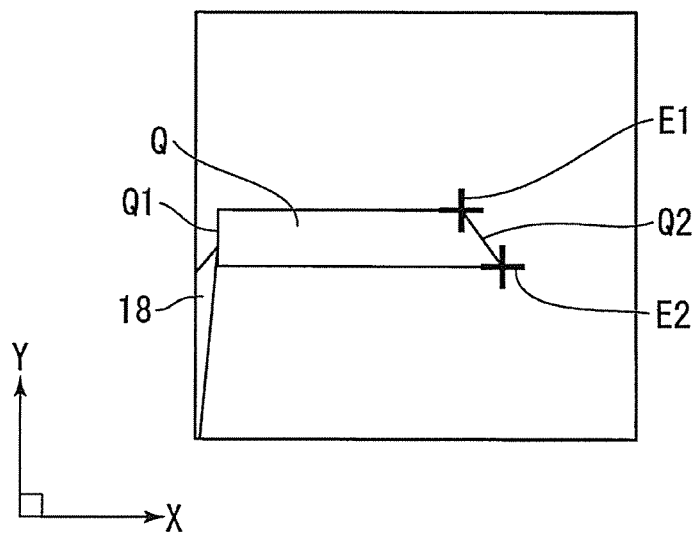
FIG. 25 is a diagram illustrating an example of two edges of a bottom portion of a sample piece in a thickness direction, which are observed on the basis of image data of FIG. 24.

Next, the computer 22 extracts the edges of the sample piece Q in the predetermined direction, within the image data obtained after performing scan rotation as necessary or the image data obtained by using a focused ion beam without performing scan rotation. For example, FIG. 25 is a diagram illustrating an example of two edges E1 and E2 extracted at the bottom portion Q2 of the sample piece Q in the thickness direction, on the basis of the image data of FIG. 24.

Figure 26:
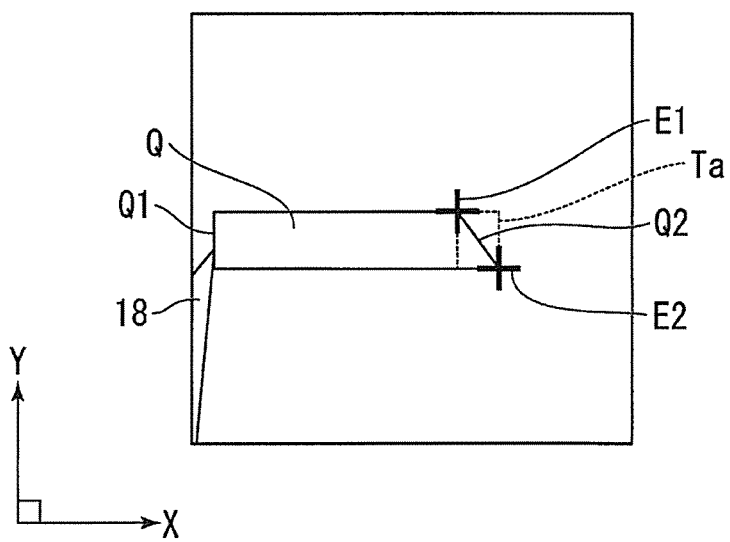
FIG. 26 is a diagram illustrating an example of a processing frame which is set to include the bottom portion of the sample piece, with reference to the two edges included in the image data of FIG. 25.

Next, on the basis of the edge extracted in the predetermined direction of the sample piece Q in the image data, the computer 22 sets a processing frame Ta for defining the shaping processing region in the sample piece Q. It is preferable that the sample piece Q that has undergone shaping on the basis of this processing frame Ta is shaped such that the end face of the sample piece Q which to come into contact with the columnar portion 34 is substantially parallel to the connection surface of the columnar portion 34. For example, the computer 22 sets a processing frame Ta to form a parallel end face of the sample piece Q with respect to the connection surface (for example, an end face such as a side surface) of the columnar portion 34 of the sample piece holder P by the shaping of the sample piece Q. FIG. 26 is a diagram illustrating an example of the processing frame Ta which is set to include the bottom portion Q2 of the sample piece Q with reference to the two edges E1 and E2 in the image data of FIG. 25.

Figure 27:
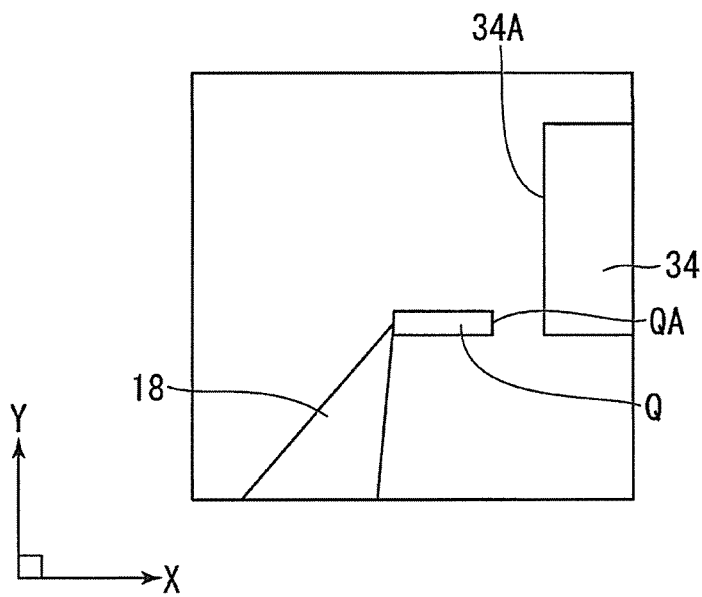
FIG. 27 is a diagram illustrating an example of a sample piece having a cross section parallel to a contact surface (for example, a side surface or the like) of a columnar portion of a sample piece holder, the cross section being obtained by focused ion beam shaping performed by a charged particle beam apparatus according to an embodiment of the present invention.

Next, the computer 22 performs the shaping of the sample piece Q by irradiating the processing frame Ta set based on the image data with a focused ion beam. For example, the computer 22 etches the sample piece Q, specifically at a position within the processing frame Ta including the bottom portion Q2 of the sample piece Q, thereby forming a parallel end face of the sample piece Q with respect to the connection surface of the columnar portion 34 of the sample piece holder P. For example, FIG. 27 is a diagram illustrating an example of a sample piece Q having a parallel end face QA to the connection surface (for example, a side surface) 34A of the columnar portion 34 of the sample piece holder P, in which the parallel end face QA is formed through the shaping process using the focused ion beam.

Figure 28:
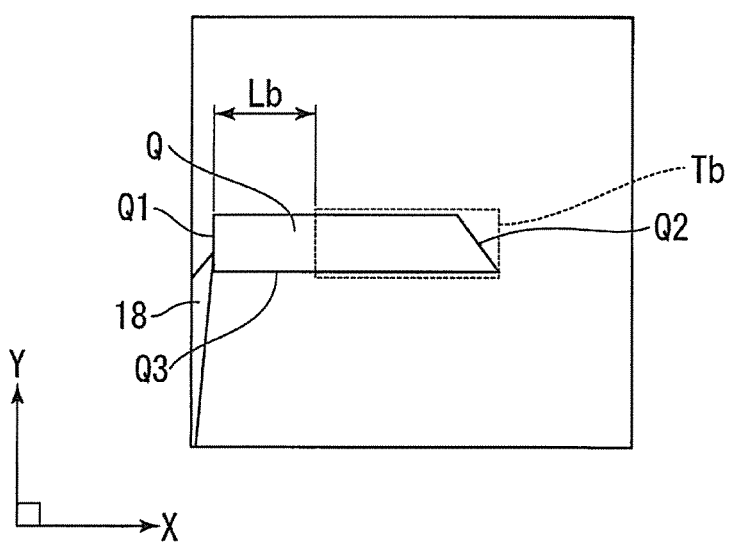
FIG. 28 is a diagram illustrating an example of a processing frame within a sample piece, which is set with reference to a user-setting distance from a surface of a sample piece, within image data.

The computer 22 shapes the sample piece Q through the shaping process in accordance with operator instructions when instructions regarding setting of the processing frame, for example, the size of the shaped sample piece Q and the shaping processing position on the sample piece Q, are input by the operator. For example, the computer 22 receives the input of a distance Lb from the surface of the sample piece Q, which serves as a reference for setting the processing position of the shaping process on the sample piece Q. The computer 22 sets the processing frame Tb to a position having a distance of Lb from the surface (namely, the surface Q1 to which the needle 18 is connected) of the sample piece Q in the predetermined direction of the sample piece Q (for example, the thickness direction corresponding to the depth direction at the time of processing the original sample S, etc.). For example, FIG. 28 is a diagram illustrating an example of the processing frame Tb set within the sample piece Q with reference to the distance Lb from the surface Q1 of the sample piece Q, in accordance with operator instructions, in the image data illustrated in FIG. 24. The processing frame Tb illustrated in FIG. 28 includes a portion deeper than the position having a distance Lb from the surface Q1 of the sample piece Q toward the bottom portion Q2 in the thickness direction. The instruction of the distance Lb is input by the user in a case where it is preliminarily known that an observation target is included within the surface (observation surface) Q3 of the sample piece Q in an observation direction (Y-axis direction in FIG. 28) and in a case where an appropriate portion of the sample piece Q in the thickness direction (X-axis direction in FIG. 28) is unnecessary.

Figure 29:
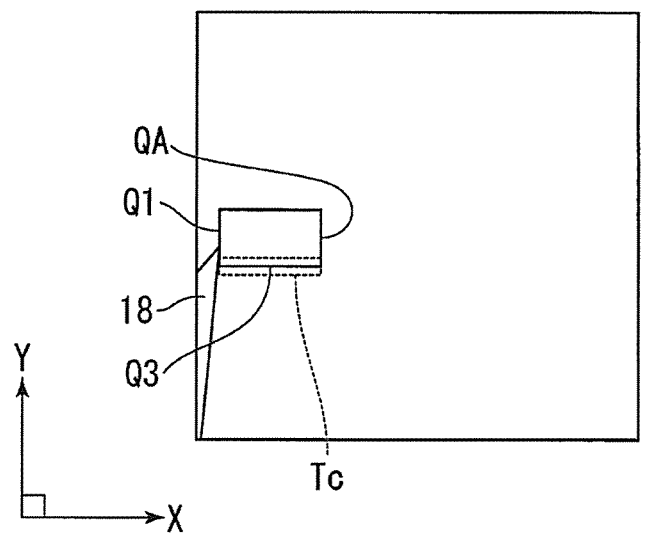
FIG. 29 is a diagram illustrating an example of a sample piece having a cross section parallel to a contact surface (for example, a side surface or the like) of a columnar portion of a sample piece holder, which is observed after performing a shaping process of removing a bottom portion of a sample by irradiating the processing frame illustrated in FIG. 28 with a focused ion beam.

FIG. 29 is a diagram illustrating an example of the sample piece Q having a parallel end face QA with respect to the connection surface (for example, a side surface) 34A of the columnar portion 34 of the sample piece holder P, after performing a shaping process of removing the bottom portion Q2 of the sample piece Q by irradiating the processing frame Tb illustrated in FIG. 28 with a focused ion beam. Thereby, the computer 22 facilitates the edge extraction from the template which will be described later, and secures the shape of the sample piece Q suitable for finishing processing to be performed later.

After the execution of the shaping processing, the computer 22 may perform a cleaning process to eliminate a redeposition phenomenon in which sputtered particles generated during the shaping processing attach to the observation surface Q3 of the sample piece Q. The computer 22 sets a cleaning processing frame Tc including the observation surface Q3 as illustrated in FIG. 29, for example, and performs the cleaning processing by irradiating the cleaning processing frame Tc with a focused ion beam.

Figure 30:
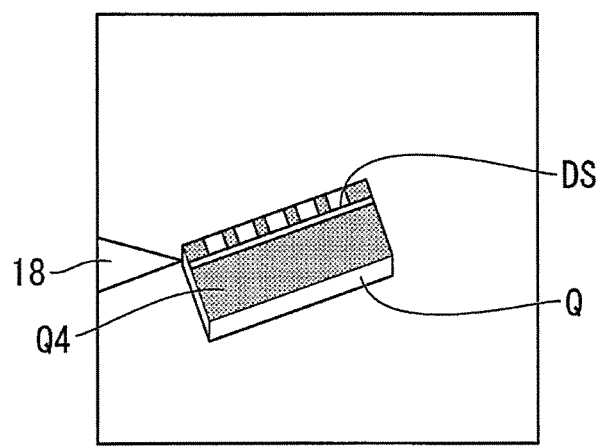
FIG. 30 is a diagram illustrating a state in which a needle connected with a sample piece is rotated by 180° in the 180° rotation angle approach mode in a charged particle beam apparatus according to one embodiment of the present invention, the state being observed on the basis of image data obtained by using a focused ion beam.

The computer 22 can set the processing frame Ta in the shaping processing process, on the basis of the pattern of a device structure or the like within the sample piece Q, which is observed from an observation image of the sample piece Q obtained by irradiation of a charged particle beam. For example, FIG. 30 is a diagram illustrating a state in which the needle 18 to which the sample piece Q is connected is rotated by an angle of 180° in 180° rotation angle approach mode in the image data obtained by irradiation of a focused ion beam. The sample piece Q illustrated in FIG. 30 has a surface (for example, a cross section Q4 obtained by processing the original sample S) within which a device structure DS is revealed.

Figure 31:
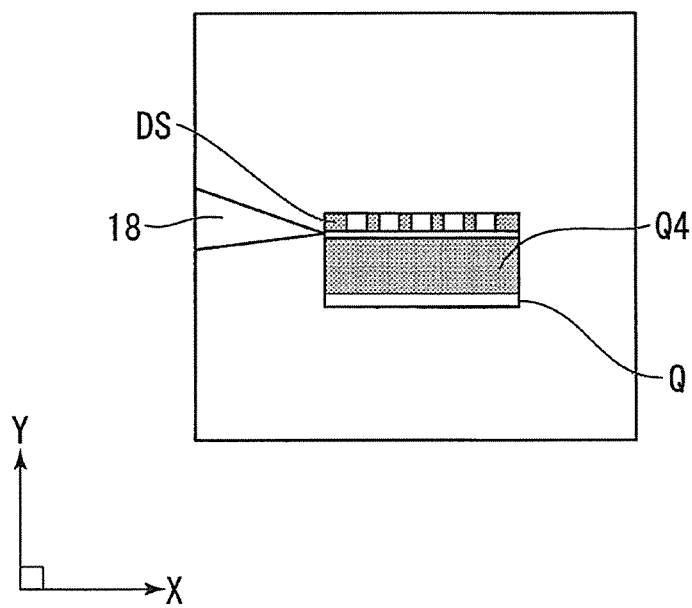
FIG. 31 is a diagram illustrating a state of a needle connected with a sample piece, in image data obtained by scan rotation in which scanning is performed with a focused ion beam rotated by 22° in the 180° rotation angle approach mode, in a charged particle beam apparatus according to an embodiment of the present invention.
Figure 32:
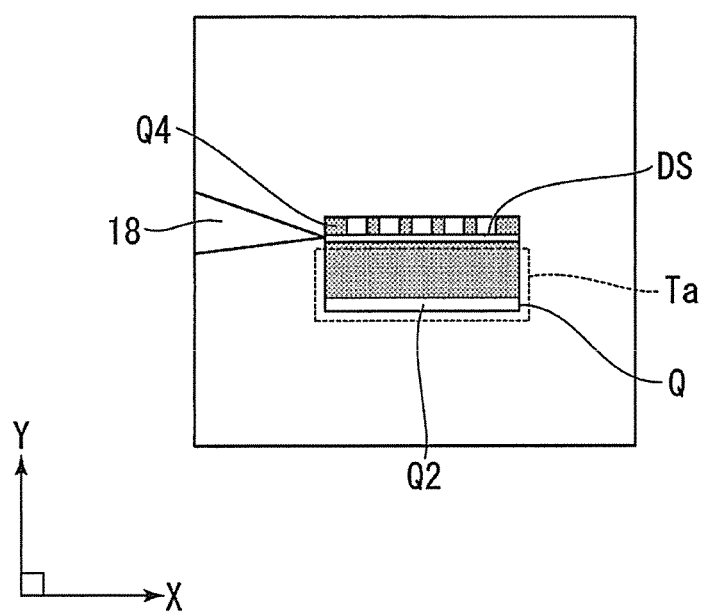
FIG. 32 is a diagram illustrating an example of a processing frame which is set to remove a redundant portion, with no device structure therein, of a sample piece, in which the processing frame is set on the basis of the image data of FIG. 31.

The computer 22 first performs scan rotation to rotate the scanning direction of the focused ion beam in the shaping processing process. For example, FIG. 31 is a diagram illustrating the state of the needle 18 with the sample piece Q connected thereto, in the image data obtained through the scan rotation in which the scanning direction of the focused ion beam is rotated by +22° in the 180° rotation angle approach mode of the needle 18. Next, on the basis of the image data illustrated in FIG. 31, the computer 22 recognizes the device structure DS on the cross section D4 of the sample piece Q by performing pattern matching with a preliminarily known pattern. The computer 22 sets the processing frame Ta at a portion where the device structure DS does not exist so as not to interfere with the device structure DS when performing the processing. For example, FIG. 32 is a diagram illustrating an example of the processing frame Ta which is set to remove a region, having no device structure DS therein, of the sample piece Q, on the basis of the image data of FIG. 31. The processing frame Ta illustrated in FIG. 32 includes a bottom side portion Q2 in the thickness direction of the sample piece Q from the surface Q1 to which the needle 18 is connected. Next, the computer 22 etches the sample piece Q by irradiating a shaping processing region of the processing frame Ta which is set on the basis of the image data illustrated in FIG. 32 with a focused ion beam, thereby shaping the sample piece Q.

Figure 33:
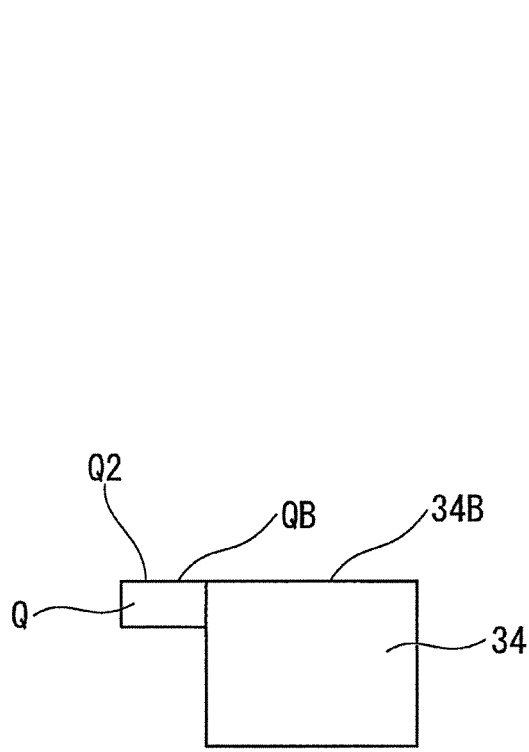
FIG. 33 is a diagram illustrating an example of a state in which a sample piece is fixed to a columnar portion of a sample piece holder in a charged particle beam apparatus according to an embodiment of the present invention.
Figure 34:
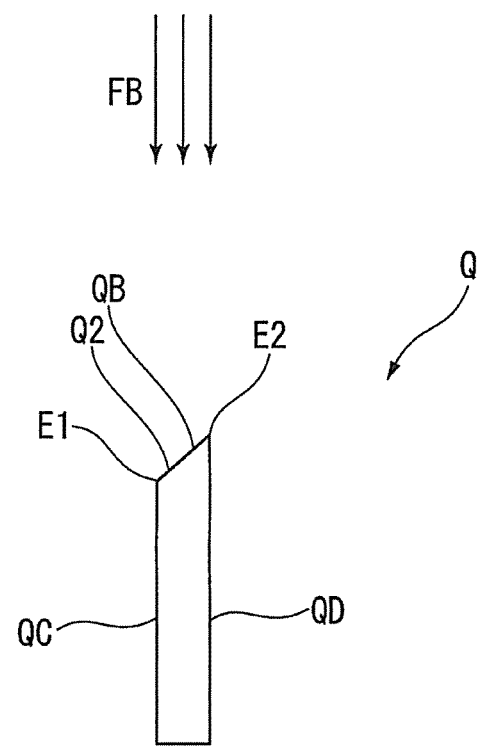
FIG. 34 is a diagram illustrating an example of a process of performing finish processing on a sample piece using a focused ion beam of a charged particle beam apparatus according to an embodiment of the present invention.

Since the shape of the bottom surface QB of the sample piece Q (the surface of the bottom portion Q2) is oblique with respect to the direction orthogonal to the thickness direction due to the process of extracting the sample piece Q from the original sample S, the computer 22 shapes the bottom surface QB to be flat (that is, perpendicular to the thickness direction) by performing the shaping processing. For example, FIG. 33 is a diagram illustrating an example of a state in which the sample piece Q is fixed to the columnar portion 34 such that the bottom surface of the sample piece Q is oriented in the same direction as the upper surface of the columnar portion 34. FIG. 34 is a diagram illustrating an example of a state in which a focused ion beam is used to perform finishing processing on the sample piece Q illustrated in FIG. 33. In FIGS. 33 and 34, the sample piece Q is fixed to the columnar portion 34 such that the bottom surface QB of the sample piece Q is oriented in the same direction as the upper end surface 34B of the columnar portion 34 (namely, the upper surface Q1 of the sample piece Q is disposed at the lower end side of the columnar portion 34 and the bottom surface QB of the sample piece Q is disposed at the upper end side of the columnar portion 34), and then the finishing processing is performed to convert the sample piece Q into a lamella using a focused ion beam. In this case, when the bottom surface QB, which is the incident surface of the focused ion beam FB, is not flat, an angle between the bottom surface QB and each end face (cross section formed from the original sample S through the cutting process) QC, QD is different between the front-side end face QC and the rear-side end face QD. Therefore, due to the edge effect caused by the two edges E1 and E2 of the bottom portion Q2, the processing speeds of the front side end face QC and the back side end face QD of the sample piece Q differ, so that there arises a problem that the front side and the back side of the sample piece Q cannot be processed at a uniform speed. This problem is solved by performing a shaping process of flattening the bottom surface QB of the sample piece Q so that the angles formed by the shaping are all 90° and thus the finish processing can be performed such that both sides of the sample piece Q are cut at a uniform speed.

In addition, by shaping the bottom portion Q2 of the sample piece Q, the image of the edges E1 and E2 becomes clear, and thus the image recognition becomes easy. Thereby, the position of the sample piece Q can be accurately recognized by template matching in the sample piece mounting step to be described later.

Figure 35:
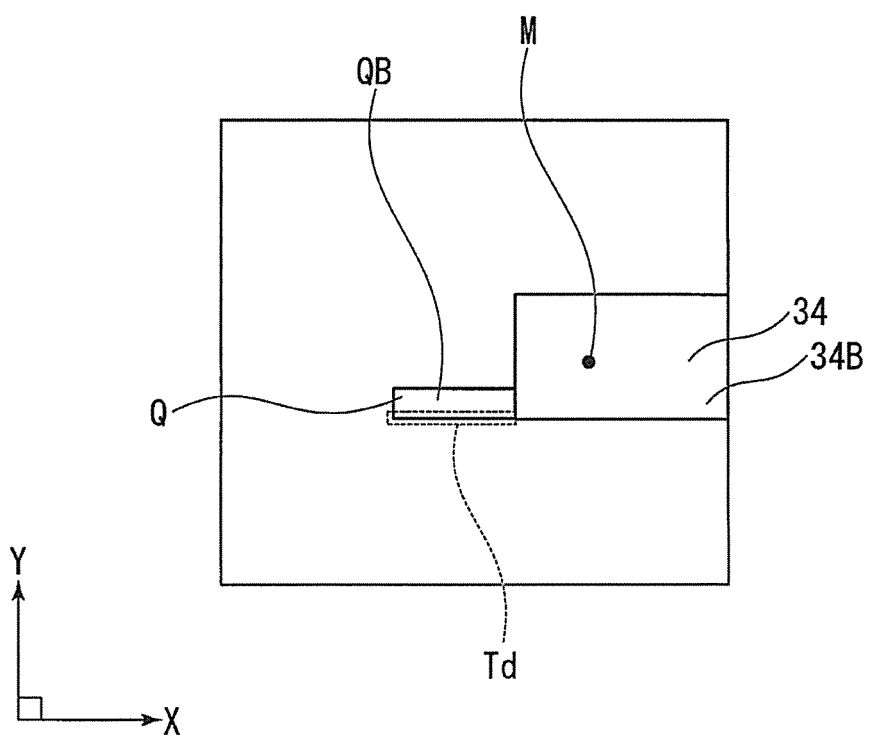
FIG. 35 is a diagram illustrating an example of a drift correction mark formed on a columnar portion of a sample piece holder and a processing frame of a sample piece, in an image obtained by using a focused ion beam of a charged particle beam apparatus according to an embodiment of the present invention.

By performing the shaping processing on the bottom portion Q2 of the sample Q, the computer 22 can fix the sample piece Q such that the bottom surface QB of the sample piece Q and the upper surface 34B of the columnar portion 34 are flush with each other. For example, FIG. 35 is a diagram illustrating an example of a drift correction mark M of the columnar portion 34 and a processing frame Td of the sample piece Q in an image obtained by irradiation of a focused ion beam. Thereby, in the case of performing finish processing after the fixing, the drift correction mark M is formed on the upper end surface 34B of the columnar portion 34, the processing frame Td is set within the bottom surface QB of the sample piece Q with reference to the drift correction mark M, and then the finish processing is performed. Since the drift correction mark M and the processing frame Td are within the same surface, the positional deviation can be reduced. Particularly when the sample piece Q is machined from the oblique direction by tilting the stage in the finish processing, when the upper end surface 34B of the columnar portion 34, on which the drift correction mark M is formed, and the bottom surface QB of the sample piece Q are formed to have a height difference (i.e., step), a positional deviation between the drift correction mark M and the processing frame Td occurs and thus there is a problem that processing cannot be performed at an accurate position. Regarding this problem, by fixing the sample piece Q such that the drift correction mark M and the processing frame Td are within the same surface, there is no step difference between the drift correction part M and the processing frame Td even through the stage tilts, and the deviation of the processing position can be reduced.

After the execution of the shaping processing, the computer 22 operates the stage driving mechanism 13 so that there is no structure in the background of the needle 18 and the sample piece Q connected to each other. Thus, when creating the template of the needle 18 and the sample piece Q in the subsequent process (Step S170), the edges (contours) of the needle 18 and the sample piece Q can be clearly recognized from the image data of the sample piece Q obtained by using a focused ion beam and the image data of the sample piece Q obtained by using an ion beam. The computer 22 moves the stage 12 by a predetermined distance. The background of the sample piece Q is checked (Step S160). When the background has no problem, the process proceeds to the next step S170. When there is a problem in the background, the stage 12 is moved again by a predetermined amount (Step S165), the process returns to the checking of the background (Step S160). This repeats until the problem disappears from the background.

The computer 22 executes the template creation of the needle 18 and the sample piece Q (Step S170). The computer 22 creates the templates of the needle 18 and the sample piece Q in a state, (namely, posture at the time of connecting the sample piece Q to the columnar portion 34 of the sample base), in which the needle 18 to which the sample piece Q is fixed is rotated as necessary. Thereby, the computer 22 can three-dimensionally detect the edges (contours) of the needle 18 and the sample piece Q from the image data obtained by irradiation of a focused ion beam and from the image data obtained by irradiation of an ion beam, in accordance with the rotation of the needle 18. In the 0° rotation angle approach mode of the needle 18, the computer 22 does not need to use an electron beam and can recognize the edges (contours) of the needle 18 and the sample piece Q from the image data obtained by irradiation of a focused ion beam.

When the computer 22 instructs the stage driving mechanism 13 or the needle driving mechanism 19 to move the stage 12 to a position where there is no structure within the background of the needle 18 and the sample piece Q, when the needle 18 has not yet reached the actually instructed position, the needle 18 is searched at a low magnification. When the needle 18 is not still found, the position coordinates of the needle 18 are initialized to move the needle 18 to the default position (initial setting position).

In this template creation step S170, first, the computer 22 acquires a template matching template (reference image data) of the sample piece Q and the tip shape of the needle 18 to which the sample piece Q is connected. The computer 22 emits each of the charged particle beams (each of the focused ion beam and the electron beam) to the needle 18 while scanning over an irradiation position. The computer 22 acquires each image data from a plurality of different directions of the secondary charged particles R (secondary electrons, etc.) emitted from the needle 18 due to the irradiation of the charged particle beam. The computer 22 acquires image data by focused ion beam irradiation and image data by electron beam irradiation. The computer 22 stores the both of the image data acquired from two different directions as templates (reference image data).

Since the computer 22 uses the image data of the sample piece Q that is actually processed by a focused ion beam and the needle 18 connected to the sample piece Q as the reference image data, it is possible to perform pattern matching with high accuracy, regardless of the shapes of the sample piece Q and the needle 18.

When acquiring each image data, the computer 22 uses image acquisition conditions such as an optimum magnification, luminance (brightness), contrast, and the like, which are stored in advance, to increase the recognition accuracy of the shapes of the sample piece Q and the needle 18 to which the sample piece Q is connected.

Next, the computer 22 performs a needle retreating process (Step S180). This is to prevent the needle from accidentally colliding with the stage during movement of the stage 12 in the subsequent process. The computer 22 causes the needle driving mechanism 19 to move the needle 18 by a predetermined distance. For example, the needle 18 is moved upward in the vertical direction (i.e., the positive Z direction). On the contrary, the needle 18 stays in place, and the stage 12 is moved by a predetermined distance. For example, the stage 12 may be lowered in the vertical direction (that is, the negative Z direction). The needle retreating direction is not limited to the above-described vertical direction. It may be a needle axis direction or a predetermined retreating direction. That is, any direction is possible as long as the needle can be moved to a position at which the sample piece Q does not come into contact with the internal structure inside the sample chamber or which is not exposed to a focused ion beam.

Figure 36:
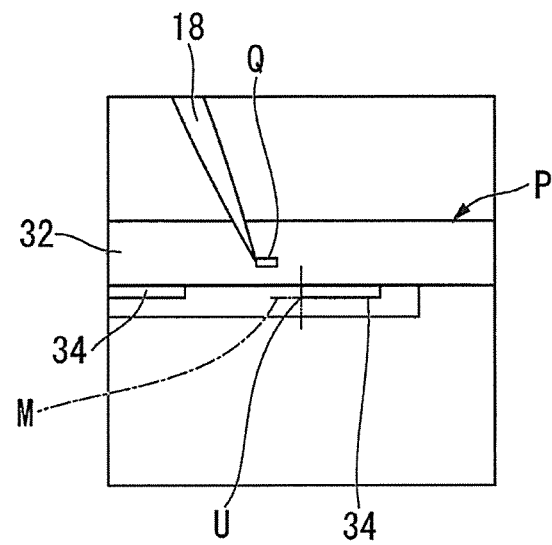
FIG. 36 is a diagram illustrating a sample piece mounting position on a columnar portion of a sample piece holder, in an image obtained by using a focused ion beam of a charged particle beam apparatus according to an embodiment of the present invention.
Figure 37:
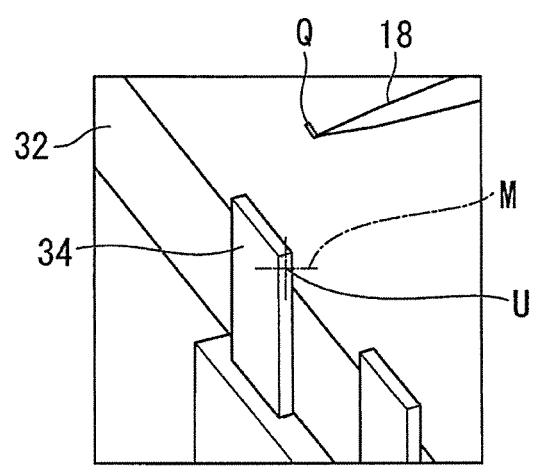
FIG. 37 is a diagram illustrating a sample piece mounting position on a columnar portion of a sample piece holder, in an image obtained by using an electron beam of a charged particle beam apparatus according to an embodiment of the present invention.

Next, the computer 22 causes the stage driving mechanism 13 to move the stage 12 such that an interest sample piece holder P registered in Step S202 falls within an observation field of view of a charged particle beam (Step S190). FIGS. 36 and 37 illustrate this state. Particularly, FIG. 36 is a schematic diagram of an image obtained by using a focused ion beam of the charged particle beam apparatus10 according to the embodiment of the present invention and illustrates a sample piece mounting position U on the columnar portion 34. FIG. 37 is a schematic diagram of an image obtained by using an electron beam and illustrates a sample piece mounting position U on the columnar portion 34.

Here, it is determined whether or not the interest columnar portion 34 of the sample piece holder P is within the observation field of view (Step S195), and the process proceeds to the next step S200 when the interest columnar portion 34 is within the observation field of view. When the interest columnar portion 34 does not appear within the observation field of view, that is, the stage does not properly operate in accordance with the designated coordinates, the stage coordinates designated immediately before are initialized so that the stage 12 is returned to the origin position (Step S197). Then, the coordinates of an interest columnar portion 34 which are pre-registered are designated, and the stage 12 is driven (Step S190). This process is repeated until the interest columnar portion 34 enters the observation field of view.

Next, the computer 22 causes the stage driving mechanism 13 to move the stage 12 to adjust a horizontal position of the sample piece holder P and causes the stage driving mechanism 13 to tilt and rotate the stage 12 by an angle corresponding to the posture control mode so that the sample piece holder P has a predetermined posture (Step S200).

The postures of the sample piece Q and the sample piece holder P are adjusted such that the top surface of the original sample S is parallel or perpendicular to the end face of the columnar portion 34 through Step S200. Particularly, assuming that the sample piece Q fixed to the columnar portion 34 undergoes slicing milling in which a focused ion beam is used, it is preferable that the postures of the sample piece Q and the sample piece holder P are adjusted such that the top surface of the original sample S is perpendicular to the incidence direction of the focused ion beam. Alternatively, the postures of the sample piece Q and the sample piece holder P are adjusted such that the top surface of the original sample S from which the sample piece Q is transferred to the columnar portion 34 is perpendicular to the columnar portion 34 and is disposed at the downstream side in the incidence direction of the focused ion beam.

Next, it is determined whether or not the shape of the columnar portion 34 of the sample piece holder P is normal or abnormal (Step S205). The image of the columnar portion 34 is registered in Step S023. However, the columnar portion 34 can be deformed, fractured, or chipped due to an accident such as an accidental collision in the subsequent processes. Therefore, it is determined whether or not the designated columnar portion 34 has a normal shape (Step S205). When it is determined in Step S205 that the shape of the columnar portion 34 is satisfactory, the process proceeds to the next step S210. On the contrary, when it is determined that the columnar portion 34 is defective, the process returns to Step S190 to move the stage such that the next columnar portion 34 enters the observation field of view Although the stage driving mechanism 13 is instructed to move the stage 12 such that the designated columnar portion 34 enters the observation field of view, when the designated columnar portion 34 does not appear in the observation field of view, the computer 22 initializes the position coordinates of the stage 12 and returns to the stage 12 to the default position.

Then, the computer 22 moves the nozzle 17a of the gas supply part 17 to a position close to a processing position (irradiation target position) to be irradiated with a focused ion beam. For example, the stage 12 is lowered from the standby position, which is vertically above the processing position, to the processing position.

<Sample Piece Mounting Process>

Here, the sample piece mounting process refers to a process of transferring the extracted sample piece Q to the sample piece holder P.

Figure 38:
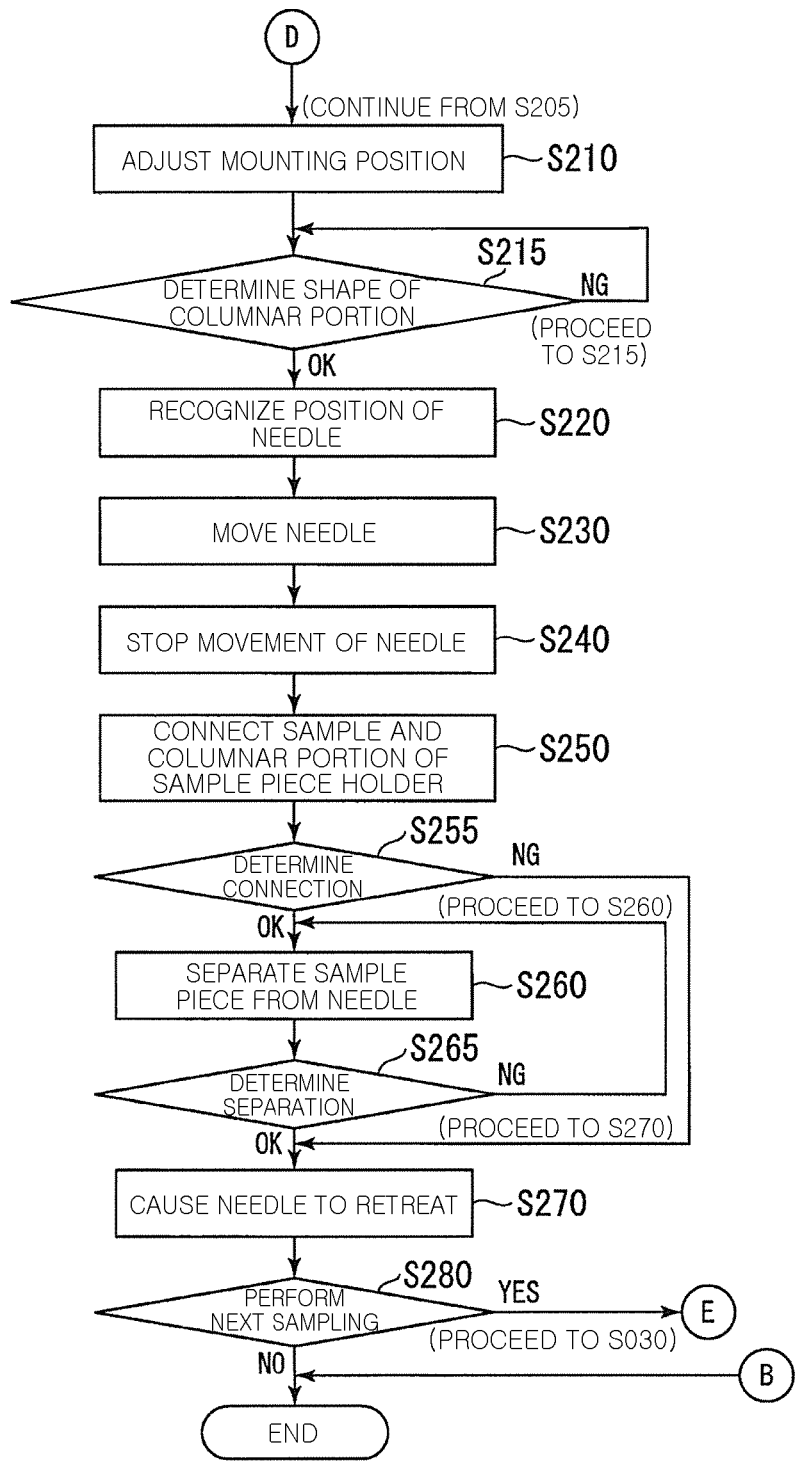
FIG. 38 is a flowchart of a sample piece mounting process, which is a part of a flowchart of an operation sequence of a charged particle beam apparatus according to an embodiment of the present invention.

FIG. 38 is a flowchart illustrating the flow of the sample piece mounting (transferring) process for transferring the sample piece Q to a specific columnar portion 34 of a specific sample piece holder P during the automatic sampling operation of the charged particle beam apparatus 10 according to the embodiment of the present invention.

The computer 22 uses the image data obtained by the focused ion beam irradiation and the image data obtained by the electron beam irradiation to recognize a sample piece transferring position stored in Step S020 (Step S210). The computer 22 executes template matching of the columnar portion 34. The computer 22 performs template matching to confirm that among the plurality of columnar portions 34 of the comb-like sample base 33, the columnar portion 34 appearing in the observation field of view is a predetermined columnar portion 34 which is previously specified. The computer 22 performs template matching between the template of each columnar portion 34 created in the columnar portion template creation process Step S020 and each of the image data obtained by the focused ion beam irradiation and the image data obtained by the electron beam irradiation.

The computer 22 determines whether there is a problem such as a missing portion in the columnar portion 34 in the template matching performed for each columnar portion 34 performed after the movement of the stage 12 (Step S215). When the shape of the designated columnar portion 34 appears to have a problem (NG), a columnar portion 34 which is next to the columnar portion having a problem, is designated as an onlumnar portion on which the the sample piece Q is scheduled to placed, and the newly designated columnar portion 34 is also subjected to template matching to determine whether or not this columnar portion 34 is defective. When the shape of the columnar portion 34 is not defective, the process proceeds to the next step S220.

The computer 22 extracts the edge (contour) from image data of a predetermined region (region including at least the columnar portion 34), and uses this edge pattern as a template. When the edge (contour) cannot be extracted from the image data of the predetermined region (region including at least the columnar portion 34), the computer 22 acquires the image data again. The extracted edge will be displayed on the display device 21 and this will be compared with a focused ion beam image or an electron beam image within an observation field of view for template matching.

The computer 22 operates the stage driving mechanism 13 to drive the stage 12 such that the mounting position recognized by the irradiation of the electron beam matches the mounting position recognized by the irradiation of the focused ion beam. The computer 22 operates the stage driving mechanism 13 to drive the stage 12 so that the mounting position U of the sample piece Q coincides with the view center (processing position) of the field of view.

Next, the computer 22 executes the subsequent steps S220 to S250 as a process of bringing the sample piece Q connected to the needle 18 into contact with the sample piece holder P.

First, the computer 22 recognizes the position of the needle 18 (Step S220). An electron beam is scanned over the needle 18 and the absorption current flowing into the needle 18 is detected. At this time, the computer 22 generates absorption current image data from the detected absorption current. The computer 22 acquires each of absorption current image data through the focused ion beam irradiation and the electron beam irradiation. The computer 22 detects the position of the tip of the needle 18 in the three-dimensional space by using two pieces of the absorption current image data obtained from two different directions.

The computer 22 causes the stage driving mechanism 13 to drive the stage 12 by using the detected position of the tip of the needle 18 such that the tip of the needle 18 can be positioned at a center position (view center) of a predetermined field of view.

Next, the computer 22 executes a sample piece mounting process. First, the computer 22 performs template matching so as to accurately recognize the position of the sample piece Q connected to the needle 18. The computer 22 performs template matching with each of the focused ion beam image data and the electron beam image data by using the templates of the needle 18 and the sample piece Q connected to each other, which are created in advance in the template creation step (Step S170) of the needle 18 and the sample piece Q.

When extracting an edge (contour) from a predetermined region of the image data (region including at least the needle 18 and the sample piece Q) in the template matching, the computer 22 displays the extracted edge on the display device 21. When the edge (contour) cannot be extracted from the predetermined region of the image data (the region including at least the needle 18 and the sample piece Q) in the template matching, the computer 22 acquires image data again.

Using each of the image data obtained by irradiation of a focused ion beam and the image data obtained by irradiation of an electron beam, the computer 22 performs template matching with the template of the needle 18 and the sample piece Q connected to each other and with the template of the columnar portion 34 which is a mounting target of the sample piece Q, thereby measuring the distance between the sample piece Q and the columnar portion 34.

The computer 22 then transfers the sample piece Q to the mounting target columnar portion 34 only through the horizontal movement of the sample piece Q within the plane parallel to the stage 12.

In this sample piece mounting process, the computer 22 first performs a needle moving process of causing the needle driving mechanism 19 to move the needle 18 (Step S230). Using each of the image data obtained by irradiation of a focused ion beam and the image data obtained by irradiation of an electron beam, the computer 22 performs template matching with the template of the needle 18 and the sample piece Q and with the template of the columnar portion 34, thereby measuring the distance between the sample piece Q and the columnar portion 34. The computer 22 moves the needle 18 in a three-dimensional space toward the sample piece mounting position in accordance with the measured distance.

Next, the computer 22 causes the needle 18 to stop moving with a predetermined gap L2 between the sample piece Q and the columnar portion 34 (Step S240). The computer 22 sets this gap L2 to a size of 1 μm or less, and preferably to a range of from 100 nm to 500 nm.

Although the gap L2 has a size of 500 nm or more, the connection between the sample piece and the columnar portion is possible. However, the time taken by formation of a deposition film for connection between the sample piece Q and the columnar portion 34 is likely to exceed a predetermined time. Therefore, the gap having a size of 1 μm or more is not preferable. As the gap L2 is decreased, the time taken by formation of a deposition film for connection between the columnar portion 34 and the sample piece Q is also decreased. However, in this case, it should be ensured that the sample piece Q does not come into direct contact with the columnar portion 34.

The computer 22 can provide this gap L2 between the columnar portion 34 and the needle 18 by detecting the absorption current image of the columnar portion 34 and the needle 18.

The computer 22 checks whether the sample piece Q is separated from the needle 18 after transferring the sample piece Q to the columnar portion 34 by detecting the electrical conduction between the columnar portion 34 and the needle 18 or by detecting the absorption current image of the columnar portion 34 and the needle 18.

When the electrical conduction between the columnar portion 34 and the needle 18 cannot be detected, the computer 22 switches the process to detect the absorption current image of the columnar portion 34 and the needle 18.

When the electrical conduction between the columnar portion 34 and the needle 18 cannot be detected, the computer 22 stops the transfer of the sample piece Q, separates the sample piece Q from the needle 18, and performs a needle trimming process described below.

Figure 39:
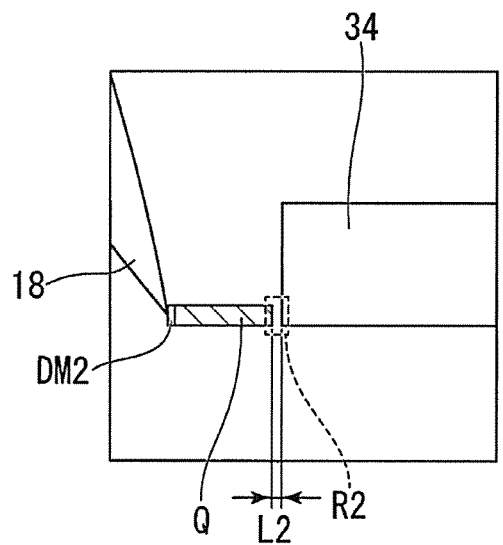
FIG. 39 is a diagram illustrating a needle staying in the vicinity of a sample piece mounting position on a sample base, in an image obtained by using a focused ion beam of a charged particle beam apparatus according to an embodiment of the present invention.
Figure 40:
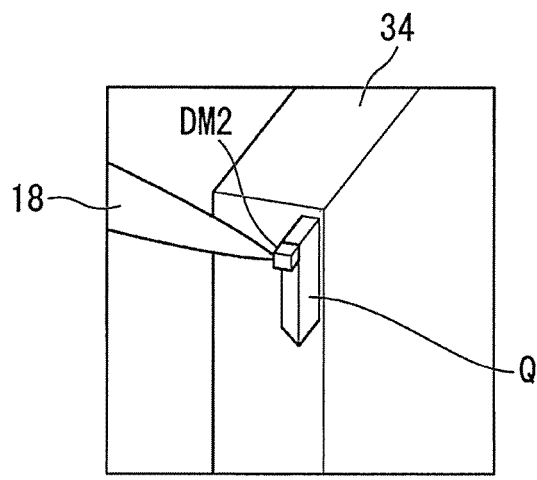
FIG. 40 is a diagram illustrating a needle staying in the vicinity of a sample piece mounting position on a sample base, in an image obtained by using an electron beam of a charged particle beam apparatus according to an embodiment of the present invention.

Next, the computer 22 performs a process of connecting the sample piece Q connected to the needle 18 to the columnar portion 34 (Step S250). FIGS. 39 and 40 are schematic diagrams of images having observation magnifications increased more than the images of FIGS. 36 and 37, respectively. The computer 22 causes the needle driving mechanism 19 to move the needle 18 such that one side of the sample piece Q is aligned with one side of the columnar portion 34 as illustrated in FIG. 39 and the upper end surface of the sample piece Q and the upper end surface of the columnar portion 34 are within the same surface and stops the operation of the needle driving mechanism 19 when the gap L2 has a predetermined value. The computer 22 sets a deposition film processing region R2 to include an end portion of the columnar portion 34 within the focused ion beam image of FIG. 39 in a state in which the sample piece Q is positioned a distance corresponding to the gap L2 from the sample piece mounting position. The computer 22 causes the gas supply unit 17 to supply a gas to the surfaces of the sample piece Q and the columnar portion 34 for a predetermined period of time while an irradiation region including the processing frame R2 is irradiated with a focused ion beam. According to this operation, a deposition film is formed within the region irradiated with the focused ion beam so that the gas L2 is filled with the deposition film and the sample piece Q is connected to the columnar portion 34 by the deposition film. The computer 22 stops the deposition film formation when detecting the electrical conduction between the columnar portion 34 and the needle 18 in the middle of fixing the sample piece Q to the columnar portion 34 by the deposition process.

The computer 22 determines whether the connection between the sample piece Q and the columnar portion 34 is completed (Step S255). Step S255 is performed in a manner described below. An ohmmeter is installed between the needle 18 and the stage 12 in advance to detect electrical conduction. The electric resistance between the sample piece Q and the columnar portion 304 is infinite when the sample piece Q and the columnar portion 304 are spaced from each other (namely, there is the gap L2 between the sample piece Q and the columnar portion 304). However, when the sample piece Q and the columnar portion 304 are gradually being covered with a conductive deposition film and the gap L2 is gradually being filled with the conductive deposition film, the electrical resistance gradually decreases. When the electrical resistance reaches a predetermined value, it is determined that the sample piece Q and the columnar portion 34 are electrically connected. When a preliminary examination reveals that the electrical resistance reaches a predetermined value, it is determined that the deposition film has a mechanically sufficient strength and the sample piece Q is reliably connected to the columnar portion 34.

The measurement detected for checking the connection between the sample piece Q and the columnar portion 34 is not limited to the electrical resistance. Any other measurement such as current or voltage may be used to measure the electrical characteristic between the sample piece Q and the columnar portion 34. In addition, the computer 22 extends the deposition time unless the predetermined electric characteristics (electric resistance value, current value, electric potential, etc.) are not satisfied within a predetermined period of time. The computer 22 calculates and stores in advance the optimum deposition time for which the deposition film is formed while taking into consideration the size of the gap L2 between the columnar portion 34 and the sample piece Q, irradiation beam conditions, and deposition gas species, and terminates the deposition film formation process in the optimum deposition time.

Figure 41:
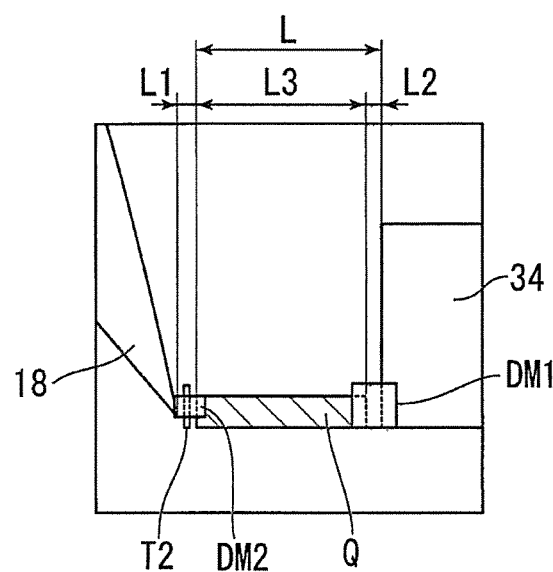
FIG. 41 is a diagram illustrating a processing frame to undergo a process of connecting a sample piece connected with a needle to a sample base, in an image obtained by using a focused ion beam of a charged particle beam apparatus according to an embodiment of the present invention.

When the connection between the sample piece Q and the columnar portion 34 is confirmed, the computer 22 stops the gas supply and the focused ion beam irradiation. FIG. 41 shows this state. FIG. 41 is the image data obtained by using a focused ion beam of the charged particle beam apparatus 10 according to the embodiment of the present invention and illustrates a deposition film DM1 that connects the sample piece Q connected to the needle 18 with the columnar portion 34.

Alternatively, in Step S255, the computer 22 may determine the connection between the sample piece Q and the columnar portion 34 via the deposition film DM1 by detecting a change in the absorption current of the needle 18.

When it is determined that the sample piece Q is connected with the columnar portion 34 by the deposition film DM1, on the basis of the change in the absorption current of the needle 18, the computer 22 will terminate the formation of the deposition film DM1, regardless of the elapse of the optimum deposition time. When the connection completion is confirmed, the process proceeds to the next step S260. When the connection is not completed, the focused ion beam irradiation and the gas supply are stopped when the optimum deposition time passes. Next, the deposition film DM2 connected between the sample piece Q and the needle 18 is cut by a focused ion beam and the sample piece Q remaining on the tip of the needle is destroyed. The process then proceeds to a needle retreating operation (Step S270).

That is, the computer 22 performs a separation process of cutting the deposition film DM2 connected between the needle 18 and the sample piece Q, thereby separating the needle 18 and the sample piece Q from each other (Step S260).

FIG. 41 illustrates this state. That is, FIG. 41 is a diagram illustrating a cutting processing position T2 at which the deposition film DM2 between the needle 18 and the sample piece Q is to be cut, within the image data obtained by using a focused ion beam of the charged particle beam apparatus 10 according to the embodiment of the present invention. The computer 22 sets a position spaced by a first distance from the side surface of the columnar portion 34 as a cutting processing position T2, in which the first distance is calculated by first obtaining the sum (hereinafter, referred to as a second distance) L of the size L3 of the sample piece Q and the size L2 of the gap between the sample piece Q and side surface of the columnar portion 304 and then by adding the half the size L1 of the gap between the needle 18 and the sample piece Q to the obtained sum L (namely, the first distance=L+L1/2). Alternatively, the cutting processing position T2 may be set to a position spaced from the side surface of the columnar portion 34 by a third distance (L+L1) corresponding to the sum of the second distance L and the size L1 of the gap between the needle 18 and the sample piece Q. In this case, the deposition film DM2 (carbon deposition film) remaining on the tips of the needle is reduced. Therefore, the frequency of needle cleaning (described later) decreases, which is preferable for continuous automatic sampling.

Figure 42:
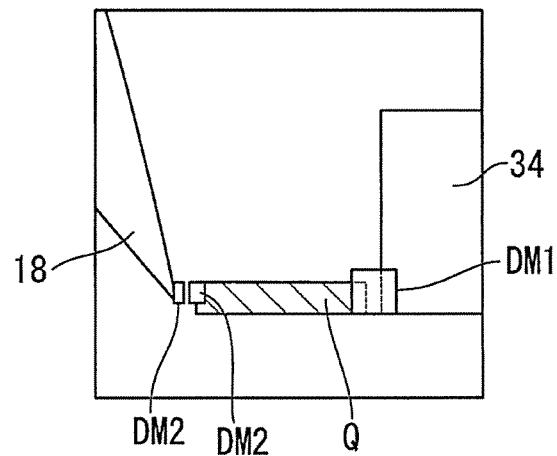
FIG. 42 is a diagram illustrating a cutting processing position on a deposition film connected between a needle and a sample piece, in an image obtained by using a focused ion beam of a charged particle beam apparatus according to an embodiment of the present invention.

The computer 22 can separate the needle 18 from the sample piece Q by irradiating the cutting processing position T2 with a focused ion beam for a predetermined period of time. By irradiating the cutting processing position T2 with a focused ion beam for the predetermined period of time, the computer 22 can cut only the deposition film DM2 without causing damage to the needle 18, thereby separating the needle 18 from the sample piece Q. In Step S260, it is important to cut only the deposition film DM2. Thereby, since the needle 18 once set can be used repeatedly without replacement for a long time, automatic sampling can be repeated continuously in an unattended state. FIG. 42 illustrates this state. That is, FIG. 42 is a diagram illustrating a state in which the needle 18 is separated from the sample piece Q within the image data of the focused ion beam in the charged particle beam apparatus 10 according to the embodiment of the present invention. The residue of the deposition film (DM2) is attached to the tip of the needle.

The computer 22 determines whether or not the needle 18 is separated from the sample piece Q by detecting current conduction between the sample piece holder P and the needle 18 (Step S265). The computer 22 cuts the deposition film DM2 at the cutting processing position T2 between the needle 18 and the sample piece Q. When the electrical conduction between the needle 18 and the sample piece holder 18 is detected even after the cutting processing is finished, namely, the irradiation of the focused ion beam is performed for the predetermined period of time, the computer 22 determines that the needle 18 is not yet separated from the sample base 33. When it is determined that the needle 18 is not yet separated from the sample piece holder P, the computer 22 notifies the operator of the state in which the needle 18 is not completely separated from the sample piece Q by displaying information of the effect that the needle 18 is not completely separated from the sample piece Q on the display device 21 or by making an alarm sound. Then, the subsequent processing is not performed. When the electrical conduction between the sample piece holder P and the needle 18 is not detected, the computer 22 determines that the needle 18 is completely separated from the sample piece Q and continues to execute the subsequent processing.

Figure 43:
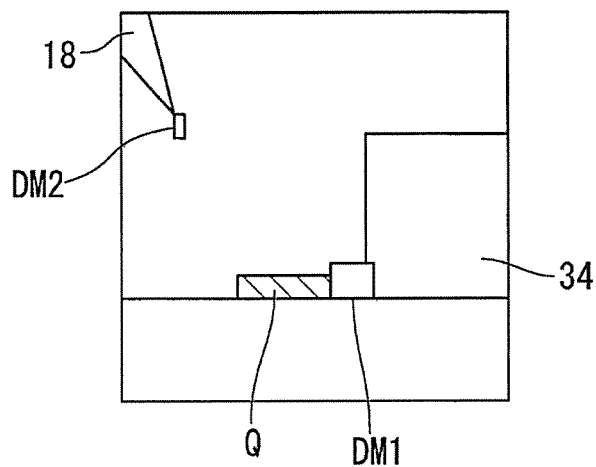
FIG. 43 is a diagram illustrating a state in which a needle has retreated, in an image obtained by using a focused ion beam of a charged particle beam apparatus according to an embodiment of the present invention.
Figure 44:
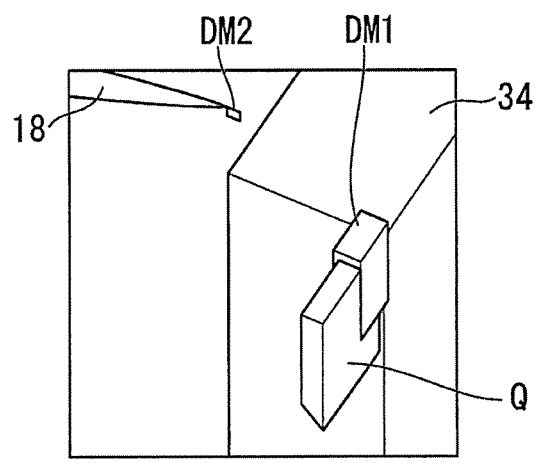
FIG. 44 is a diagram illustrating a state in which a needle has retreated, in an image obtained by using an electron beam of a charged particle beam apparatus according to an embodiment of the present invention.

Next, the computer 22 performs a needle retreating process (Step S270). The computer 22 causes the needle driving mechanism 19 to move the needle 18 such that the needle 19 stops at a position spaced from the sample piece Q by a predetermined distance. For example, the needle 18 is moved upward in the vertical direction (namely, a positive Z direction) by 2 mm, 3 mm, or the like. FIGS. 43 and 44 illustrate this state. FIG. 43 is a schematic diagram illustrating a state in which the needle 18 is moved away from the sample piece Q within a focused ion beam image formed by the charged particle beam apparatus 10 according to the embodiment of the present invention, and FIG. 44 is a schematic diagram of an electron beam image.

Next, it is determined whether or not sampling is to be continued from a different position within the same sample S (Step S280). Since the number of sample pieces to be sampled from the same sample is set and registered in advance in Step S010, the computer 22 checks this data and then determines the next step. In the case of continuing the sampling, the process flow returns to Step S030, and the subsequent processes are performed. Conversely, when it is not necessary to continue the sampling, the process flow is ended.

The needle template creation (Step S050) can be performed immediately after Step S280. In this case, it is not necessary to perform the needle template creation in Step S050 in preparation for the next sampling, and thus the sampling can be simplified.

Thus, a series of automatic sampling operations is completed.

The above-described flow from the start to the end is merely an example, and step replacement or skipping is possible as long as the replacement or skipping does not hinder the entire flow.

The computer 22 can execute the sampling operation unattended by continuously operating the above-described flow from the start to the end. By the above-described method, samplings from samples can be repeatedly performed without replacement of the needle 18. Therefore, a plurality of sample pieces Q can be continuously sampled using the same needle 18.

The charged particle beam apparatus 10 can repeatedly use the same needle 18 without shaping or replacing the needle 18 when separating and extracting sample pieces Q from a sample S, and can automatically prepare a plurality of sample pieces Q from one sample S. The sampling can be performed without intervention of the operator which was required in conventional related arts.

As described above, according to the charged particle beam apparatus 10 according to the embodiment of the present invention, before placing the sample piece Q held by the needle 18 on the sample piece holder P, the processing frame Ta (or the processing frame Tb) including the bottom portion Q2 of the sample piece Q undergoes the shaping processing. Therefore, it is possible to fix the sample piece Q to the sample piece holder P after properly shaping the sample piece Q into a desired shape. Therefore, the sampling operation of extracting the sample piece Q formed by processing the sample S with a focused ion beam and transferring the extracted sample piece Q to the sample piece holder P can be automatically and continuously performed.

In addition, the computer 22 performs the scan rotation to rotate the scanning direction of the focused ion beam by a rotation angle at which a predetermined direction of the sample piece Q and the scanning direction of the focused ion beam are parallel to each other. That is, it is possible to rotate the scanning region with respect to the center of the observation field of view of the focused ion beam. Thereby, in the image data obtained by using a focused ion beam, a predetermined direction of the sample piece Q (for example, the thickness direction corresponding to the depth direction at the time of processing the original sample S) can be aligned to be parallel to the coordinate axis direction of the image data, and the accuracy of edge extraction in a predetermined direction of the sample piece Q can be improved. The improvement in the accuracy of edge extraction of the sample piece Q results in improvement in the accuracy of the processing frame Ta that is set on the basis of the extracted edge.

Since the computer 22 sets the processing frame Ta on the basis of the edge of the sample piece Q recognized from the image data obtained by using a focused ion beam, it is possible to automatically set an appropriate shaping processing region including the bottom portion Q2 of the sample piece Q, thereby facilitating the shaping process.

After the sample piece is retained by the needle 18, the computer 22 is configured to control the posture of the sample piece Q with respect to the sample piece holder P by axially rotating the needle 18 before shaping the sample piece Q. Therefore, it is possible to automatically set the optimum posture of the sample piece for the transfer of the sample piece Q to the sample piece holder H.

After the execution of the shaping processing, the computer 22 performs cleaning processing to remove a redeposit which is a deposit of sputtered particles attached to the observation surface Q3 of the sample piece Q during the shaping processing. Therefore, the observation accuracy with respect to the observation surface Q3 can be improved.

The computer 22 recognizes the pattern of the device structure or the like exposed on the surface of the sample piece Q by performing the pattern matching, and sets the processing frame Ta to a region within which the pattern does not exist so as not to interfere with the pattern. Therefore, it is possible to automatically set the appropriate shaping processing region within the sample piece Q, and thus the shaping process can be easily performed.

Since the computer 22 can control the focused ion beam irradiation optical system 14, the electron beam irradiation optical system 15, the stage driving mechanism 13, the needle driving mechanism 19, and the gas supply unit 17, on the basis of the templates which are directly acquired from the images of at least the sample piece holder P, the needle 18, and the sample piece Q. Therefore, the operation of placing the sample piece Q on the sample piece holder P can be properly automated.

In addition, since the templates prepared from at least the secondary electron image or the absorption current image obtained by irradiation of the charged particle beam in a state in which there is no structure on the background of the sample piece holder P, the needle 18, and the sample piece Q, the reliability of the templates can be improved. Thereby, the accuracy of the template matching using the templates can be improved, and the sample piece Q can be precisely placed on the sample piece holder P on the basis of the positional information obtained through the template matching.

When an instruction is given such that no structure appears on the background of at least the sample piece holder P, the needle 18 and the sample piece Q, the instructed state cannot be obtained in some cases. In these cases, the positions of at least the sample piece holder P, the needle 18, and the sample piece Q are initialized so that each of the driving mechanisms 13 and 19 can be returned to the normal positions.

Further, since the templates are created for each posture suitable for the transfer of the sample piece Q to the sample piece holder H, the positioning accuracy of the sample piece Q can be improved.

Further, since the mutual distances are measured on the basis of at least the template matching using the templates of the sample piece holder P, the needle 18, and the sample piece Q, the positioning accuracy can be further improved at the time of transferring the sample piece Q.

When the edge cannot be extracted for at least a predetermined region in the image data of each of the sample piece holder P, the needle 18 and the sample piece Q, the acquisition of the image data is performed again. Therefore, the accurate templates can be formed.

In addition, since the sample piece Q is transferred to a predetermined position on the sample piece holder P by the movement of the sample piece Q only within the plane parallel to the stage 12, the sample piece Q can be appropriately placed on the sample piece holder P.

In addition, since the sample piece Q undergoes the shaping process in a state of being retained by the needle 18 before the template creation process, the accuracy of edge extraction at the time of template creation can be improved, and a sample piece Q suitable for finish processing performed in the subsequent step can be obtained. Further, since the position for the shaping process is set according to the distance from the needle 18, the shaping can be precisely performed.

Further, when the needle 18 holding the sample piece Q is rotated so as to be in the predetermined posture, the positional deviation of the needle 18 can be corrected by performing the eccentricity correction.

According to the charged particle beam apparatus 10 according to the embodiment of the present invention, the computer 22 detects the relative position of the needle 18 with respect to the reference mark Ref at the time when the sample piece Q is formed. Therefore, the relative positional relationship of the needle 18 with respect to the sample piece Q can be determined. The computer 22 sequentially detects the relative positions of the needle 18 with respect to the positions of the sample pieces Q, thereby appropriately driving the needle 18 in a three dimensional space (that is, while avoiding collision with other members or parts).

Further, the computer 22 can precisely recognize the position of the needle 18 in the three-dimensional space by using the image data obtained from at least two different directions. Thereby, the computer 22 can properly drive the needle 18 three-dimensionally.

Since the image data actually generated immediately before the needle 18 is moved is used as the template (reference image data), the computer 22 can perform the template matching with high matching accuracy regardless of the shape of the needle 18. Thereby, the computer 22 can precisely recognize the position of the needle 18 in the three-dimensional space, and can properly drive the needle 18 in the three-dimensional space. Since the computer 22 acquires image data or absorption current image data in a state in which the stage 12 is moved away from the needle 18 and there is no complicated structure on the background of the needle 18, it is possible to obtain the template from which the shape of the needle 18 can be clearly determined while avoiding the influence of the background.

Since the computer 22 performs control such that the needle 18 and the sample piece Q are connected by the deposition film rather than allowing the direct contact between the needle 18 and the sample piece Q, it is possible to prevent the needle 18 from being cut when the needle 18 and the sample piece Q are separated in the following process. Further, even when vibration of the needle 18 occurs, it is possible to suppress transmission of the vibration to the sample piece Q. It is also possible to suppress excessive deformation occurring between the needle 18 and the sample piece Q even when the displacement of the sample piece Q occurs due to the creep phenomenon of the sample S.

When the sample S and the sample piece Q are disconnected through the focused ion beam irradiation sputtering, the computer 22 can check whether the separation between the sample S and the sample piece Q is successively performed by detecting the electrical conduction between the sample S and the needle 18.

Further, since the computer 22 notifies the operator of the state in which the separation of the sample S and the sample piece Q is not successively performed, when the execution of the series of processes to be automatically successively performed is interrupted, the operator can easily recognize the cause of the interruption.

When the electrical conduction between the sample S and the needle 18 is detected, the computer 22 determines that the disconnection between the sample S and the sample piece Q is not actually completed, and continues to disconnect the sample piece Q and the needle 18 in preparation for the following process such as the retreating of the needle 18. Thereby, the computer 22 can prevent issues such as the positional misalignment of the sample S, the failure of the needle 18, and the like, arising from the accidental driving of the needle 18.

The computer 22 detects whether there is the electrical conduction between the sample piece Q and the needle 18 to check whether the disconnection between the sample S and the sample piece Q is actually completed. After confirming the disconnection, the computer 22 drives the needle 18. Thereby, the computer 22 can prevent issues such as the positional misalignment of the sample S, the failure of the needle 18, and the like, arising from the accidental driving of the needle 18.

In addition, since the computer 22 uses the actual image data of the needle 18 connected with the sample piece Q as the template, the computer 22 can perform the template matching with high accuracy regardless of the shape of the needle 18 connected with the sample piece Q. Thereby, the computer 22 can accurately recognize the position of the needle 18 connected with the sample piece Q in the three-dimensional space, and can properly drive the needle 18 in the three-dimensional space.

In addition, since the computer 22 finds the positions of the multiple columnar portions 34 in the sample base 33 by using the already known template of the sample base 33, the computer 22 can determine whether there is a sample base 33 having a normal condition before driving the needle 18.

The computer 22 is further configured to indirectly accurately determine whether the needle 18 and the sample piece Q have approached the movement target position, from the change in the absorption current before and after the needle 18 connected with the sample piece Q reaches the irradiation region. Thereby, the computer 22 can stop the needle 18 and the sample piece Q while avoiding collision with other parts such as the sample base 33 disposed at the movement target position, thereby preventing problems such as damage to the needle 18 or the sample piece Q attributable to collision.

The computer 22 detects the electrical conduction between the sample base 33 and the needle 18 while connecting the sample piece Q and the sample base 33 with the deposition film. Therefore, it is possible to precisely check whether or not the connection between the sample piece Q and the sample stage 33 is completed.

The computer 22 can disconnect the sample piece Q and the needle 18 from each other after confirming that the connection between the sample stage 33 and the sample piece Q is completed by detecting the electrical conduction between the sample stage 33 and the needle 18.

When driving the needle 18 in a three-dimensional space, the computer 22 can easily recognize the position of the needle 18 by performing the pattern matching in which the image of the actual shape of the needle 18 is compared with an ideal reference shape of the needle 18. Therefore, the computer 22 can accurately detect the position of the needle 18 in a three-dimensional space.

Hereinafter, a first modification of the above-described embodiment will be described.

In the above-described embodiment, the needle is not exposed to the focused ion beam so that the needle 18 is not shortened or deformed. Therefore, it is not necessary to replace the needle 18 or to shape the tip of the needle 18. However, the computer 22 executes a deposition film removal process (hereinafter, referred to as a needle 16 cleaning process) of removing a carbon deposition film attached to the tip of the needle, at appropriate timing during the automatic sampling operation, or periodically at an interval of a predetermined number of repeated samplings. For example, cleaning is performed once every 10 times of automatic samplings. Hereinafter, a method of determining whether to perform cleaning of the needle 18 will be described.

As a first method, a secondary electron image of the tip of the needle by electron beam irradiation is acquired immediately before the automatic sampling, or periodically, at a position where there is no complicated structure in the background. From the secondary electron image, the carbon deposition film attached to the tip of the needle can be clearly identified. This secondary electron image is stored in the computer 22.

Next, the absorption current image of the needle 18 is acquired with the same field of view and the same observation magnification without moving the needle 18. In the absorption current image, the carbon deposition film cannot be identified and only the shape of the needle 18 can be recognized. This absorption current image is also stored in the computer 22.

Here, by subtracting the absorption current image from the secondary electron image, the needle 18 is erased, and the shape of the carbon deposition film protruding from the tip of the needle clearly appears. When the area of the carbon deposition film is larger than a predetermined value, the carbon deposition film is removed by a focused ion beam while carefully positioning the needle 18 such that the needle 18 is not cut by the focused ion beam. At this time, it is allowed that the carbon deposition film remains when the area of the carbon deposition film is smaller than the predetermined area.

Next, as a second method, when the length of the carbon deposition film in the axial direction (longitudinal direction) of the needle 18 is longer than a predetermined length, it is determined that it is time for cleaning of the needle 18 to be performed, instead of comparing the area of the carbon deposition film with the predetermined area.

As a third method, the in-image coordinates of the tip of the carbon deposition film on the secondary electron image stored in the computer are recorded. In addition, the in-image coordinates of the needle tip in the absorption current image stored in the computer 22 are recorded. Here, the length of the carbon deposition film can be calculated from the tip coordinates of the carbon deposition film and the tip coordinates of the needle 18. When this length exceeds a predetermined value, it is determined that it is time for the cleaning of the needle 18 to be performed.

As a fourth method, a needle tip shape template containing a carbon deposition film, which is considered to be optimal, is prepared in advance, this optimal needle tip shape template is superimposed on a secondary electron image of the actual needle tip after repeating the sampling a plurality of times, and a portion of the actual needle tip, protruding from the template, is removed by using a focused ion beam.

As a fifth method, when the thickness of the carbon deposition film at the tip of the needle 18 exceeds a predetermined thickness, rather than when the area of the carbon deposition film exceeds a predetermined area, it is determined that it is time for the cleaning of the needle 18 to be performed.

This cleaning will be performed immediately after Step S280 in FIG. 38, for example.

The cleaning is carried out by the above-described method or the like. However, when a predetermined shape of the needle cannot be obtained even after performing the cleaning, or when cleaning cannot be performed within a predetermined period of time, the needle 18 will be replaced with a new one. Even after the needle 18 is replaced, the above-described processing flow is not changed, and the step of preserving the needle tip shape is executed in the same manner as described above.

Hereinafter, a second modification of the above-described embodiment will be described.

In the above-described embodiment, the needle driving mechanism 19 is provided integrally with the stage 12, but the invention is not limited thereto. The needle driving mechanism 19 may be provided independently of the stage 12. The needle driving mechanism 19 may be fixed independently of the tilting driving mechanism of the stage 12 by being fixed to the sample chamber 11 or the like.

Hereinafter, a third modification of the above-described embodiment will be described.

In the above-described embodiment, the focused ion beam irradiation optical system 14 has the optical axis parallel to the vertical direction, and the electron beam irradiation optical system 15 has the optical axis tilted from the vertical direction. However, the present invention is not limited thereto. For example, the optical axis of the focused ion beam irradiation optical system 14 may be tilted from the vertical direction and the optical axis of the electron beam irradiation optical system 15 may be parallel to the vertical direction.

Hereinafter, a fourth modified example of the above-described embodiment will be described.

In the above-described embodiment, the charged particle beam irradiation optical system is configured to include the focused ion beam irradiation optical system 14 and the electron beam irradiation optical system 15 to emit two kinds of beams. However, the present invention is not limited to this. For example, the configuration may not include the focused ion beam irradiation optical system 14 but include only the electron beam irradiation optical system 15 installed in the vertical direction. The ions used in this case are ions of negative charges.

In several steps of the embodiment described above, a focused ion beam image and an electron beam image are obtained by irradiating the sample piece holder P, the needle 18, the sample piece Q, and the like with a focused ion beam and an electron beam, respectively, in different incident directions. In addition, from the focused ion beam image and the electron beam image, the positional relationship among the sample piece holder P, the needle 18, and the sample piece Q is determined. However, the present invention is not limited thereto. That is, only the focused ion beam irradiation optical system 14 is included in the charged particle beam apparatus, and some steps of the embodiment described above can be performed using only a focused ion beam image. Hereinafter, this embodiment will be described.

For example, when finding the positional relationship between the sample piece holder P and the sample piece Q in Step S220, for each of both of the case where the stage 12 is horizontal and the case where the stage is inclined by a predetermined inclination angle from the horizontal direction, a focused ion beam image is acquired in a state in which the sample piece holder P and the sample piece Q fall within the same field of view, and a three-dimensional positional relationship between the sample piece holder P and the sample piece Q can be obtained from both the focused ion beam images. As described above, since the needle driving mechanism 19 can be moved horizontally and vertically, and can be tilted in conjunction with the stage 12, the relative positional relation between the sample piece holder P and the sample piece Q can be maintained, regardless of whether the stage 12 is disposed horizontally or tilted. Therefore, even through the charged particle beam irradiation optical system is composed of only the focused ion beam irradiation optical systems 14, the sample piece Q can be observed and processed from two different directions.

Similarly, then, the registration of the image data of the sample holder P in Step S020, the recognition of the needle position in Step S040, the acquisition of the needle template (reference image) in Step S050, the acquisition of the reference image of the needle 18 connected with the sample piece Q in Step S170, the recognition of the sample piece Q mounting position in Step S210, and the stopping of the needle movement in Step S250 are performed in the same way.

In Step S250, when connecting the sample piece Q with the sample piece holder P, the connection can be achieved by forming a deposition film on the upper end surface of the sample piece holder P and the sample piece Q with the stage 12 aligned in a horizontal state, and by forming a deposition film in a different direction with the stage 12 aligned in a tilted state. Therefore, it is possible to ensure reliable connection between the sample piece Q and the sample piece holder P.

Hereinafter, a fifth modification of the above-described embodiment will be described.

In the embodiment described above, the computer 22 automatically performs a series of processes from Step S010 to Step S280 as the automatic sampling operation, but the present invention is not limited to this. The computer 22 may switch at least one of Steps S010 to S280 to be executed by manual operation of the operator.

At the time of automatically sampling a plurality of sample pieces Q from a sample S, the computer 22 performs the automatic sampling operation every time a single sample piece Q is formed within the sample S in which a plurality of sample pieces Q is scheduled to be sequentially formed and prepared for extraction. Alternatively, after all of the plurality of sample pieces are formed within the sample S, the computer 22 may continuously perform the automatic sampling operation on each of the sample pieces Q which are in a state right before being extracted.

Hereinafter, a sixth modification of the above-described embodiment will be described.

In the embodiment described above, the computer 22 identifies the position of the columnar portion 34 by using the template of the columnar portion 34 that is already known. However, as this template, it is also possible to use a reference pattern created from the actual image data of the columnar portion 34 obtained in advance. The computer 22 can use a pattern created at the time of executing the automatic processing for forming the sample base 33 as the template.

In the above-described embodiment, the computer 22 can recognize the relative positional relationship between the sample base 33 and the needle 18 by using the reference mark Ref formed by irradiation of a charged particle beam at the time of preparing the columnar portion 34. The computer 22 sequentially detects the relative positions of the needles 18 with respect to the position of the sample base 33 and appropriately drives the needle 18 in a three dimensional space (that is, without coming into contact with other members or devices).

A seventh modification of the above-described embodiment will be described below.

In the above-described embodiment, the processing of Step S220 through Step S250 for connecting the sample piece Q to the sample piece holder P may be performed in an alternative manner described below. That is, the positional relationship (distance) between the columnar portion 34 and the sample piece Q is obtained from the image of the sample piece Q and the columnar portion 34 of the sample piece holder P, and the needle driving mechanism 19 is operated such that the distance reaches a target value.

Figure 45:
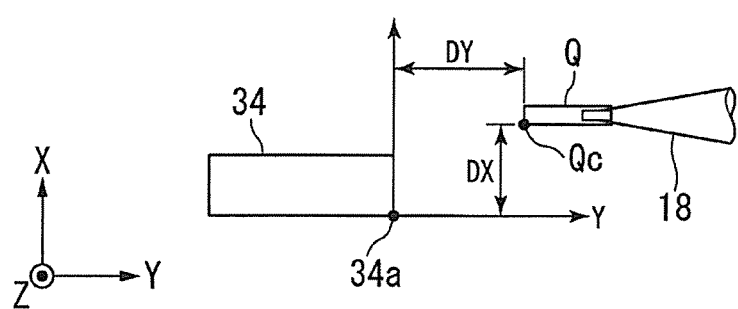
FIG. 45 is an explanatory diagram illustrating a positional relation between a columnar portion of a sample piece holder and a sample piece, in an image obtained by using a focused ion beam of a charged particle beam apparatus according to an embodiment of the present invention.
Figure 46:
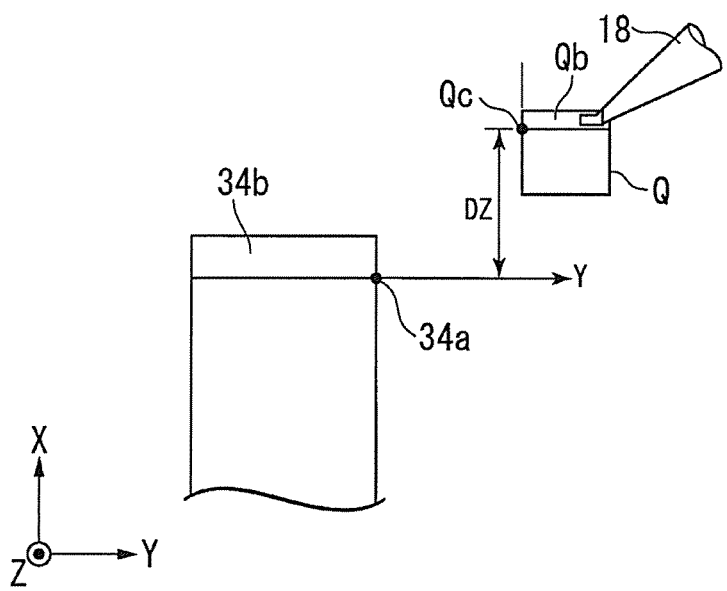
FIG. 46 is an explanatory diagram illustrating a positional relation between a columnar portion of a sample piece holder and a sample piece, in an image obtained by using an electron beam of a charged particle beam apparatus according to an embodiment of the present invention.

In Step S220, the computer 22 recognizes the positional relationship among the needle 18, the sample piece Q, and the columnar portion 34 from the secondary particle image data or the absorption current image data. FIGS. 45 and 46 are diagrams schematically illustrating the positional relationship between the columnar portion 34 and the sample piece Q. FIG. 45 is based on the image obtained by irradiation of a focused ion beam and FIG. 46 is based on the image obtained by irradiation of an electron beam. From these drawings, the relative positional relationship between the columnar portion 34 and the sample piece Q is measured. As illustrated in FIG. 45, an orthogonal three-axis coordinate system (a coordinate system different from the three-axis coordinate system of the stage 12) is determined with a corner of the columnar portion 34 as the origin 34a, distances DX and DY are measured as the distances between the origin 34a of the columnar portion 34 and the reference point Qa of the sample pieces Qa from FIG. 45.

On the other hand, the distance DZ is obtained from FIG. 46. However, when tilted at an angle θ (0°<θ≤90°) from the electron beam optical axis and the focused ion beam optical axis (vertical direction), the actual distance between the columnar portion 34 and the sample piece Q in the Z-axis direction is equal to DZ/sin θ.

Next, the positional relationship of the movement stop position of the sample piece Q with respect to the columnar portion 34 will be described with reference to FIGS. 45 and 46.

The upper end surface (upper surface) 34b of the columnar portion 34 and the upper end surface Qb of the sample piece Q are within the same surface, and the side surface of the columnar portion 34 and the cross section of the sample piece Q are within the same surface, and a gap of about 0.5 μm is provided between the columnar portion 34 and the sample piece Q. That is, by operating the needle driving mechanism 19 such that DX=0, DY=0.5 μm, and DZ=0, the sample piece Q can reach the target stop position.

In the configuration in which the electron beam optical axis and the focused ion beam optical axis are perpendicular (θ=90°), the distance DZ between the columnar portion 34 and the sample piece Q, which is measured by using an electron beam, is an actual distance between the columnar portion 34 and the sample piece Q.

Hereinafter, an eighth modification of the above-described embodiment will be described.

In Step S230 in the above-described embodiment, when the size of the gap between the columnar portion 34 and the sample piece Q, measured within the image of the needle 18, becomes a predetermined value, the needle driving mechanism 19 is driven.

In the above-described embodiment, the processing of Step S220 through Step S250 for connecting the sample piece Q to the sample piece holder P may be performed in an alternative manner described below. That is, the sample piece mounting position on the columnar portion 34 of the sample holder P is determined in advance as a template, the image of the sample piece Q is pattern-matched to the position, and the needling driving mechanism 19 is operated.

A template showing the positional relationship between the movement stop position of the sample piece Q and the columnar portion 34 will be described. The upper end surface 34B of the columnar portion 34 and the upper end surface Qb of the sample piece Q are within the same surface, and the side surface of the columnar portion 34 and the cross section of the sample piece Q are within the same surface, the columnar portion 34 and the sample piece Q have a positional relationship having a gap of 0.5 μm therebetween. This template is prepared by extracting the contour (edge) from the secondary particle image or the absorption current image data of the sample piece holder P or the needle 18 to which the sample piece Q is fixed and representing the contour in a line drawing form, or may be created in a line drawing form from the CAD drawing.

The template of the columnar portion 34 among the prepared templates is superimposed in real time on the images of the columnar portion 34 obtained respectively by electron beam irradiation and focused ion beam irradiation, and an operation instruction is given to the needle driving mechanism 19 so that the sample piece Q is moved toward the target stop position of the sample piece Q on the template (Step S230). It is first confirmed the images obtained by the electron beam irradiation and the focused ion beam irradiation in real overlap the stop position of the sample piece Q on the predetermined template, and then the operation of the needle driving mechanism 19 is stopped (Step S240). In this manner, the sample piece Q can be accurately moved to the exact stop position having a predetermined relationship with the columnar portion 34.

Figure 47:
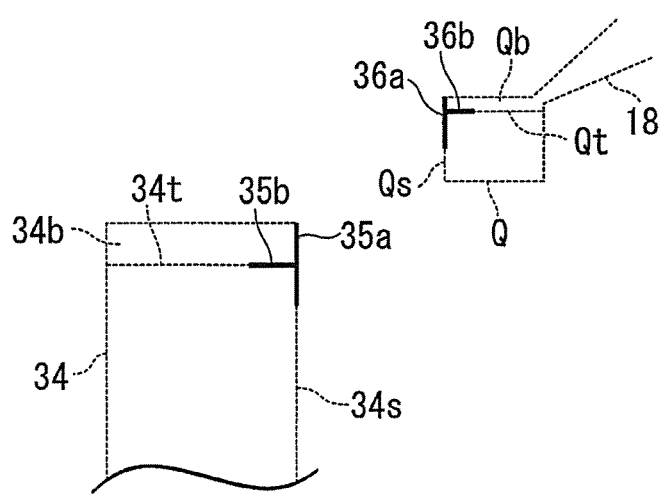
FIG. 47 is an explanatory diagram illustrating a template generated by using the edges of a columnar portion of a sample piece holder and a sample piece, in an image obtained by using an electron beam of a charged particle beam apparatus according to an embodiment of the present invention.
Figure 48:
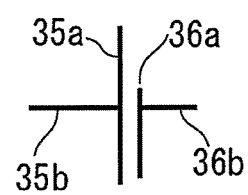
FIG. 48 is an explanatory diagram illustrating a template showing a positional relation between a columnar portion of a sample piece holder and a sample piece when connecting the sample piece to the columnar portion by using a charged particle beam apparatus according to an embodiment of the present invention.

As another form of the processing corresponding to Steps S230 through S250, the following processing may also be performed. The line drawing of the edge extracted from the secondary particle image data or the absorption current image data is limited to the minimum necessary area for alignment of both. FIG. 47 illustrates one example thereof and shows the contours (dotted lines) of the columnar portion 34 and the sample piece Q and the extracted edges (thick solid lines). Interest edges of the columnar portion 34 and the sample piece Q are opposing edges 34a and Qs of the columnar portion 34 and the sample piece Q and edges 34t and qt of the upper end surfaces 34b and Qb of the columnar portion 34 and the sample piece Q, respectively. The line segments 35a and 35b are edges of the columnar portion 34 and the line segments 36a and 36b are edges of the sample piece Q. Each segment is sufficient as a part of each edge. With these line segments, for example, a T-shaped template is formed. The corresponding template is moved by operating the stage driving mechanism 13 and the needle driving mechanism 19. The gap between the columnar portion 34 and the sample piece Q, the parallelisms and the heights of both can be easily identified from the positional relationship and the templates 35a, 35b and 36a, 36b. Therefore, the columnar portion 34 can easily match with the sample piece Q. FIG. 48 illustrates the positional relationship of the templates corresponding to the positional relationship between a predetermined columnar portion 34 and a sample piece Q. The line segments 35a and 36a are in parallel with each other at a predetermined interval and the line segments 35b and 36b are in a straight line in the positional relationship. At least either the stage driving mechanism 13 or the needle driving mechanism 19 is operated and the operating driving mechanism is stopped when the templates become the positional relationship shown in FIG. 48.

As described above, after confirming that the sample piece Q approaches the predetermined columnar portion 34, the templates can be used for precise alignment.

Next, as a ninth modification of the above-described embodiment, another form of Steps S220 through S250 will be described.

In Step S230 in the above-described embodiment, the needle 18 is moved. When the sample piece Q passing through Step S230 is in a positional relationship largely deviated from the target position, an operation described below will be performed.

In Step S220, It is preferable that the position of the sample piece Q before the movement is within a region of Y>0 and Z>0 in an orthogonal three-axis coordinate system having the origin at a corner of each columnar portion 34. In this case, since there is a low risk of collision of the sample piece Q to the columnar portion 34 during the movement of the needle 18, the X, Y and Z drive units of the needle driving mechanism 19 are operated simultaneously to promptly move sample piece Q to the target position. On the other hand, when the sample piece Q is in a region of Y<0 before the movement, if the X, Y, and Z drive units of the needle driving mechanism 19 are simultaneously operated toward the needle stop position, there is a high risk of collision of the sample piece Q to the columnar portion 34. Therefore, when the sample piece Q is in the region of Y<0 in Step S220, the needle 18 is moved to reach the target position along a path deviated from the columnar portion 34. Specifically, first, only the Y drive unit of the needle driving mechanism 19 is operated to move the sample piece Q to a region of Y>0, i.e., to a predetermined position (for example, positioned a distance of two times, three times, five times, or ten times the width of an interest columnar portion 34) from the interest columnar portion 34, and then the X, Y, and Z drive units are simultaneously operated to move the sample piece Q toward the final target stop position. By this step, the sample piece Q can be safely and quickly moved to the target stop position without avoiding collision with the columnar portion 34. When it is confirmed that the X-coordinate of the sample piece Q and the X-coordinate of the columnar portion 34 are the same and the Z-coordinate of the sample piece Q is lower than the Z-coordinate of the upper end of the columnar portion (Z<0) from the electron beam image and/or the focused ion beam image, the sample piece Q is first moved to a position within a region of Z>0 (for example, Z=2 μm, 3 μm, 5 μm, or 10 μm), then moved to a predetermined position within a region of Y>0, and then the X, Y, and Z drive units are simultaneously operated to move the sample piece Q to the final target stop position. By moving the sample piece in this way, the sample piece Q can reach the target position without colliding with the columnar portion 34.

Next, a tenth modification of the above-described embodiment will be described.

In the tenth modification, an embodiment is described in which a plane specimen is prepared by using a mechanism in which the needle of the charged particle beam apparatus 10 is axially rotated by the needle driving mechanism 19.

The plane specimen refers to a lamella Q prepared by slicing the sample piece separated and extracted from a sample to be a thin membrane parallel to the surface of the original sample, thereby allowing observation of the inside surface of the sample which is parallel to the surface of the original sample.

Figure 49:
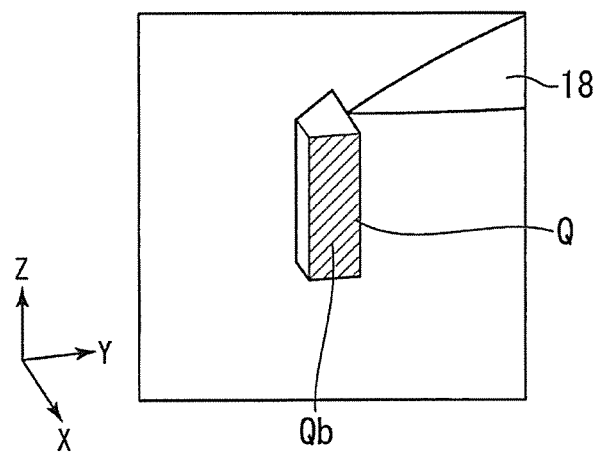
FIG. 49 is an explanatory diagram for use in description of a process of preparing a plane specimen and illustrates a state of a needle connected with a sample piece in the 90° rotation angle approach mode, in an image obtained by using a focused ion beam of a charged particle beam apparatus according to an embodiment of the present invention.

FIG. 49 is a schematic diagram illustrating an electron beam image showing a state in which the separated and extracted sample piece Q is fixed to the tip of the needle 18. To fix the needle 18 to the sample piece Q, the method illustrated in FIGS. 10 to 14 is used. When the rotation axis of the needle 18 is inclined by 45° with respect to the XY plane of FIG. 1, the needle 18 is rotated by 90° so that the upper end face Qb of the separated and extracted sample piece Q undergoes posture control so as to change to a perpendicular surface to the XY plane from a horizontal surface (parallel to the XY plane in FIG. 1).

Figure 50:
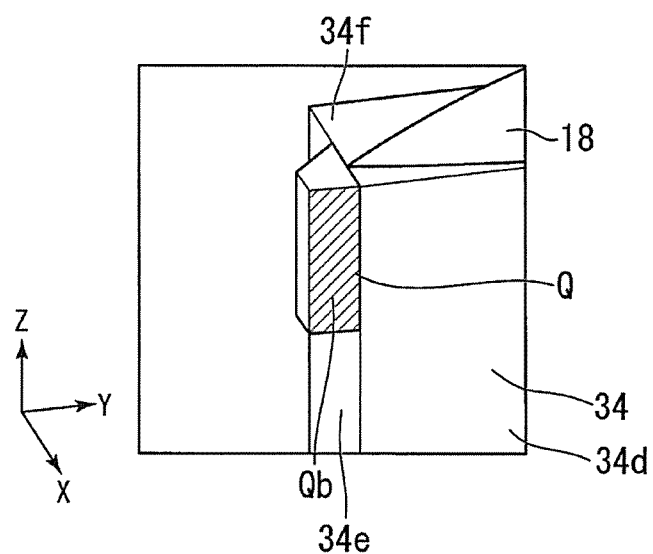
FIG. 50 is an explanatory diagram for use in description of a process of preparing a plane specimen according to an embodiment of the present invention, and illustrates a state in which a sample piece separated from a sample is placed on a sample piece holder.

FIG. 50 is a diagram illustrating a state in which the sample piece Q fixed to the tip of the needle 18 is moved so as to come into contact with the columnar portion 34 of the sample piece holder P. The side surface 34d of the columnar portion 34 is a surface which is perpendicular to a direction in which an electron beam is oriented when observed with a transmission electron microscope, and one side surface (end surface) 34e of the columnar portion 34 is a surface parallel to the direction in which the electron beam is oriented. The side surface (upper end surface 34f) of the columnar portion 34 is the same surface the upper end surface of the columnar portion 34 and is perpendicular to the incident direction of the focused ion beam in FIG. 1.

The sample piece Q is moved such that the upper end surface Qb of the sample piece Q posture-controlled by the needle 18 is parallel to the side surface 34d of the columnar portion 34 of the sample piece holder P, and is more preferably flush with the side surface 34d of the columnar portion 34, and the end surface of the sample piece Q is brought into surface contact with the sample piece holder P. After confirming that the sample piece Q is in contact with the sample piece holder P, a deposition film is formed to on the upper end surface 34f of the columnar portion 34 so as to cover the contact portion between the sample piece Q and the sample piece holder P.

Figure 51:
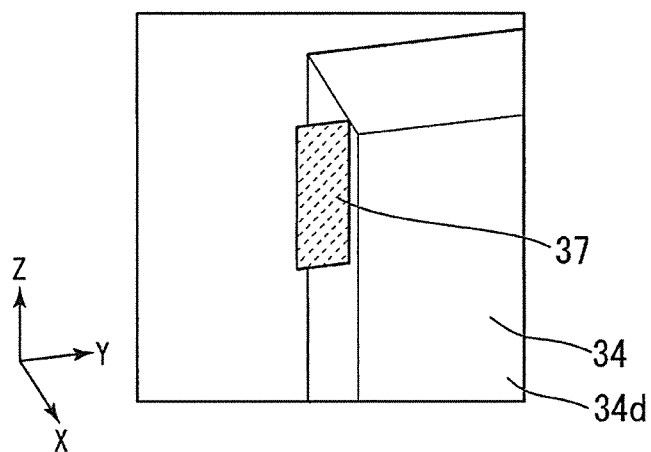
FIG. 51 is an explanatory diagram for use in description of a process of preparing a plane specimen according to an embodiment of the present invention, and illustrates a state in which a sample piece fixed to a sample piece holder undergoes a slicing (i.e., thinning) process to become the plane specimen.

FIG. 51 is a schematic diagram illustrating a state in which a plane specimen 37 is produced by irradiating a sample piece Q fixed to a sample piece holder P with a focused ion beam. The plane specimen 37 disposed at a predetermined depth from the surface of the sample piece is identified by a distance from the upper end face Qb of the specimen Q and a focused ion beam is emitted to the sample piece Q in parallel with the upper end face Qb of the sample piece Q so that the sample piece Q is thinned to a predetermined thickness, thereby preparing the plane specimen 37. With this plane specimen 37, the structure and composition distribution inside the sample in a direction parallel to the surface of the specimen can be identified.

The method of manufacturing the plane specimen 37 is not limited to this. When the specimen holder P is mounted on a tiling mechanism that can tilt in the range of 0 to 90°, it is possible to prepare the plane specimen 37 without rotating a probe and rotating the stage 12 and tilting the sample piece holder P. When the inclination angle of the needle 18 is within the range of 0° to 90° other than 45°, the plane specimen 37 can be prepared by appropriately setting the inclination angle of the sample piece holder P.

In this manner, the plane specimen 37 can be prepared, and a plane parallel to the surface of the sample and disposed at a predetermined depth from the surface of the sample can be observed with an electron microscope.

In this embodiment, the sample piece Q that is separated and extracted is fixed to the side surface 34d of the columnar portion 34. It can be considered that the sample piece Q is fixed to the upper end face of the columnar portion 34. However, in this case, the focused ion beam is likely strike the upper end face of the columnar portion 34 at the time of processing the sample S into a lamella with the focused ion beam, and sputter particles generated at the processing position are likely to adhere to the lamella, resulting in a sample piece Q that is not suitable for microscopic observation. For this reason, it is preferable that the sample piece Q is fixed to the side surface 34 of the columnar portion 34d.

Hereinafter, another embodiment will be described.

(a1) A charged particle beam apparatus is a charged particle beam apparatus for automatically preparing sample pieces from a sample, the apparatus comprising at least:

a plurality of charged particle beam irradiation optical systems (beam irradiation optical systems), each being configured to emit a charged particle beam;

a sample stage configured to move the sample mounted thereon;

a sample piece transferring means including a needle for retaining the sample piece separated and extracted from the sample and for transporting the sample piece;

a holder fixing base configured to retain a sample piece holder having a columnar portion to which the sample piece is to be transferred; and a gas supply unit configured to supply a gas to form a deposition film in conjunction with irradiation of the charged particle beam; and a computer configured to measure an electric characteristic between the sample piece and the columnar portion and to control the charged particle beam irradiation optical system, the sample piece transferring means, and the gas supply unit such that the sample piece is positioned with a gap with the columnar portion, and the deposition film is formed to span the sample piece and the columnar portion up to the extent that the electric characteristic measured between the sample piece and the columnar portion reaches a predetermined electric characteristic.

(a2) A charged particle beam apparatus is a charged particle beam apparatus for automatically preparing sample pieces from a sample, the apparatus comprising at least:

a plurality of charged particle beam irradiation optical systems (beam irradiation optical systems), each being configured to emit a charged particle beam;

a sample stage configured to move the sample mounted thereon;

a sample piece transferring means including a needle for retaining the sample piece separated and extracted from the sample and for transporting the sample piece;

a holder fixing base configured to retain a sample piece holder having a columnar portion to which the sample piece is to be transferred;

a gas supply unit configured to supply a gas to form a deposition film in conjunction with irradiation of the charged particle beam; and a computer configured to control at least the charged particle beam irradiation optical systems, the sample piece transferring means, and the gas supply unit such that an electric characteristic between the sample piece and the columnar portion is measured and the deposition film is formed to span the columnar portion and the sample piece positioned at a predetermined distance from the columnar portion, for a predetermined time.

(a3) A charged particle beam apparatus is a charged particle beam apparatus for automatically preparing sample pieces from a sample, the apparatus comprising at least:

a focused ion beam irradiation optical system (beam irradiation optical system) configured to emit a focused ion beam;

a sample stage configured to move the sample mounted thereon;

a sample piece transferring means including a needle for retaining the sample piece separated and extracted from the sample and for transporting the sample piece;

a holder fixing base configured to retain a sample piece holder having a columnar portion to which the sample piece is to be transferred; and a gas supply unit configured to supply a gas to form a deposition film in conjunction with irradiation of the focused ion beam; and a computer configured to control at least the focused ion beam irradiation optical system, the sample piece transferring means, and the gas supply unit such that an electric characteristic between the sample piece and the columnar portion is measured and the deposition film is formed to span the columnar portion and the sample piece positioned at a predetermined distance from the columnar portion until the measured electric characteristic reaches a predetermined electric characteristic.

(a4) A charged particle beam apparatus is a charged particle beam apparatus for automatically preparing sample pieces from a sample, the apparatus comprising at least:

a focused ion beam irradiation optical system (beam irradiation optical system) configured to emit a focused ion beam;

a sample stage configured to move the sample mounted thereon;

a sample piece transferring means including a needle for retaining the sample piece separated and extracted from the sample and for transporting the sample piece;

a holder fixing base configured to retain a sample piece holder having a columnar portion to which the sample piece is to be transferred;

a gas supply unit configured to supply a gas to form a deposition film in conjunction with irradiation of the focused ion beam; and a computer configured to control at least the focused ion beam irradiation optical system, the sample piece transferring means, and the gas supply unit such that an electric characteristic between the sample piece and the columnar portion is measured and the deposition film is formed to span the columnar portion and the sample piece positioned a predetermined distance from the columnar portion, for a predetermined time.

(a5) In the charged particle beam apparatus described in (a1) or (a2) above, the charged particle beam includes at least a focused ion beam and an electron beam.

(a6) In the charged particle beam apparatus described in any one of (a1) to (a4) above, the electric characteristic is at least one of electric resistance, electric current, and electric potential.

(a7) In the charged particle beam apparatus described in any one of (a1) to (a6) above, the computer controls at least the beam irradiation optical system, the sample piece transferring means, and the gas supply unit such that when the electric characteristic measured between the sample piece and the columnar portion does not reach the predetermined electric characteristic within the predetermined time for formation of the deposition film, the sample piece is moved such that the gap between the sample piece and the columnar portion is reduced, and the deposition film is formed to span the stationary sample piece and the columnar portion.

(a8) In the charged particle beam apparatus described in any one of (a1) to (a6) above, the computer controls at least the beam irradiation optical system and the gas supply unit such that formation of the deposition film is stopped when the electric characteristic measured between the sample piece and the columnar portion reaches the predetermined electric characteristic within the predetermined time for the formation of the deposition film.

(a9) In the charged particle beam apparatus described in (a1) or (a3) above, the gap is 1 μm or less in size.

(a10) In the charged particle beam apparatus described in (a9) above, the gap is 100 nm or more and 200 nm or less in size.

(b1) A charged particle beam apparatus is a charged particle beam apparatus for automatically preparing sample pieces from a sample, the apparatus comprising:
a charged particle beam irradiation optical system configured to emit a charged particle beam;
a sample stage configured to move the sample mounted thereon;
a sample piece transferring means for retaining and transporting a sample piece separated and extracted from the sample;
a holder fixing base configured to retain a sample piece holder having a columnar portion to which the sample piece is to be transferred; and
a computer configured to control at least the charged particle beam irradiation optical system and the sample piece transferring means such that a template of the columnar portion is created on the basis of an image of the columnar portion obtained by irradiation of the charged particle beam and the sample piece is transferred to the columnar portion with reference to positional information obtained by a template matching process using the template.

(b2) In the charged particle beam apparatus described in (b1) above, the sample piece holder includes a plurality of the columnar portions spaced apart from each other and the computer creates the templates of the respective columnar portions on the basis of the images of the respective columnar portions.

(b3) In the charged particle beam apparatus described in (b2) above, the computer performs a determination process of determining whether a shape of an interest columnar portion among the plurality of columnar portions matches a predetermined shape that is previously registered through template matching by using the templates of the respective columnar portions of the plurality of columnar portions, and controls the charged particle beam irradiation optical system and the sample piece transferring means or controls movement of the sample stage such that the determination process is performed on a new columnar portion among the plurality of columnar portions when the shape of the interest columnar portion does not match the registered predetermined shape, and the sample piece is transferred to the interest columnar portion when the shape of the interest columnar portion matches the registered predetermined shape.

(b4) In the charged particle beam apparatus described in any one of (b2) and (b3), when controlling movement of the sample stage such that an interest columnar portion among the plurality of columnar portions is disposed at a predetermined position, the computer initializes the position of the sample stage when the interest columnar portion can not be disposed at the predetermined position.

(b5) In the charged particle beam apparatus described in (b4) above, when controlling movement of the sample stage such that an interest columnar portion among the plurality of columnar portions is disposed at a predetermined position, the computer performs a shape determination process of determining whether or not the shape of the interest columnar portion is abnormal after the movement of the sample stage is performed, and then controls the movement of the sample stage such that a new columnar portion among the plurality of columnar portions is disposed at the predetermined position when it is determined that the shape of the interest columnar portion is abnormal and performs the shape determination process on the new columnar portion.

(b6) In the charged particle beam apparatus described in any one of (b1) to (b5) above, the computer creates a template of the columnar portion before separating and extracting the sample piece from the sample.

(b7) In the charged particle beam apparatus described in (b3) above, the computer stores images of the respective columnar portions of the plurality of columnar portions, edge information extracted from the images, or design information of each of the plurality of columnar portions as the templates of the respective columnar portions, and determines whether or not a shape of an interest columnar portion among the plurality of columnar portions matches a predetermined shape by a score of the template matching with the template.

(b8) In the charged particle beam apparatus described in any one of (b1) to (b7) above, the computer stores an image obtained by irradiating the columnar portion to which the sample piece is transferred with the charged particle beam and stores positional information of the columnar portion to which the sample piece is transferred.

(c1) A charged particle beam apparatus is a charged particle beam apparatus for automatically preparing sample pieces from a sample, the apparatus comprising:
a charged particle beam irradiation optical system configured to emit a charged particle beam;
a sample stage configured to move the sample mounted thereon;
a sample piece transferring means for retaining and transporting a sample piece separated and extracted from the sample;
a holder fixing base configured to retain a sample piece holder having a columnar portion to which the sample piece is to be transferred;

a gas supply unit configured to supply a gas to form a deposition film in conjunction with irradiation of the charged particle beam; and a computer configured to control the charged particle beam irradiation optical system and the sample piece transferring means such that the charged particle beam is emitted to the deposition film attached to the sample piece transferring means after the sample piece transferring means is separated from the sample piece.

(c2) In the charged particle beam apparatus described in (c1) above, the sample piece transferring means repeatedly retains and transports the sample piece separated and extracted from the sample a plurality of times.

(c3) In the charged particle beam apparatus described in (c1) or (c2) above, the computer controls the charged particle beam irradiation optical system and the sample piece transferring means such that the charged particle beam is emitted to the deposition film attached to the sample piece transferring means repeatedly at predetermined timings including at least timing every when the sample piece transferring means is separated from the sample piece.

(c4) In the charged particle beam apparatus described in any one of (c1) to (c3) above, when controlling movement of the sample piece transferring means such that the sample piece transferring means separated from the sample piece is disposed at a predetermined position, the computer initializes the position of the sample piece transferring means when the sample piece transferring means can not be disposed at the predetermined position.

(c5) In the charged particle beam apparatus described in (c4) above, when the sample piece transferring means can not be disposed at the predetermined position even after the position of the sample piece transferring means is initialized and the movement of the sample piece transferring means is controlled again, the computer stops control over the sample piece transferring means.

(c6) In the charged particle beam apparatus described in any one of (c1) to (c5) above, the computer forms a template of the sample piece transferring means on the basis of an image obtained by irradiating the sample piece transferring means with the charged particle beam before the sample piece transferring means is connected with the sample piece, and controls the charged particle beam irradiation optical system and the sample piece transferring means such that the charged particle beam is emitted to the deposition film attached to the sample piece transferring means, with reference to contour information obtained by template matching with the template.

(c7) In the charged particle beam apparatus described in (c6) above, a display device for displaying the contour information is included.

(c8) In the charged particle beam apparatus described in any one of (c1) to (c7) above, the computer performs eccentricity correction when rotating the sample piece transferring means on a central axis of the sample piece transferring means so that the sample piece transferring means is in a predetermined posture.

(c9) In the charged particle beam apparatus described in any one of (c1) to (c8) above, the sample piece transferring means includes a needle or tweezers connected to the sample piece.

In the above-described embodiments, the computer 22 includes a software function unit or a hardware function unit such as an LSI.

In the above-described embodiments, the needle 18 has been described as a sharp-tip needle member but the needle 18 may have a different shape such as a flat chisel shape.

The present invention can be applied to cases in which the sample piece Q to be extracted is made of carbon. According to the present invention, it is possible to move an object to a desired position by using the template and the tip position coordinates. That is, when the extracted sample piece Q is fixed to the tip of the needle 18 and the sample piece Q is transferred to the sample piece holder P in a state of being retained to the tip of the needle 18, the needle 18 can be controlled such that the needle 18 approaches the sample piece holder and stops at a position at which there is a predetermined gap between the sample piece Q and the sample piece holder P, by using the actual tip coordinates (tip coordinates of the sample piece) obtained from a secondary electron image obtained by irradiating the needle connected with the sample piece Q with a charged particle beam and using the template of the needle 18 generated from the absorption current image of the needle 18 connected with the sample piece Q.

The present invention is also applicable to other apparatuses. For example, in a charged particle beam apparatus for measuring an electrical characteristic of a minute portion by brining a probe into direct contact with the minute portion, particularly a device equipped with a metal probe disposed inside a sample chamber of a scanning electron microscope (SEM) which uses an electron beam as a charged particle beam, and a charged particle beam apparatus equipped with a tungsten probe with a carbon nanotube tip to come into contact with a conductive portion of a minute region, the tip of the tungsten probe cannot be recognized from a general secondary electron image due to the background such as wiring patterns. With the absorption current image, although the tungsten probe can be easily recognized, the carbon nanotube tip cannot be recognized. Therefore, it is difficult to bring the carbon nanotube into contact with a critical measurement point with reference to the absorption current image. Thus, in the present invention, the actual tip coordinates of the needle 18 are identified using a secondary electron image, and the template of the needle 18 is created using by using an absorption current image. In this way, it is possible to move the probe having a carbon nanotube tip to a specific measurement point and to make a contact therebetween.

The sample piece Q produced by the charged particle beam apparatus 10 according to the present invention described above can be introduced into another focused ion beam apparatus and can be processed to a thickness suitable for transmission electron microscope analysis, with careful intervention of an apparatus operator. Thus, in the case of using the charged particle beam apparatus 10 according to the present invention in conjunction with a focused ion beam apparatus, a plurality of sample pieces Q can be fixed to a plurality of sample piece holders P with no intervention of an operator at night, and the sample pieces fixed to the sample piece holders can be carefully finished with intervention of an operator during daytime to become an ultrathin lamella suitable for transmission observation with a transmission electron microscope. In the past, a series of operations from the sample extraction to the lamella processing was performed by one apparatus and was relied on an operator. However, according to the present invention, the burden on the operator of the apparatus is greatly reduced, resulting in improvement in a working efficiency.

It should be noted that the above-described embodiments are provided by way of example, and are not intended to limit the scope of the invention. These new embodiments can be implemented in various other forms, and various omissions, substitutions, and alterations can be made without departing from the gist of the invention. These embodiments and their modifications fall within in the scope and spirit of the invention as well as within the scope of the inventions described in claims and equivalents thereof.

For example, in the charged particle beam according to 10 according to the embodiment of the present invention, the needle 18 has been described as a means for extracting the sample piece Q, but the present invention is not limited thereto. By using tweezers, the sample piece Q can be extracted without forming a deposition film, and there is no concern about damage to the tip of the needle. Even when the needle 18 is used, the connection means for connecting the needle with the sample piece Q is not limited to the deposition film. The needle 18 can be brought into contact with the sample piece Q in a state in which an electrostatic force is applied to the needle 18. In this way, the connection between the piece Q and the needle 18 can be achieved by electrostatic adsorption.

What is claimed is:

1. A charged particle beam apparatus automatically preparing a sample piece from a sample, the charged particle beam apparatus comprising:
    a charged particle beam irradiation optical system configured to emit a charged particle beam;
    a sample stage configured to move a sample mounted thereon;
    a sample piece transferring means configured to retain and transport a sample piece separated and extracted from the sample;
    a holder fixing base configured to retain a sample piece holder to which the sample piece is transferred; and
    a computer configured to control the sample piece transferring means and the charged particle beam irradiation optical system so as to demarcate a shaping processing region, which includes an end portion of the sample piece in a thickness direction of the sample piece corresponding to a depth direction when processing the sample, on an image obtained by irradiating the sample piece with the charged particle beam while retaining the sample piece by the sample piece transferring means and to irradiate the shaping processing region with the charged particle beam, in order to shape the sample piece.

2. The charged particle beam apparatus according to claim 1, wherein the computer controls the charged particle beam irradiation optical system such that a scanning direction of the charged particle beam when obtaining the image is rotated by a rotation angle according to a positioning of the sample piece retained by the sample piece transferring means.

3. The charged particle beam apparatus according to claim 2, wherein the computer recognizes an edge of the end portion of the sample piece in the image obtained by rotating the scanning direction of the charged particle beam by the rotation angle and sets the shaping processing region based on the edge.

4. The charged particle beam apparatus according to claim 2, wherein the sample piece transferring means includes a needle configured to retain and transport the sample piece separated and extracted from the sample and a needle driving mechanism configured to drive the needle, and
    the computer controls the needle driving mechanism to control positioning of the sample piece with respect to the sample piece holder by axially rotating the needle retaining the sample piece.

5. The charged particle beam apparatus according to claim 3, wherein the sample piece transferring means includes a needle configured to retain and transport the sample piece separated and extracted from the sample and a needle driving mechanism configured to drive the needle, and
    the computer controls the needle driving mechanism to control positioning of the sample piece with respect to the sample piece holder by axially rotating the needle retaining the sample piece.

6. The charged particle beam apparatus according to claim 1, wherein the computer controls the charged particle beam irradiation optical system so that the charged particle beam is emitted to the shaping processing region to shape the sample piece and then the charged particle beam is emitted to an observation surface of the sample piece to process the observation surface.

7. The charged particle beam apparatus according to claim 2, wherein the computer controls the charged particle beam irradiation optical system so that the charged particle beam is emitted to the shaping processing region to shape the sample piece and then the charged particle beam is emitted to an observation surface of the sample piece to process the observation surface.

8. The charged particle beam apparatus according to claim 3, wherein the computer controls the charged particle beam irradiation optical system so that the charged particle beam is emitted to the shaping processing region to shape the sample piece and then the charged particle beam is emitted to an observation surface of the sample piece to process the observation surface.

9. The charged particle beam apparatus according to claim 4, wherein the computer controls the charged particle beam irradiation optical system so that the charged particle beam is emitted to the shaping processing region to shape the sample piece and then the charged particle beam is emitted to an observation surface of the sample piece to process the observation surface.

10. The charged particle beam apparatus according to claim 5, wherein the computer controls the charged particle beam irradiation optical system so that the charged particle beam is emitted to the shaping processing region to shape the sample piece and then the charged particle beam is emitted to an observation surface of the sample piece to process the observation surface.

11. The charged particle beam apparatus according to claim 1, wherein the computer recognizes a pattern exposed on a surface of the sample piece retained by sample piece transferring means and sets the shaping processing region so as not to interfere with the pattern.

12. The charged particle beam apparatus according to claim 2, wherein the computer recognizes a pattern exposed on a surface of the sample piece retained by sample piece transferring means and sets the shaping processing region so as not to interfere with the pattern.

13. The charged particle beam apparatus according to claim 3, wherein the computer recognizes a pattern exposed on a surface of the sample piece retained by sample piece transferring means and sets the shaping processing region so as not to interfere with the pattern.

14. The charged particle beam apparatus according to claim 4, wherein the computer recognizes a pattern exposed on a surface of the sample piece retained by sample piece transferring means and sets the shaping processing region so as not to interfere with the pattern.

15. The charged particle beam apparatus according to claim 5, wherein the computer recognizes a pattern exposed on a surface of the sample piece retained by sample piece transferring means and sets the shaping processing region so as not to interfere with the pattern.

16. The charged particle beam apparatus according to claim 6, wherein the computer recognizes a pattern exposed on a surface of the sample piece retained by sample piece transferring means and sets the shaping processing region so as not to interfere with the pattern.

17. The charged particle beam apparatus according to claim 7, wherein the computer recognizes a pattern exposed on a surface of the sample piece retained by sample piece transferring means and sets the shaping processing region so as not to interfere with the pattern.

18. The charged particle beam apparatus according to claim 8, wherein the computer recognizes a pattern exposed on a surface of the sample piece retained by sample piece transferring means and sets the shaping processing region so as not to interfere with the pattern.

19. The charged particle beam apparatus according to claim 9, wherein the computer recognizes a pattern exposed on a surface of the sample piece retained by sample piece transferring means and sets the shaping processing region so as not to interfere with the pattern.

20. The charged particle beam apparatus according to claim 10, wherein the computer recognizes a pattern exposed on a surface of the sample piece retained by sample piece transferring means and sets the shaping processing region so as not to interfere with the pattern.

* * * * *